(12) United States Patent
Toda

(10) Patent No.: US 8,648,436 B2
(45) Date of Patent: Feb. 11, 2014

(54) SOLID-STATE IMAGING DEVICE, METHOD FOR MANUFACTURING SOLID-STATE IMAGING DEVICE, AND ELECTRONIC APPARATUS

(75) Inventor: Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 333 days.

(21) Appl. No.: 13/039,702

(22) Filed: Mar. 3, 2011

(65) Prior Publication Data
US 2011/0227091 A1    Sep. 22, 2011

(30) Foreign Application Priority Data

Mar. 19, 2010   (JP) ................................ 2010-064975

(51) Int. Cl.
*H01L 31/00*    (2006.01)
(52) U.S. Cl.
USPC .......................................... 257/440; 257/443
(58) Field of Classification Search
USPC .................. 257/440, 443, E27.134, E31.026, 257/E31.027
See application file for complete search history.

(56) References Cited

U.S. PATENT DOCUMENTS

2009/0301558 A1    12/2009 Takaoka et al.
2010/0276738 A1*   11/2010 Matsushima et al. ......... 257/294

FOREIGN PATENT DOCUMENTS

| JP | 2006-245088 | 9/2006 |
| JP | 2007-123720 | 5/2007 |
| JP | 2008-182142 | 8/2008 |

OTHER PUBLICATIONS

Cristiano Niclass et al.; Design and Characterization of a CMOS 3-D Image Sensor Based on Single Photon Avalanche Diodes; IEEE Journal of Solid-State circuits; vol. 40, No. 9; Sep. 2005.
Yoshiro Takiguchi et al.; A CMOS Imager Hybridized to an Avalanche Multiplied Film; IEEE Transactions on Electron Devices; vol. 44, No. 10; Oct. 1997.
K. Miyazaki et al.; High Sensitivity and Wide Bandwidth Image Sensor; 29p-ZC-12; 2008.

* cited by examiner

*Primary Examiner* — Hung Vu
(74) *Attorney, Agent, or Firm* — Dentons US LLP

(57) ABSTRACT

A solid-state imaging device is provided with a pixel region in which a plurality of pixels including photoelectric conversion films are arrayed and pixel isolation portions are interposed between the plurality of pixels, wherein the photoelectric conversion film is a chalcopyrite-structure compound semiconductor composed of a copper-aluminum-gallium-indium-sulfur-selenium based mixed crystal or a copper-aluminum-gallium-indium-zinc-sulfur-selenium based mixed crystal and is disposed on a silicon substrate in such a way as to lattice-match the silicon substrate concerned, and the pixel isolation portion is formed from a compound semiconductor subjected to doping concentration control or composition control in such a way as to become a potential barrier between the photoelectric conversion films disposed in accordance with the plurality of pixels.

11 Claims, 41 Drawing Sheets

SOLID-STATE IMAGING DEVICE, METHOD FOR MANUFACTURING SOLID-STATE IMAGING DEVICE, AND ELECTRONIC APPARATUS

BACKGROUND OF THE INVENTION

1. Field of the Invention

The present invention relates to a solid-state imaging device, a method for manufacturing the solid-state imaging device, and an electronic apparatus.

2. Description of the Related Art

Electronic apparatuses, e.g., digital video cameras and digital steel cameras, include solid-state imaging devices. For example, complementary metal oxide semiconductor (CMOS) type image sensors and charge coupled device (CCD) type image sensors are included as the solid-state imaging devices.

In the solid-state imaging device, a plurality of pixels are arrayed on a surface of a semiconductor substrate. In each pixel, a photoelectric conversion portion is disposed. The photoelectric conversion portion is, for example, a photodiode, and generates a signal charge by receiving light incident through an externally attached optical system with a light-receiving surface and effecting photoelectric conversion.

In the case where a color image is imaged in the solid-state imaging device, in general, the photoelectric conversion portion generates a signal charge by receiving light incident through a color filter with the light-receiving surface and effecting photoelectric conversion. For example, color filters of three primary colors, red, green, and blue, are disposed in a Bayer pattern on an imaging surface, and the light of each color passed through a color filter of each color is received by the photoelectric conversion portion in each pixel.

By the way, regarding the solid-state imaging device, miniaturization and, in addition, an increase in the number of pixel have been desired. In this case, the size of one pixel is reduced and, thereby, it becomes difficult that each pixel receives sufficient amount of light. Therefore, an improvement in image quality of the resulting image is not easy. Consequently, the solid-state imaging device is desired to have higher sensitivity.

In addition to the above description, in the case where high-speed imaging is executed to improve moving image characteristics and in the case where imaging in a dark place is desired, higher sensitivity is especially necessary because the amount of light incident on a pixel is reduced.

Regarding the CMOS type image sensor among solid-state imaging devices, a pixel is configured to include a pixel transistor besides the photoelectric conversion portion. The pixel transistor is configured to read a signal charge generated in the photoelectric conversion portion and output an electric signal to a signal line.

In general, regarding the solid-state imaging device, the photoelectric conversion portion receives light incident from the surface side of a semiconductor substrate, the surface being provided with circuits, wirings, and the like. In this case, the circuits, the wirings, and the like interfere or reflect the incident light and, thereby, it may be difficult to improve the sensitivity.

Consequently, a "backside-illumination type" has been proposed, in which the photoelectric conversion portion receives light incident from the backside opposite to the surface provided with the circuits, the wirings, and the like of the semiconductor substrate (refer to Japanese Unexamined Patent Application Publication No. 2008-182142, for example).

In addition to this, a "layered type" has been proposed, in which photoelectric conversion portions to selectively receive light of individual colors are not arranged in a direction along the imaging surface, but the photoelectric conversion portions for individual colors are arranged while being layered in a depth direction perpendicular to the imaging surface. Here, for example, the plurality of photoelectric conversion portions are formed from materials having band gaps different from each other and are layered in the depth direction, so that light of each color is isolated and detected and a signal is output on a color basis (refer to Japanese Unexamined Patent Application Publication No. 2006-245088, for example).

Furthermore, realization of an improvement of the sensitivity through signal amplification due to avalanche multiplication has been proposed (refer to IEEE Transactions Electron Devices Vol. 44 No. 10 October, 1997 (1997) and IEEE J. Solid-State Circuits, 40, 1847 (2005), for example).

Moreover, realization of an improvement of the sensitivity through the use of a "chalcopyrite based" compound semiconductor film, e.g., a $CuInGaSe_2$ film, having a high optical absorption coefficient in a photoelectric conversion portion has been proposed (refer to Japanese Unexamined Patent Application Publication No. 2007-123720 and The Spring Meeting, 2008 by JSAP, Extended abstracts 29p-ZC-12 (2008), for example).

SUMMARY OF THE INVENTION

In the above description, the chalcopyrite based compound semiconductor film is formed by growing a crystal on an electrode and is a polycrystal. Consequently, an occurrence of a dark current due to crystal defects may become significant. In this case, it is difficult to disperse.

Furthermore, the chalcopyrite based compound semiconductor film is worked through an etching treatment, e.g., an RIE method, in such a way that the side surface of the compound semiconductor film is exposed at between individual pixels (refer to FIG. 2($j$) in The Spring Meeting, 2008 by JSAP, Extended abstracts 29p-ZC-12 (2008), for example).

Consequently, in the above description, isolation between pixels is not sufficient and, thereby, color mixing may occur between pixels, so as to degrade the image quality of the resulting image. Moreover, the side wall of the photoelectric conversion portion constituting the pixel is exposed and, thereby, an interface state is formed there, and an occurrence of a dark current may become large because of, for example, release of trapped carriers. In particular, in the case where the etching treatment is performed by the RIE method, damage to the crystal due to ion irradiation becomes significant and, thereby, an occurrence of a dark current becomes large.

In the case where isolation of pixels are performed through the etching treatment by the RIE method, an invalid region increases and, thereby, the area of an effective light-receiving surface of the photoelectric conversion portion decreases, so that the quantum efficiency may be reduced.

In addition, in the case where the above-described compound semiconductor film is formed through crystal growth, an antiphase domain may occur and, thereby, it may be difficult to improve the performance of the apparatus.

As described above, regarding the solid-state imaging device in which the chalcopyrite based compound semiconductor film is used as the photoelectric conversion portion, inconveniences, e.g., degradation in the image quality of the resulting image, may occur, for example, color mixing occurs.

Accordingly, it is desirable to provide a solid-state imaging device, a method for manufacturing the solid-state imaging device, and an electronic apparatus, wherein in the case where a chalcopyrite based compound semiconductor film is used as a photoelectric conversion portion, an occurrence of color mixing and the like are prevented, and occurrences of inconveniences, e.g., degradation in the image quality of the resulting image, can be suppressed.

A solid-state imaging device according to an embodiment of the present invention is provided with a pixel region in which a plurality of pixels including photoelectric conversion films are arrayed and pixel isolation portions are interposed between the above-described plurality of pixels, wherein the above-described photoelectric conversion film is a chalcopyrite-structure compound semiconductor composed of a copper-aluminum-gallium-indium-sulfur-selenium based mixed crystal or a copper-aluminum-gallium-indium-zinc-sulfur-selenium based mixed crystal and is disposed on a silicon substrate in such a way as to lattice-match the silicon substrate concerned, and the above-described pixel isolation portion is formed from a compound semiconductor subjected to doping concentration control or composition control in such a way as to become a potential barrier between the above-described photoelectric conversion films disposed in accordance with the above-described plurality of pixels.

A method for manufacturing a solid-state imaging device, according to another embodiment of the present invention, includes the step of producing a solid-state imaging device provided with a pixel region in which a plurality of pixels including photoelectric conversion films are arrayed and pixel isolation portions are interposed between the above-described plurality of pixels, the above-described producing of a solid-state imaging device including the steps of forming the above-described photoelectric conversion film, which is a chalcopyrite-structure compound semiconductor composed of a copper-aluminum-gallium-indium-sulfur-selenium based mixed crystal or a copper-aluminum-gallium-indium-zinc-sulfur-selenium based mixed crystal, on a silicon substrate in such a way as to lattice-match the silicon substrate concerned, and forming the pixel isolation portion from a compound semiconductor subjected to doping concentration control or composition control in such a way as to become a potential barrier between the above-described photoelectric conversion films disposed in accordance with the above-described plurality of pixels.

An electronic apparatus according to another embodiment of the present invention is provided with a pixel region in which a plurality of pixels including photoelectric conversion films are arrayed and pixel isolation portions are interposed between the above-described plurality of pixels, wherein the above-described photoelectric conversion film is a chalcopyrite-structure compound semiconductor composed of a copper-aluminum-gallium-indium-sulfur-selenium based mixed crystal or a copper-aluminum-gallium-indium-zinc-sulfur-selenium based mixed crystal and is disposed on a silicon substrate in such a way as to lattice-match the silicon substrate concerned, and the above-described pixel isolation portion is formed from a compound semiconductor subjected to doping concentration control or composition control in such a way as to become a potential barrier between the above-described photoelectric conversion films disposed in accordance with the above-described plurality of pixels.

In embodiments according to the present invention, the pixel isolation portion is formed from a compound semiconductor subjected to doping concentration control or composition control in such a way as to become a potential barrier between the photoelectric conversion films disposed in accordance with the plurality of pixels.

Regarding the above description, the definition of the term "lattice matching" includes a state close to the lattice matching under the condition in which the thickness of the photoelectric conversion film is within a critical film thickness.

That is, if the thickness is within the critical film thickness, a good crystallinity state, in which misfit dislocation is not included, can be achieved even when perfect lattice matching ($\alpha a/a=0$) is not reached.

In this regard, the term "critical film thickness" is defined by "Matthews and Blakeslee's expression" (refer to J. W. Matthews and A. E. Blakeslee, J. Cryst. Growth 27 (1974) 118-125, for example) or "People and Bean's expression" (refer to R. People and J. C. Bean, Appl. Phys. Lett. 47 (1985) 322-324, for example) described below. In the following expressions, a represents a lattice constant, b represents a Burgers vector of dislocation, ν represents a Poisson's ratio, and f represents a lattice mismatch $|\alpha a/a|$.

Matthews and Blakeslee's expression $$h_c = \frac{b}{2\pi f} \frac{1}{(1+\nu)} \left( \ln \frac{h_c}{b} + 1 \right) \quad (1)$$

People and Bean's expression $$h_c = \frac{1}{16\pi\sqrt{2}} \frac{1-\nu}{(1+\nu)} \frac{b^2}{a} \frac{1}{f^2} \ln \frac{h_c}{b} \quad (2)$$

According to embodiments of the present invention, a solid-state imaging device, a method for manufacturing a solid-state imaging device, and an electronic apparatus can be provided, wherein in the case where a chalcopyrite based compound semiconductor film is used as a photoelectric conversion portion, an occurrence of color mixing and the like are prevented, and occurrences of inconveniences, e.g., degradation in the image quality of the resulting image, can be suppressed.

BRIEF DESCRIPTION OF THE DRAWINGS

In FIG. 5, $CuInSe_2$, which is one of chalcopyrite materials, is shown as an example.

DESCRIPTION OF THE PREFERRED EMBODIMENTS

The embodiments according to the present invention will be described with reference to the drawings.

The explanations will be provided in the following order.
1. First embodiment (Formation of pixel isolation doped through ion implantation (backside-illumination type+CF))
2. Second embodiment (Formation of pixel isolation doped through lateral growth (backside-illumination type+CF))
3. Third embodiment (Formation of pixel isolation (non-doped) through composition control)
4. Fourth embodiment (Surface-illumination type 1)
5. Fifth embodiment (Surface-illumination type 2)
6. Sixth embodiment (Surface-illumination type 3)
7. Seventh embodiment (Other backside-illumination type)
8. Eighth embodiment (Reading of hole as signal)
9. Ninth embodiment (Use of off substrate)
10. Others

1. First Embodiment

Formation of Pixel Isolation Doped Through Ion Implantation (Backside-Illumination Type+CF))

(A) Apparatus Configuration (A-1) Key Configuration of Camera

Figure 1:
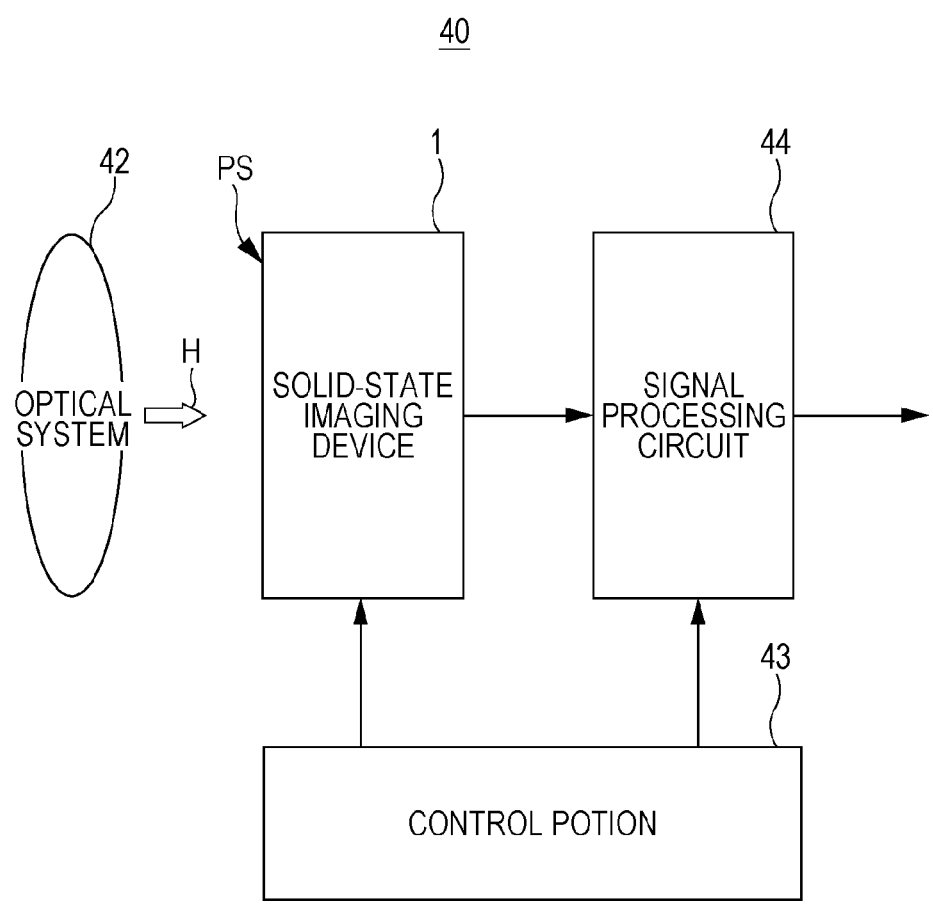
FIG. 1 is a configuration diagram showing the configuration of a camera 40 according to a first embodiment of the present invention.

FIG. 1 is a configuration diagram showing the configuration of a camera 40 according to a first embodiment of the present invention.

As shown in FIG. 1, the camera 40 includes a solid-state imaging device 1, an optical system 42, a control portion 43, and a signal processing circuit 44. Each portion will be described sequentially.

The solid-state imaging device 1 receives light (subject image) incident through the optical system 42 from an imaging surface PS and generates a signal charge through photoelectric conversion. Here, the solid-state imaging device 1 is driven on the basis of a control signal output from the control portion 43. Specifically, the signal charge is read and output as raw data.

The optical system 42 includes optical members, e.g., an image formation lens and a diaphragm, and is disposed in such a way as to condense incident light H from the subject image on the imaging surface PS of the solid-state imaging device 1.

The control portion 43 outputs various control signals to the solid-state imaging device 1 and the signal processing circuit 44 to control and drive the solid-state imaging device 1 and the signal processing circuit 44.

The signal processing circuit 44 is configured to perform signal processing of electric signals output from the solid-state imaging device 1 and, thereby, generate a digital image of the subject image.

(A-2) Configuration of Key Portion of Solid-State Imaging Device

The whole configuration of the solid-state imaging device 1 will be described.

Figure 2:
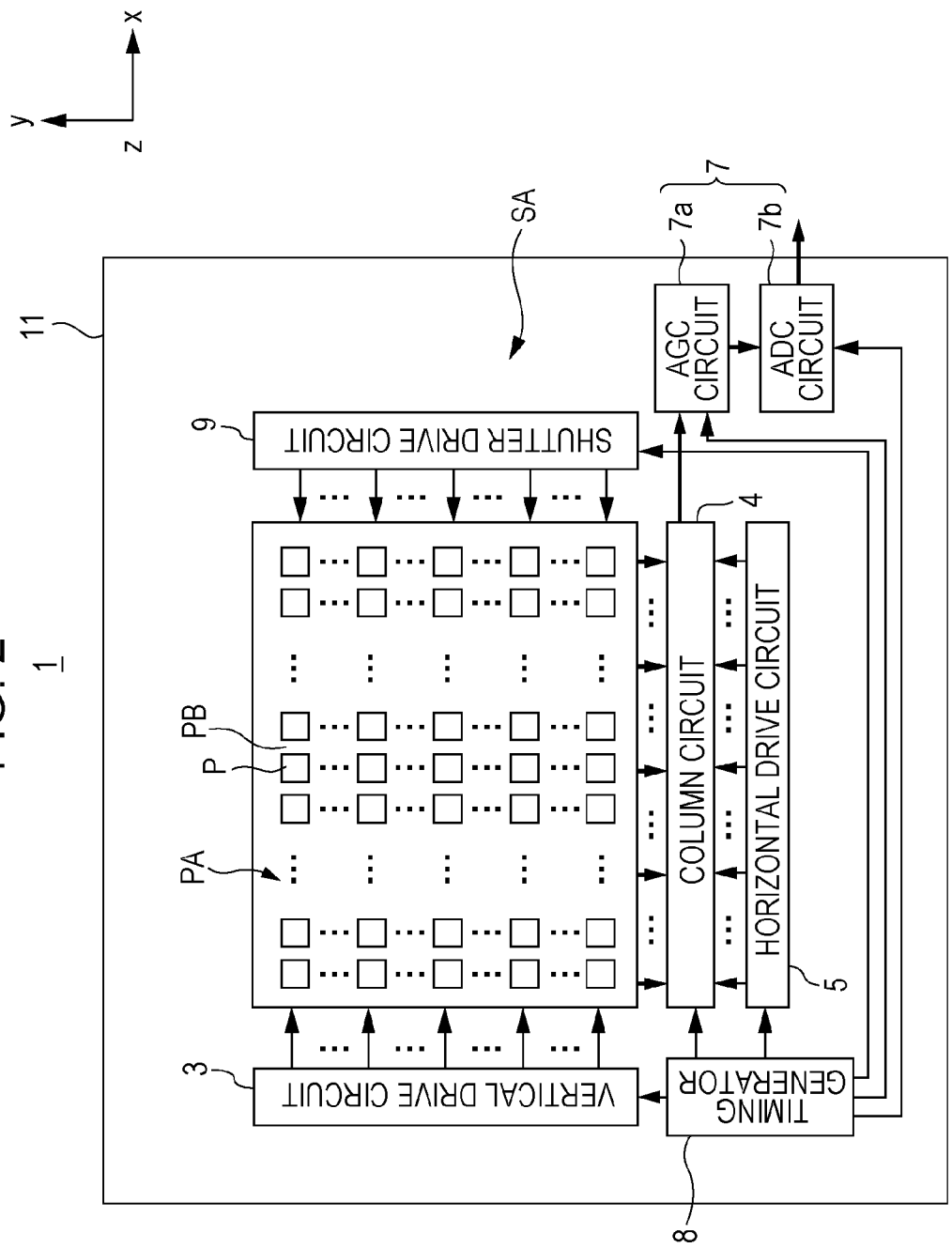
FIG. 2 is a block diagram showing the whole configuration of a solid-state imaging device according to the first embodiment of the present invention.

FIG. 2 is a block diagram showing the whole configuration of the solid-state imaging device 1 according to the first embodiment of the present invention.

The solid-state imaging device 1 is formed as, for example, a CMOS type image sensor. As shown in FIG. 2, this solid-state imaging device 1 includes a silicon substrate 11. The silicon substrate 11 is a semiconductor substrate formed from, for example, a single crystal silicon semiconductor. As shown in FIG. 2, an imaging region PA and a peripheral region SA are disposed on the surface of the silicon substrate 11.

As shown in FIG. 2, the imaging region PA is rectangular and a plurality of pixels P are arranged in each of a horizontal direction x and a vertical direction y. That is, the pixels P are arrayed in the matrix. This imaging region PA corresponds to the imaging surface PS shown in FIG. 1. The pixel P will be described later in detail.

As shown in FIG. 2, the peripheral region SA is located in the periphery of the imaging region PA. Peripheral circuits are disposed in this peripheral region SA.

Specifically, as shown in FIG. 2, a vertical drive circuit 3, a column circuit 4, a horizontal drive circuit 5, an external output circuit 7, a timing generator 8, and a shutter drive circuit 9 are disposed as peripheral circuits.

As shown in FIG. 2, in the peripheral region SA, the vertical drive circuit 3 is disposed in the side portion of the imaging region PA and is configured to select and drive the pixels P in the imaging region PA on a row basis.

As shown in FIG. 2, in the peripheral region SA, the column circuit 4 is disposed in a lower end portion of the imaging region PA and performs signal processing of signals output from the pixels P on a column basis. Here, the column circuit 4 include a correlated double sampling (CDS) circuit (not shown in the drawing) and performs signal processing to remove fixed pattern noises.

As shown in FIG. 2, the horizontal drive circuit 5 is electrically connected to the column circuit 4. The horizontal drive circuit 5 includes, for example, a shift register and outputs signals held by the column circuit 4 on a column of pixels P basis to the external output circuit 7 sequentially.

As shown in FIG. 2, the external output circuit 7 is electrically connected to the column circuit 4 and performs signal processing of signals output from the column circuit 4 so as to output to the outside. The external output circuit 7 includes an automatic gain control (AGC) circuit 7a and an ADC circuit 7b. In the external output circuit 7, after the AGC circuit 7a amplifies signals, the ADC circuit 7b converts analog signals to digital signals and output to the outside.

As shown in FIG. 2, the timing generator 8 is electrically connected to each of the vertical drive circuit 3, the column circuit 4, the horizontal drive circuit 5, the external output circuit 7, and the shutter drive circuit 9. The timing generator 8 generates various pulse signals and output to the vertical drive circuit 3, the column circuit 4, the horizontal drive circuit 5, the external output circuit 7, and the shutter drive circuit 9, so as to perform drive control of each portion.

The shutter drive circuit 9 is configured to select the pixels P on a row basis and adjust the exposure time of the pixels P.

Each of the above-described portions drives the plurality of pixels P arranged on a raw basis at the same time. Specifically, the pixels P are selected on a horizontal line (row of pixels) basis sequentially in the vertical direction y by the selection signals supplied from the above-described vertical drive circuit 3. Then, each pixel P is driven by various timing signals output from the timing generator 8. Consequently, an electric signal output from each pixel P is read by the column circuit 4 on a column of pixels basis. Subsequently, signals stored in the column circuit 4 are selected by the horizontal drive circuit 5 and are output to the external output circuit 7 sequentially.

(A-3) Detailed Configuration of Solid-State Imaging Device

The detailed configuration of the solid-state imaging device according to the present embodiment will be described.

Figure 3:
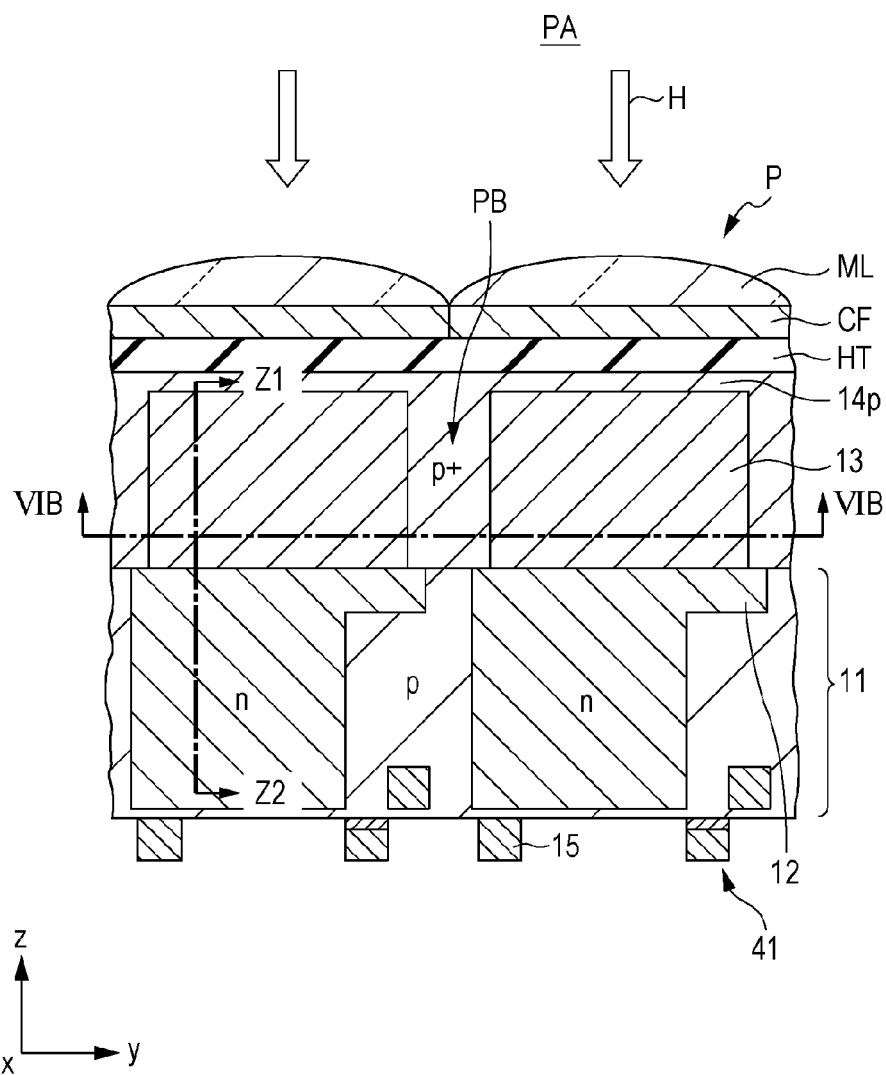
FIG. 3 is a diagram showing a key portion of the solid-state imaging device according to the first embodiment of the present invention.
Figure 4:
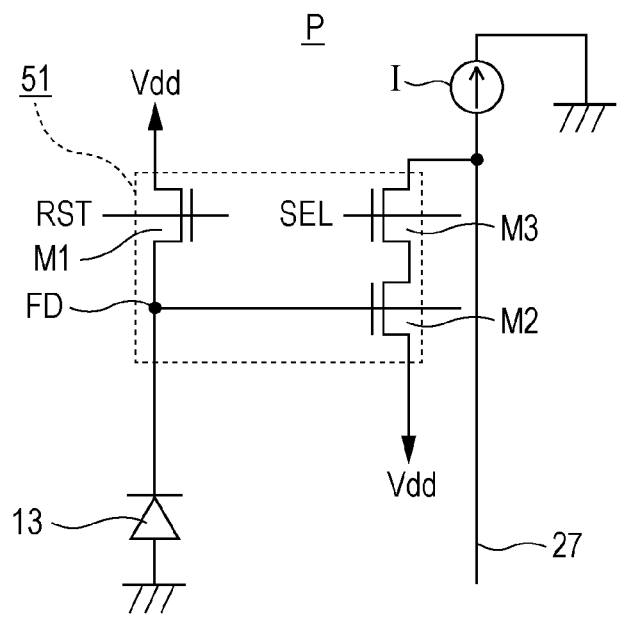
FIG. 4 is a diagram showing a key portion of the solid-state imaging device according to the first embodiment of the present invention.

FIG. 3 and FIG. 4 are diagrams showing key portions of the solid-state imaging device according to the first embodiment of the present invention.

Here, FIG. 3 shows a cross section of a pixel P. FIG. 4 shows a circuit configuration of the pixel P.

As shown in FIG. 3, the solid-state imaging device 1 includes a silicon substrate 11, and a chalcopyrite photoelectric conversion film 13 and a pixel isolation portion PB are disposed on one surface (upper surface) of the silicon substrate 11.

As shown in FIG. 3, a reading electrode 15 and a gate MOS 41 are disposed on the other surface (lower surface) of the silicon substrate 11. Although not shown in FIG. 3, a reading circuit 51 shown in FIG. 4 is further disposed. As shown in FIG. 4, the reading circuit 51 includes a reset transistor M1, an amplifying transistor M2, and a selection transistor M3. The reading circuit 51 is configured to read signal charges from the chalcopyrite photoelectric conversion film 13 through the gate MOS 41 and output electric signals to a vertical signal line 27.

Although not shown in the drawing, a wiring layer is disposed on the other surface (lower surface) of the silicon substrate 11 in such a way as to cover individual portions, e.g., the reading electrode 15.

Furthermore, incident light H is received by the chalcopyrite photoelectric conversion film 13 on a surface (backside) opposite to the surface (frontside) provided with the wiring layer (not shown in the drawing). That is, the solid-state imaging device 1 in the present embodiment is a "backside-illumination type CMOS image sensor".

Each portion will be described sequentially.

(A-3-1) Chalcopyrite Photoelectric Conversion Film 13

In the solid-state imaging device 1, a plurality of chalcopyrite photoelectric conversion films 13 are disposed in such a way as to correspond to the plurality of pixels P shown in FIG. 2. That is, the chalcopyrite photoelectric conversion films 13 are disposed on the imaging surface (xy plane) while being arrayed in each of the horizontal direction x and the vertical direction y orthogonal to the horizontal direction x.

The chalcopyrite photoelectric conversion film 13 is configured to receive the incident light (subject image) and generate signal charges through photoelectric conversion.

As shown in FIG. 3, the chalcopyrite photoelectric conversion film 13 is disposed on one surface of the silicon substrate 11 which is, for example, a p-type silicon semiconductor.

As shown in FIG. 3, on the silicon substrate 11, the chalcopyrite photoelectric conversion films 13 are disposed on the upper surfaces of n-type impurity regions 12 formed in accordance with the plurality of pixels P. A $p^+$-layer 14$p$ is disposed on the upper surface of the chalcopyrite photoelectric conversion film 13 in such a way as to cover the chalcopyrite photoelectric conversion film 13. Signal charges generated in the chalcopyrite photoelectric conversion film 13 are read by the reading circuit 51 through the gate MOS 41.

As shown in FIG. 3, the pixel isolation portion PB is disposed on the side surface of the chalcopyrite photoelectric conversion film 13.

In the present embodiment, the chalcopyrite photoelectric conversion film 13 is a chalcopyrite-structure compound semiconductor and is formed by growing a crystal in such a way as to lattice-match the silicon substrate 11 (Si (100) substrate).

Here, the chalcopyrite photoelectric conversion film 13 is a chalcopyrite-structure compound semiconductor composed of a copper-aluminum-gallium-indium-sulfur-selenium based mixed crystal and is formed as a single crystal thin film on the silicon substrate 11 through epitaxial growth.

For example, a $CuGa_{0.52}In_{0.48}S_2$ film serving as the chalcopyrite photoelectric conversion film 13 is disposed through layering on the silicon substrate 11. The conduction type of the chalcopyrite photoelectric conversion film 13 is, for example a p-type. The chalcopyrite photoelectric conversion film 13 may be any one of an i-type and an n-type, besides the p-type.

Alternatively, it is also favorable that the chalcopyrite photoelectric conversion film 13 is formed by using a chalcopyrite-structure compound semiconductor composed of a copper-aluminum-gallium-indium-zinc-sulfur-selenium based mixed crystal, besides the above-described compound semiconductor.

Figure 5:
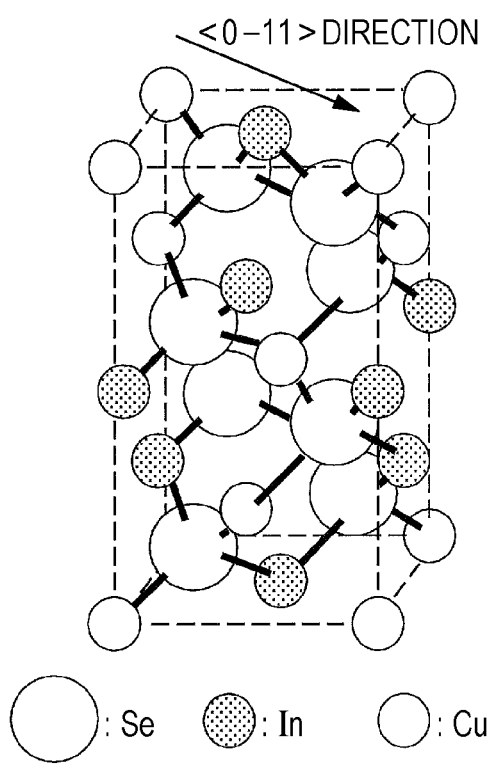
FIG. 5 is a perspective view showing a chalcopyrite structure.

FIG. 5 is a perspective view showing a chalcopyrite structure. In FIG. 5, $CuInSe_2$, which is one of chalcopyrite materials, is shown as an example.

As shown in FIG. 5, the basic form of $CuInSe_2$ is the same diamond structure as that of silicon. Therefore, the chalcopyrite structure is formed through substitution of a part of silicon atoms with atoms of copper (Cu), indium (In), and the like, so that the chalcopyrite photoelectric conversion film 13 can be formed through epitaxial growth on the surface of the silicon substrate 11.

For example, the chalcopyrite photoelectric conversion film 13 is formed by a molecular beam epitaxy (MBE) method. In addition to this, formation can be performed by epitaxial growth methods, e.g., a metal organic chemical vapor deposition (MOCVD) method and a liquid phase epitaxy (LPE) method.

(A-3-2) Pixel Isolation Portion PB

In the solid-state imaging device 1, the pixel isolation portion PB is disposed while being interposed between the plurality of pixels P shown in FIG. 2 in such a way as to isolate the pixels P from each other. That is, the pixel isolation portion PB is disposed in such a way as to be interposed between the plurality of pixels P on the imaging surface (xy plane) and be extended in the horizontal direction x and the vertical direction y in the shape of a lattice.

As shown in FIG. 3, on one surface of the silicon substrate 11, the pixel isolation portion PB is disposed on the side surface of the chalcopyrite photoelectric conversion film 13 disposed on a pixel P basis.

In the present embodiment, the pixel isolation portion PB is formed from a semiconductor containing a p-type impurity. For example, the pixel isolation portion PB is formed from a chalcopyrite based compound semiconductor composed of a copper-aluminum-gallium-indium-sulfur-selenium based mixed crystal containing a high-concentration p-type impurity.

(A-3-3) Reading Electrode 15

In the solid-state imaging device 1, a plurality of reading electrodes 15 are disposed in such a way as to correspond to the plurality of pixels P shown in FIG. 2.

As shown in FIG. 3, on the silicon substrate 11, the reading electrode 15 is disposed in the side of a surface (frontside) opposite to the surface (backside) provided with the chalcopyrite photoelectric conversion film 13.

(A-3-4) Gate MOS 41

In the solid-state imaging device 1, a plurality of gate MOSs 41 are disposed in such a way as to correspond to the plurality of pixels P shown in FIG. 2.

Here, on the silicon substrate 11, the gate MOS 41 is disposed in the side of the surface (frontside) opposite to the surface (backside) provided with the chalcopyrite photoelectric conversion film 13. Regarding the gate MOS 41, for example, an activated region (not shown in the drawing) is disposed in the silicon substrate 11, and each gate is formed from an electrically conductive material.

(A-3-5) Reading Circuit 51

In the solid-state imaging device 1, a plurality of reading circuit 51 are disposed in such a way as to correspond to the plurality of pixels P shown in FIG. 2.

As shown in FIG. 4, the reading circuit 51 includes the reset transistor M1, the amplifying transistor M2, and the selection transistor M3 and is configured to read signal charges generated in the chalcopyrite photoelectric conversion film 13 through the gate MOS 41.

Although not shown in FIG. 3, on the silicon substrate 11, each of the transistors M1, M2, and M3 constituting the reading circuit 51 is disposed in the side of a surface (frontside) opposite to the surface (backside) provided with the chalcopyrite photoelectric conversion film 13, in a manner similar to the gate MOS 41. Regarding each of the transistors M1, M2, and M3, for example, an activated region (not shown in the drawing) is disposed in the silicon substrate 11, and each gate is formed from an electrically conductive material.

In the reading circuit 51, the reset transistor M1 is configured to reset the gate potential of the amplifying transistor M2.

Specifically, as shown in FIG. 4, the gate of the reset transistor M1 is connected to a reset line RST, to which row reset signals are supplied. The drain of the reset transistor M1 is connected to a power source potential supply line Vdd and the source is connected to a floating diffusion FD. The reset transistor M1 resets the gate potential of the amplifying transistor M2 at the power source potential through the floating diffusion FD on the basis of row reset signals input from the reset line RST.

In the reading circuit 51, the amplifying transistor M2 is configured to amplify and output electric signals on the basis of signal charges.

Specifically, as shown in FIG. 4, the gate of the amplifying transistor M2 is connected to the floating diffusion FD. The drain of the amplifying transistor M2 is connected to a power source potential supply line Vdd and the source is connected to the selection transistor M3.

In the reading circuit 51, the selection transistor M3 is configured to output an electric signal, which is output from the amplifying transistor M2, to the vertical signal line 27, when a row selection signal is input.

Specifically, as shown in FIG. 4, the gate of the selection transistor M3 is connected to an address line SEL, to which a selection signal is supplied. When the selection signal is supplied, the selection transistor M3 comes into the on state, and outputs the output signal amplified by the amplifying transistor M2, as described above, to the vertical signal line 27.

(A-3-6) Others

In addition, as shown in FIG. 3, in the upper surface (backside) side of the silicon substrate 11, a color filter CF and an on-chip lens ML are disposed in accordance with the pixel P.

As shown in FIG. 3, the color filter FT is disposed on the upper surface of the silicon substrate 11 with an insulating film HT therebetween. Specifically, the color filter FT includes, for example, filter layers of three primary colors (not shown in the drawing), and regarding the filter layers of three primary colors, for example, filter layers of individual colors are arrayed in a Bayer pattern. The array of the filter layers of individual colors is not limited to the Bayer pattern and may be other arrays.

As shown in FIG. 3, the on-chip lens ML is disposed on the upper surface of the silicon substrate 11 with the insulating film HT and the color filter FT therebetween. The on-chip lens ML is disposed in such a way as to protrude upward in a convex shape above the silicon substrate 11 and condenses light incident from above on the chalcopyrite photoelectric conversion film 13 in order to improve the quantum efficiency.

Although not shown in the drawing, a wiring layer is disposed on the lower surface (frontside) of the silicon substrate 11 in such a way as to cover the above-described individual portions, e.g., the reading circuit 51. In this wiring layer, wirings (not shown in the drawing) electrically connected to individual circuit elements are disposed in an insulating layer (not shown in the drawing). Specifically, the individual wirings constituting the wiring layer are disposed while being layered in such a way as to function as wirings of the address line SEL, the vertical signal line 27, the reset line RST, and the like shown in FIG. 4.

Figure 6A:
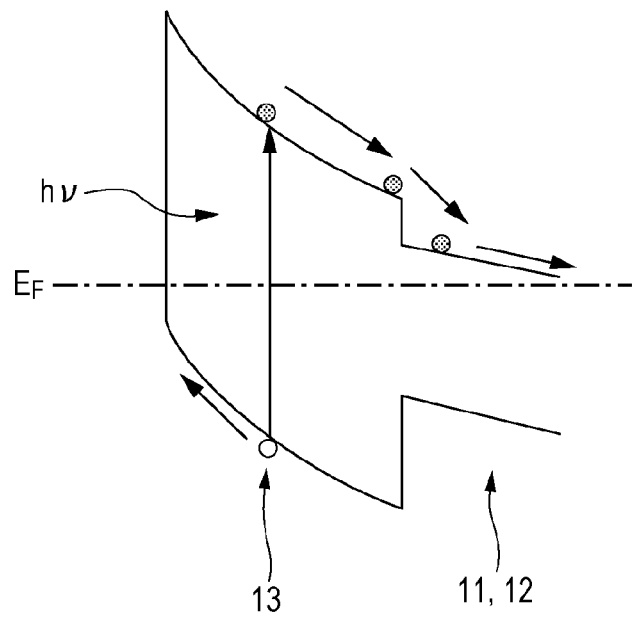
FIGS. 6A and 6B are diagrams showing band structures of the solid-state imaging device according to the first embodiment of the present invention.
Figure 6B:
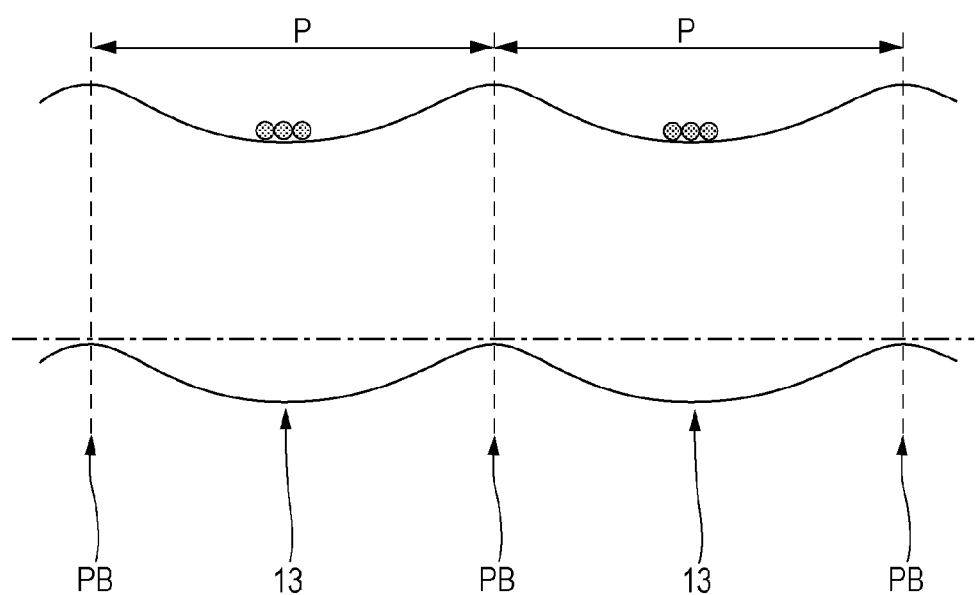

FIGS. 6A and 6B are diagrams showing band structures of the solid-state imaging device according to the first embodiment of the present invention.

FIG. 6A shows the band structure of a portion Z1-Z2 indicated by alternate long and short dashed lines shown in FIG. 3, and FIG. 6B shows the band structure of a portion VIB-VIB. That is, FIG. 6A shows the band structure in the depth direction z of the chalcopyrite photoelectric conversion film 13 and the silicon substrate 11. FIG. 6B shows the band structure of the portion provided with the chalcopyrite photoelectric conversion film 13 and the pixel isolation portion PB in the direction x along the surface of the silicon substrate 11.

As shown in FIG. 6A, in the depth direction z, the band is inclined in the chalcopyrite photoelectric conversion film 13. Consequently, accumulated electrons move to the silicon substrate 11 side.

Meanwhile, as shown in FIG. 6B, in the direction x along the surface of the silicon substrate 11, a potential barrier is disposed between the chalcopyrite photoelectric conversion film 13 and the pixel isolation portion PB. Consequently, movement between the pixels P of accumulated electrons is interfered.

(B) Manufacturing Method

A key portion of a method for manufacturing the above-described solid-state imaging device 1 will be described.

FIG. 7 to FIG. 10 are diagrams showing a method for manufacturing the solid-state imaging device according to the first embodiment of the present invention.

FIG. 7 to FIG. 10 show a cross section in a manner similar to FIG. 3, and the solid-state imaging device 1 shown in FIG. 3 and the like is produced through each of the steps shown in FIG. 7 to FIG. 10 sequentially.

Figure 7:
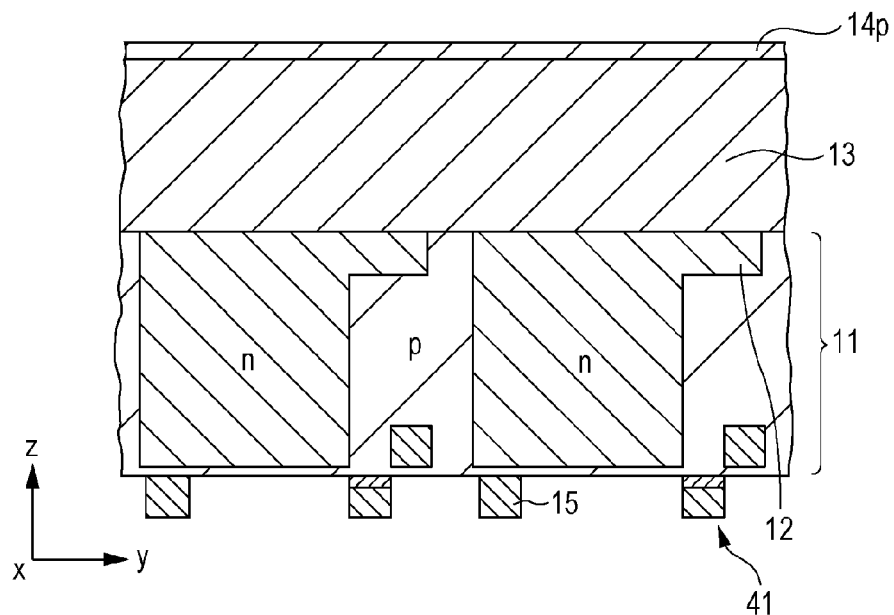
FIG. 7 is a diagram showing a method for manufacturing the solid-state imaging device according to the first embodiment of the present invention.

(B-1) Formation of Chalcopyrite Photoelectric Conversion Film 13 and p+-Layer 14p Initially, as shown in FIG. 7, the chalcopyrite photoelectric conversion film 13 and the p+-layer 14p are formed.

Here, before the chalcopyrite photoelectric conversion film 13 and the p+-layer 14p are formed, each portion of the reading electrode 15, the gate MOS 41, and the reading circuit 51 is formed on a surface of the silicon substrate 11. Subsequently, a wiring layer (not shown in the drawing) is formed on the surface (frontside) of the silicon substrate 11 in such a way as to cover each portions of the reading circuit 51 and the like.

In the present embodiment, after the above-described individual portions are formed on a silicon layer of a so-called SOI substrate (corresponding to the silicon substrate 11), the resulting silicon layer is transferred to a surface of a separate glass substrate (not shown in the drawing). In this manner, the backside, which is a silicon layer, of the silicon substrate 11 appears and a (100) face is exposed. Then, an n-type impurity region 12 is formed in the inside of the silicon substrate 11.

Thereafter, as shown in FIG. 7, on the silicon substrate 11, the chalcopyrite photoelectric conversion film 13 and the p+-layer 14p are formed sequentially on the surface (backside) opposite to the surface provided with each of the portions, e.g., the reading electrode 15 and the gate MOS 41.

The chalcopyrite photoelectric conversion film 13 is a chalcopyrite-structure compound semiconductor composed of a copper-aluminum-gallium-indium-sulfur-selenium based mixed crystal and is formed in such a way as to lattice-match the silicon substrate 11.

For example, the chalcopyrite photoelectric conversion film 13 is formed by epitaxially growing the above-described compound semiconductor on the silicon substrate 11 by an epitaxial growth method, e.g., the MBE method or the MOCVD method.

The lattice constant of silicon (Si) is 5.431 Å. The CuAlGaInSSe based mixed crystal contains a material corresponding to this lattice constant and can be formed in such a way as to lattice-match the silicon substrate 11. Therefore, for example, a $CuGa_{0.52}In_{0.48}S_2$ film is formed as the chalcopyrite photoelectric conversion film 13 on the silicon substrate 11.

For example, the chalcopyrite photoelectric conversion film 13 is formed in such a way that the conduction type becomes a p-type. The chalcopyrite photoelectric conversion film 13 may be formed in such a way that an i-type or an n-type results besides the p-type.

In the present embodiment, for example, the chalcopyrite photoelectric conversion film 13 is disposed by forming a p-type $CuGa_{0.52}In_{0.48}S_2$ film in such a way that the concentration of zinc (Zn) serving as an n-type dopant decreases as crystal grows. In this manner, the chalcopyrite photoelectric conversion film 13 can be formed in such a way that the band is inclined in the depth direction z.

For example, the chalcopyrite photoelectric conversion film 13 is formed in such a way that the impurity concentration becomes $10^{14}$ to $10^{16}$ cm$^{-3}$. Alternatively, the chalcopyrite photoelectric conversion film 13 is formed in such a way that the film thickness becomes 500 nm, for example.

The chalcopyrite photoelectric conversion film 13 is formed by epitaxially growing the above-described compound semiconductor on the silicon substrate in such a way as to also cover the portion, in which the pixel isolation portion PB is formed.

In the above description, the case where the n-type dopant is contained in the p-type $CuGa_{0.52}In_{0.48}S_2$ film is shown, although not limited to this. For example, the chalcopyrite photoelectric conversion film 13 can be formed in such a way that the band is inclined in the depth direction z as in the above description, by controlling each of the amounts of supply of the group III and the group I appropriately.

The p+-layer 14p is also formed from the chalcopyrite-structure compound semiconductor composed of a copper-aluminum-gallium-indium-sulfur-selenium based mixed crystal.

Specifically, the p+-layer 14p is formed through crystal growth of the above-described compound semiconductor by the MOCVD method, the MBE method, or the like under the condition in which much impurities of Ga, In, As, P, and the like are contained. Here, the p+-layer 14p is formed at a high impurity concentration in order that holes enter the p+-layer 14p and flow in a lateral direction.

For example, the p+-layer 14p is formed in such a way that the impurity concentration becomes $10^{17}$ to $10^{19}$ cm$^{-3}$. Alternatively, the p+-layer 14p is formed in such a way that the film thickness becomes 10 to 100 nm, for example.

Figure 11:
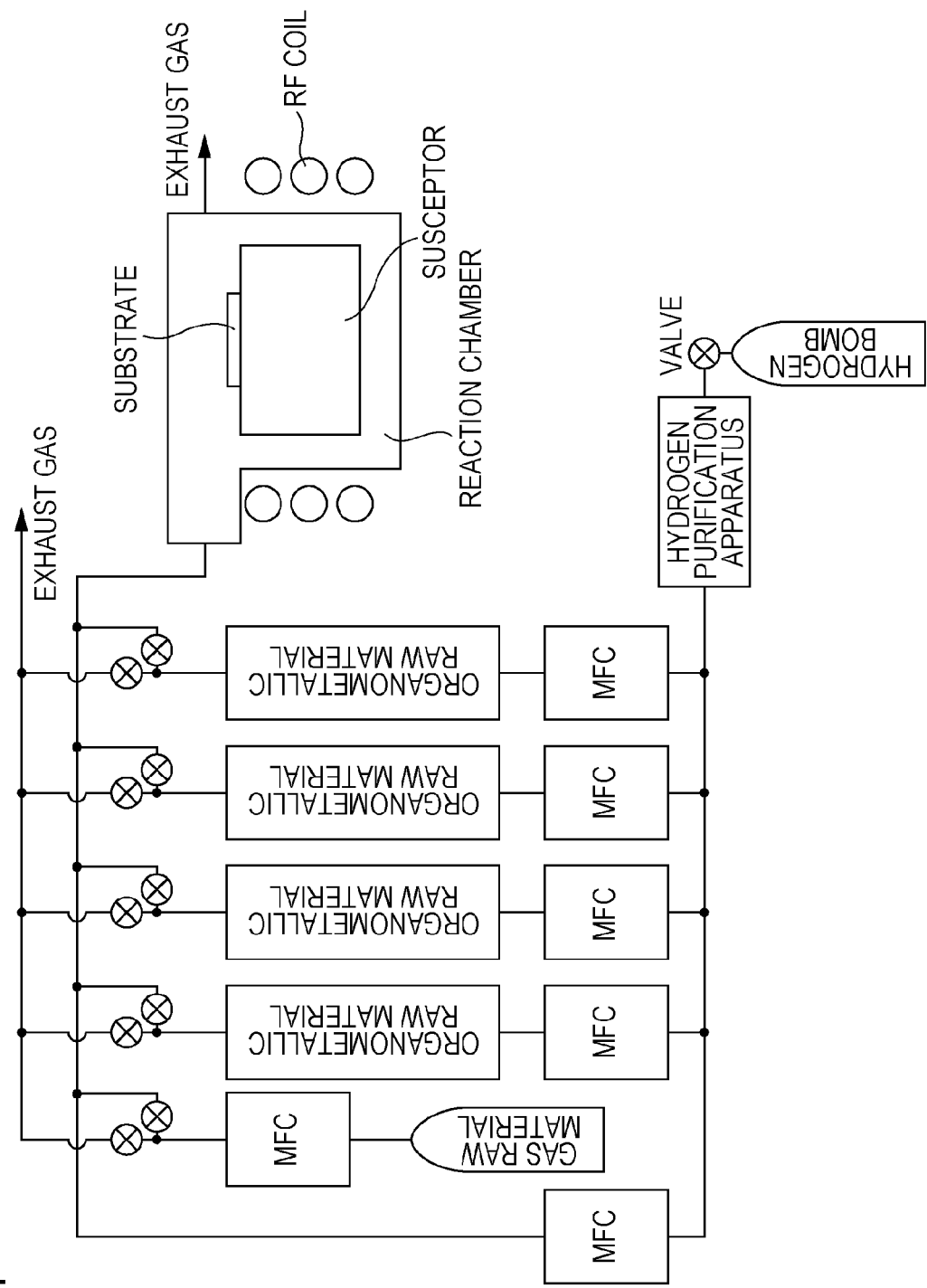
FIG. 11 is a diagram showing a metal organic chemical vapor deposition (MOCVD) apparatus used in the first embodiment according to the present invention.

FIG. 11 is a diagram showing an MOCVD apparatus used in the first embodiment according to the present invention.

In the case where a crystal of the above-described compound semiconductor is grown by the MOCVD growth method, for example, the MOCVD apparatus shown in FIG. 11 is used.

In the case where the above-described crystal is grown on a substrate (silicon substrate), as shown in FIG. 11, the substrate is placed on a (carbon) susceptor. The susceptor is heated with a radio frequency heating apparatus (RF coil), and the temperature of the substrate is controlled. For example, the substrate is heated in such a way that the temperature becomes within the range of 400° C. to 1,000° C. in which pyrolysis can be effected.

An organometallic raw material is bubbled with hydrogen to come into a saturated vapor pressure state, and each raw material molecule is transported to a reaction tube. Here, the flow rate of hydrogen passing each raw material is controlled with a mass flow controller (MFC) and, thereby, the amount of moles of the raw material transported per unit time is adjusted. The organometallic raw material is pyrolyzed on the substrate, so that a crystal is grown. There is a correlation between the ratio of the molar amount of transport and the composition ratio of the crystal. Therefore, the composition ratio of the crystal can be adjusted optionally.

The following organic metals are used as the raw material gas.

Specifically, as for an organic metal of copper, for example, acetyl acetone copper $(Cu(C_5H_7O_2)_2)$ is used. Besides this, cyclopentanedienyl copper triethyl phosphorus $(h5-(C_2H_5)Cu:P(C_2H_5)_3)$ may be used.

As for an organic metal of gallium (Ga), for example, trimethyl gallium $(Ga(CH_3)_3)$ is used. Besides this, triethyl gallium $(Ga(C_2H_5)_3)$ may be used.

As for an organic metal of aluminum (Al), for example, trimethyl aluminum $(Al(CH_3)_3)$ is used. Besides this, triethyl aluminum $(Al(C_2H_5)_3)$ may be used.

As for an organic metal of indium (In), for example, trimethyl indium $(In(CH_3)_3)$ is used. Besides this, triethyl indium $(In(C_2H_5)_3)$ may be used.

As for an organic metal of selenium (Se), for example, dimethyl selenium $(Se(CH_3)_2)$ is used. Besides this, diethyl selenium $(Se(C_2H_5)_2)$ may be used.

As for an organic metal of sulfur (S), for example, dimethyl sulfide $(S(CH_3)_2)$ is used. Besides this, diethyl sulfide $(S(C_2H_5)_2)$ may be used.

As for an organic metal of zinc (Zn), for example, dimethyl zinc ($Zn(CH_3)_2$) is used. Besides this, diethyl zinc ($Zn(C_2H_5)_2$) may be used.

Besides the organic metals, for example, hydrogen selenide ($H_2Se$) may be used as a Se material. In addition, hydrogen sulfide ($H_2S$) may be used as a S raw material.

In this regard, the raw materials, e.g., cyclopentanedienyl copper triethyl phosphorus ($h5-(C_2H_5)Cu:P(C_2H_5)_3$), acetyl acetone copper ($Cu(C_5H_7O_2)_2$), and trimethyl indium ($In(CH_3)_3$), are in the solid phase state at room temperature. In this case, the raw material is heated to come into a liquid state. Alternatively, the raw materials may be used even in a solid phase state while the temperature is raised simply so as to increase the vapor pressure.

Figure 12:
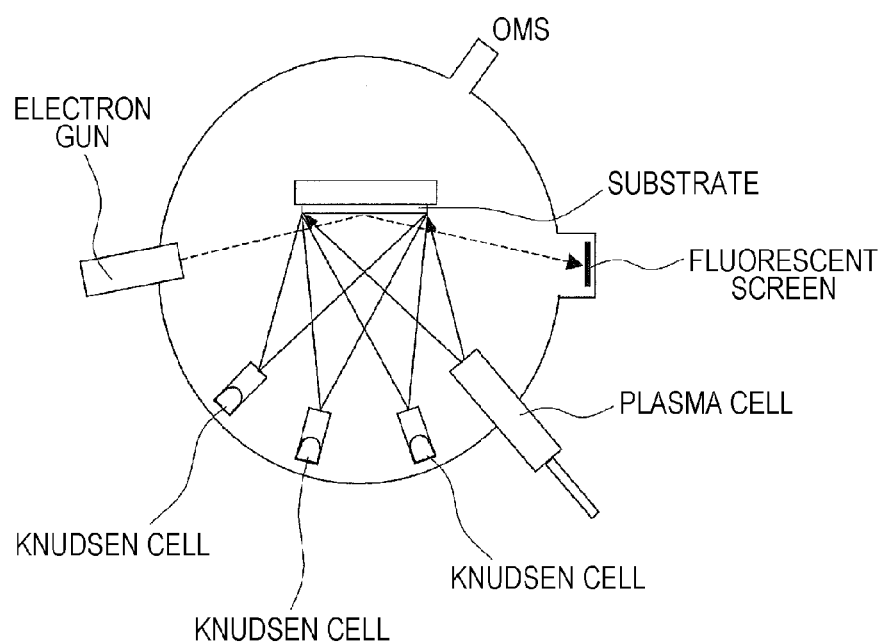
FIG. 12 is a diagram showing a molecular beam epitaxy (MBE) apparatus used in the first embodiment according to the present invention.

FIG. 12 is a diagram showing an MBE apparatus used in the first embodiment according to the present invention.

In the case where a crystal of the above-described compound semiconductor is grown by the MBE growth method, for example, the MBE apparatus shown in FIG. 12 is used.

In this case, a simple substance raw material of copper and each simple substance raw material of gallium (Ga), aluminum (Al), indium (In), selenium (Se), and sulfur (S) are put into each Knudsen cell. Then, these raw materials are heated to an appropriate temperature, each molecular beam is applied to the substrate, so that crystal growth is effected.

At this time, in the case of a material, e.g., sulfur (S), having an especially high vapor pressure, the stability of the amount of molecular beam may be poor. In such a case, a valved cracking cell may be used so as to stabilize the amount of molecular beam. Furthermore, a part of raw materials may be used as gas sources, as in gas source MBE. For example, hydrogen selenide ($H_2Se$) may be used as a Se raw material, and hydrogen sulfide ($H_2S$) may be used as a sulfur (S) raw material.

(B-2) Formation of Resist Pattern PR

Figure 8:
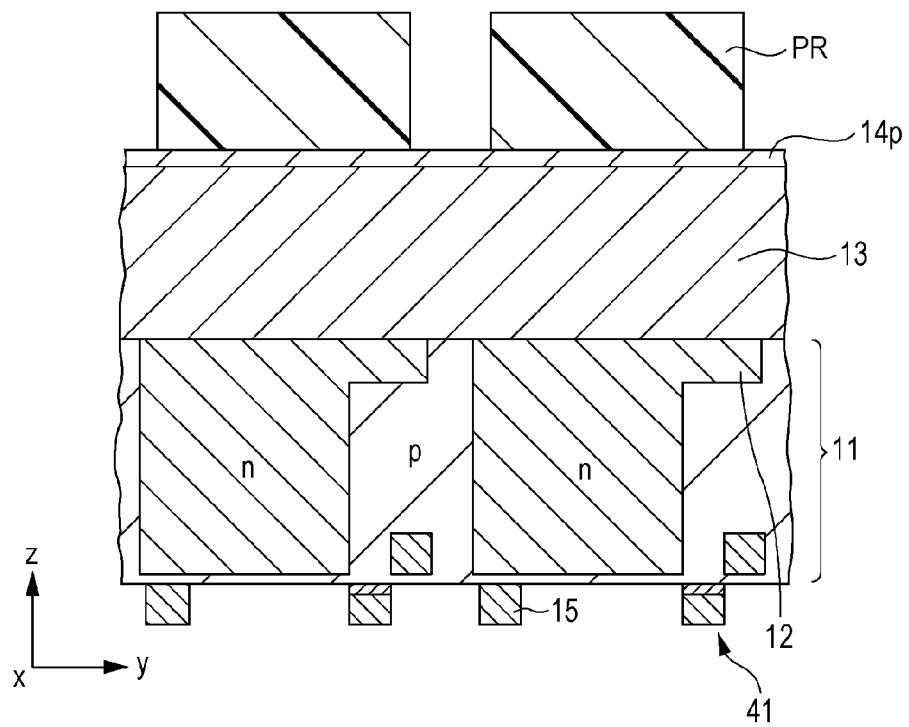
FIG. 8 is a diagram showing a method for manufacturing the solid-state imaging device according to the first embodiment of the present invention.

Next, as shown in FIG. 8, a resist pattern PR is formed.

Here, as shown in FIG. 8, the resist pattern PR is formed on the surface of the $p^+$-layer 14$p$.

In the present embodiment, the resist pattern PR is formed having an opening disposed in such a way that with respect to the upper surface of the $p^+$-layer 14$p$, a surface of a portion, under which the pixel isolation portion PB is formed, is exposed and a surface of the portion other than the above-described portion is covered.

Specifically, a photoresist film (not shown in the drawing) is formed on the upper surface of the $p^+$-layer 14$p$ through painting and, thereafter, the photoresist film is patterned through lithography, so that the resist pattern PR is formed.

(B-3) Execution of Ion Implantation

Figure 9:
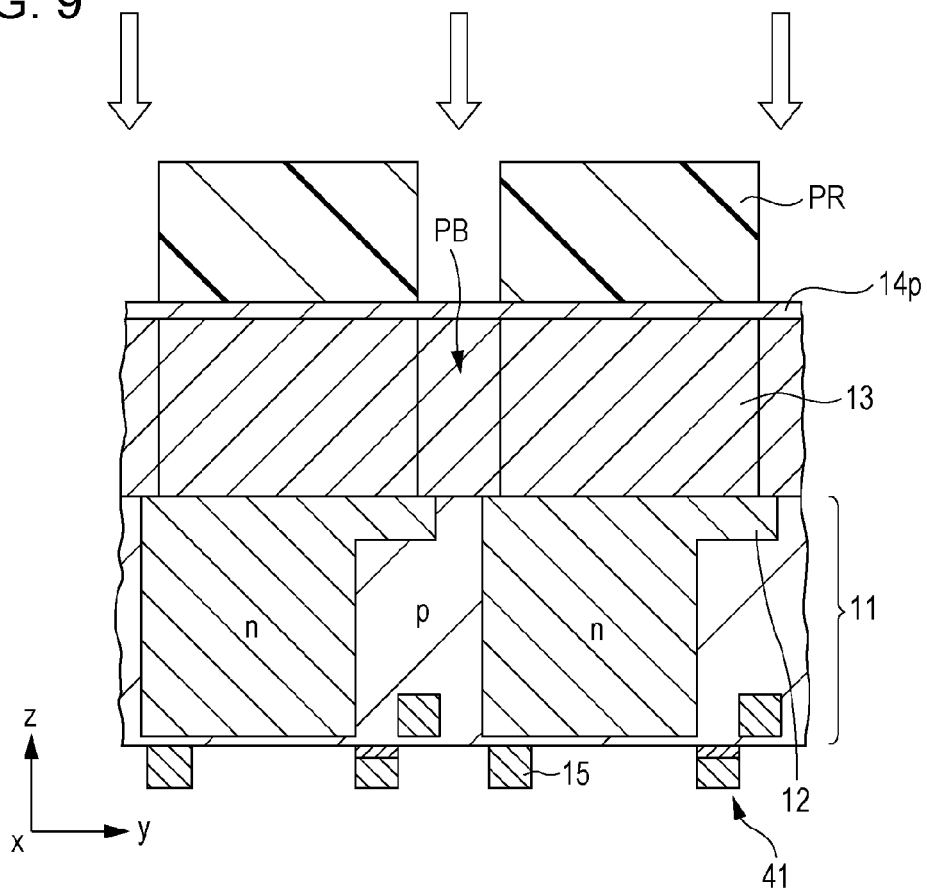
FIG. 9 is a diagram showing a method for manufacturing the solid-state imaging device according to the first embodiment of the present invention.

As shown in FIG. 9, ion implantation is executed.

Here, as shown in FIG. 9, the resist pattern PR is used as a mask, and an impurity is ion-implanted into the chalcopyrite photoelectric conversion film 13. In this manner, the impurity is ion-implanted into the portion, in which the pixel isolation portion PB is formed, of the chalcopyrite photoelectric conversion film 13 through the opening of the resist pattern PR.

In the present embodiment, a p-type impurity, e.g., Ga, In, As, or P is ion-implanted into the portion, in which the pixel isolation portion PB is formed, of the chalcopyrite photoelectric conversion film 13, so as to contain a high-concentration p-type impurity.

For example, ion implantation is executed in such a way that the p-type impurity concentration of the portion, in which the pixel isolation portion PB is formed, becomes $10^{17}$ to $10^{19}$ $cm^{-3}$.

Subsequently, the resist pattern PR is removed from the $p^+$-layer 14$p$.

(B-4) Formation of Pixel Isolation Portion PB

Figure 10:
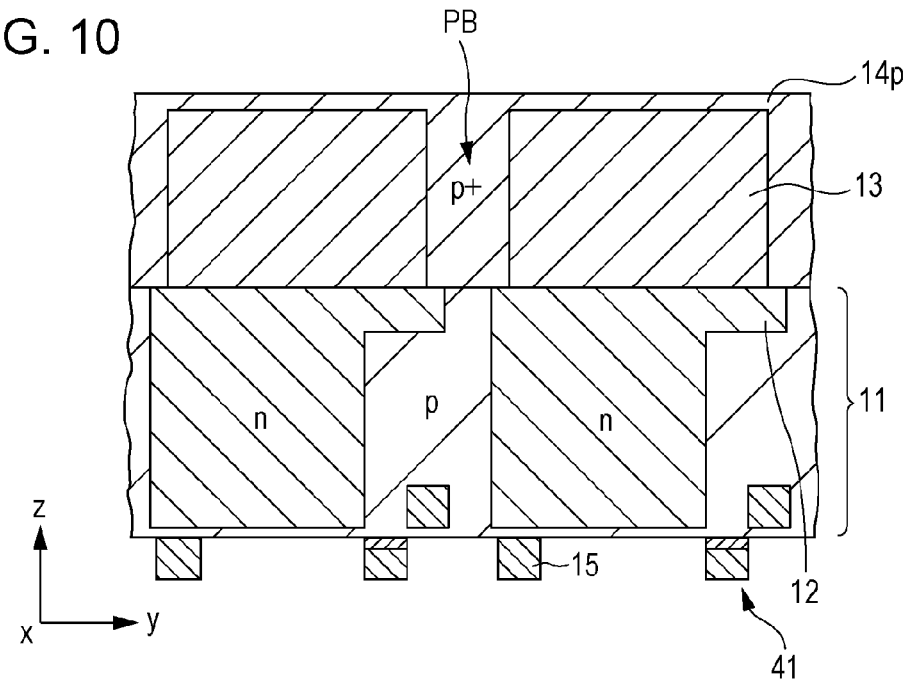
FIG. 10 is a diagram showing a method for manufacturing the solid-state imaging device according to the first embodiment of the present invention.

As shown in FIG. 10, the pixel isolation portion PB is formed.

Here, the pixel isolation portion PB is formed by executing annealing to activate.

Specifically, the pixel isolation portion PB is formed by executing annealing at a temperature condition of 400° C. or higher.

As described above, the pixel isolation portion PB is formed by selectively doping the portion, in which the pixel isolation portion PB is formed, of the chalcopyrite photoelectric conversion film 13 formed on the surface of the silicon substrate 11 in such a way as to include the portion, in which the pixel isolation portion PB is formed.

Then, as shown in FIG. 3, each portion of the color filter CF, the on-chip lens ML, and the like is disposed in the upper surface (backside) side of the silicon substrate 11. In this manner, the backside-illumination type CMOS image sensor is completed.

(C) Overview

As described above, in the present embodiment, the plurality of pixels P are arrayed in the pixel region PA. In addition to this, the pixel isolation portion PB is disposed in the pixel region PA in such a way as to be interposed between the plurality of pixels P (refer to FIG. 2).

Here, the pixel P includes the chalcopyrite photoelectric conversion film 13. This chalcopyrite photoelectric conversion film 13 is a chalcopyrite-structure compound semiconductor and is formed on the silicon substrate 11 in such a way as to lattice-match the silicon substrate concerned (refer to FIG. 3). For example, the chalcopyrite photoelectric conversion film 13 is formed from a chalcopyrite-structure compound semiconductor composed of a copper-aluminum-gallium-indium-sulfur-selenium based mixed crystal. As described above, in the present embodiment, the chalcopyrite photoelectric conversion film 13 is formed by epitaxially growing the chalcopyrite based material mixed crystal having a high optical absorption coefficient in such a way as to lattice-match the Si (100) substrate. Consequently, the crystallinity of the chalcopyrite photoelectric conversion film 13 becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PB is formed from a compound semiconductor subjected to doping concentration control in such a way as to become a potential barrier between the chalcopyrite photoelectric conversion films 13 disposed in accordance with the plurality of pixels P (refer to FIG. 3 and FIG. 6B). Consequently, in the present embodiment, an occurrence of color mixing can be prevented by the pixel isolation portion PB.

Regarding a type in the related art in which the pixel isolation portion PB is not present, electrons generated through photoelectric conversion can move between pixels freely. If it is assumed that electrons can move in every direction equally, about 300 of electrons enter adjacent pixels with respect to 1.5 μm pixel. This is almost avoided by providing the pixel isolation portion PB.

In the present embodiment, the $p^+$-layer 14$p$ serving as a high-concentration impurity diffusion layer is disposed on the surface of the chalcopyrite photoelectric conversion film 13 in the incident side of the incident light. Consequently, an occurrence of a dark current is suppressed.

In the present embodiment, the p$^+$-layers 14p are disposed in such a way as to be mutually joined between the plurality of pixels. Consequently, holes enter the p$^+$-layer 14p from the chalcopyrite photoelectric conversion film 13 and flow between the pixels in the lateral direction. Electrons generated in the chalcopyrite photoelectric conversion film 13 flow to the silicon substrate 11 side (refer to FIG. 6A). Therefore, it is not necessary to provide a transparent electrode on the upper surface of the chalcopyrite photoelectric conversion film 13.

In the above description, the case where a transparent electrode is not disposed on the chalcopyrite photoelectric conversion film 13 by forming the p$^+$-layer 14p in such a way as to have a high impurity concentration is shown, although not limited to this. A transparent electrode serving as an upper electrode may be disposed on the chalcopyrite photoelectric conversion film 13.

(D) Modified Example 1-1

Figure 13A:
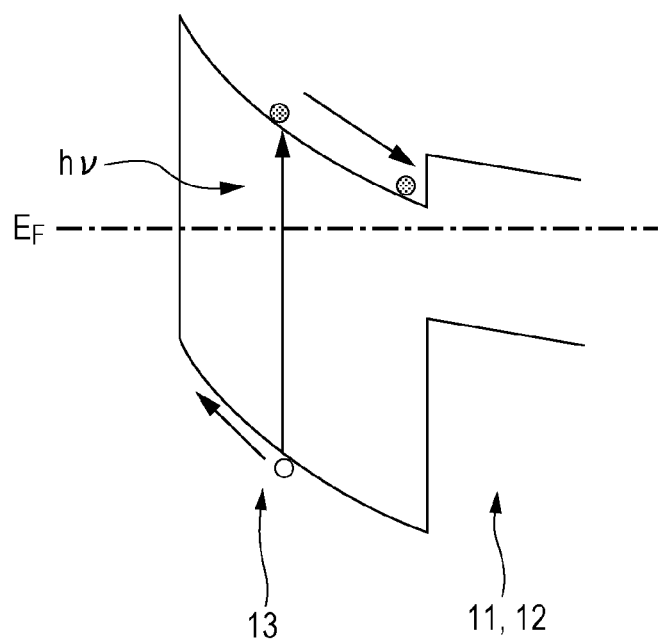
FIGS. 13A and 13B are diagrams showing band structures of a solid-state imaging device according to Modified example 1-1 of the first embodiment of the present invention.
Figure 13B:
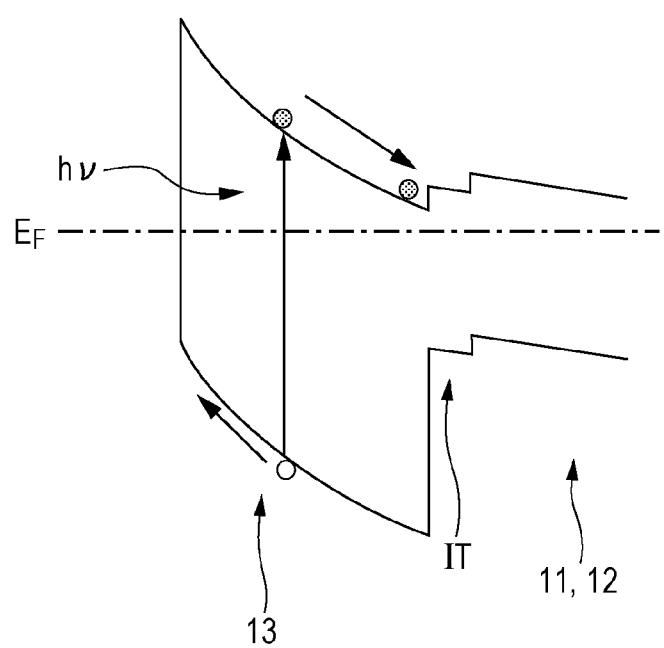

FIGS. 13A and 13B are diagrams showing band structures of a solid-state imaging device according to Modified example 1-1 of the first embodiment of the present invention.

FIGS. 13A and 13B show the band structures in the depth direction z of the chalcopyrite photoelectric conversion film 13 and the silicon substrate 11, as in FIG. 6A. FIG. 13A shows the case where the chalcopyrite photoelectric conversion film 13 is formed having a band structure different from that in the case of FIG. 6A. FIG. 6B shows Modified example 1-1 which is favorable in that case.

The lattice-matched chalcopyrite material has not typically a constant band structure. That is, as is clear from FIG. 13A, the chalcopyrite photoelectric conversion film 13 is formed having a band structure different from that shown in FIG. 6A, in some cases.

For example, as is described in D. S. Su and W. Neumann, Appl. Phys. Lett. 73, 785, (1998), a CuAu type ordered phase may be formed depending on the growth condition. The band structure may be thereby changed and the electron affinity (energy difference between the bottom of the conduction band and the vacuum level) may be changed.

Consequently, the above-described relationship, (electron affinity of silicon substrate 11)>(electron affinity of chalcopyrite photoelectric conversion film 13), as shown in FIG. 6A described above, is not satisfied in some cases.

In the case where (electron affinity of silicon substrate 11)<(electron affinity of chalcopyrite photoelectric conversion film 13) is satisfied, as shown in FIG. 13A, there is a potential barrier between the silicon substrate 11 and the chalcopyrite photoelectric conversion film 13. Consequently, movement of electrons accumulated in the chalcopyrite photoelectric conversion film 13 to the silicon substrate 11 side may become difficult.

In order to prevent an occurrence of such an inconvenience, as shown in FIG. 13B, an intermediate layer IT may be interposed between the silicon substrate 11 and the chalcopyrite photoelectric conversion film 13. The intermediate layer IT is disposed in such a way that the electron affinity becomes between the electron affinity of the silicon substrate 11 and the electron affinity of the chalcopyrite photoelectric conversion film 13 to lower the potential barrier between the silicon substrate 11 and the chalcopyrite photoelectric conversion film 13. That is, the intermediate layer IT is disposed in such a way that the electron affinities satisfy the following relationship.

(electron affinity of silicon substrate 11)<(electron affinity of intermediate layer IT)<(electron affinity of chalcopyrite photoelectric conversion film 13)

It is most favorable that the intermediate layer IT is formed in such a way that the electron affinity becomes exactly at the midpoint between the electron affinity of the substrate 11 and the electron affinity of the chalcopyrite photoelectric conversion film 13.

For example, it is favorable that the intermediate layer IT is formed under the condition of the material, the film thickness, and the like described below.

Material (composition): $CuGa_{0.64}In_{0.36}S_2$
Film thickness: 5 nm

In this regard, the intermediate layer IT is not necessarily lattice-matched with the silicon substrate 11 insofar as the film thickness is within a critical film thickness.

For example, the lattice mismatch between this intermediate layer IT ($CuGa_{0.64}In_{0.36}S_2$) and the Si substrate becomes $\Delta a/a = 5.12 \times 10^{-3}$. At this time, the film thickness of 5 nm is smaller than the critical film thickness specified by "Matthews and Blakeslee's expression" (refer to J. W. Matthews and A. E. Blakeslee, J. Cryst. Growth 27 (1974) 118-125) or "People and Bean's expression" (refer to R. People and J. C. Bean, Appl. Phys. Lett. 47 (1985) 322-324).

2. Second Embodiment

Formation of Pixel Isolation Doped Through Lateral Growth (Backside-Illumination Type+CF))

(A) Apparatus Configuration and the Like

Figure 14:
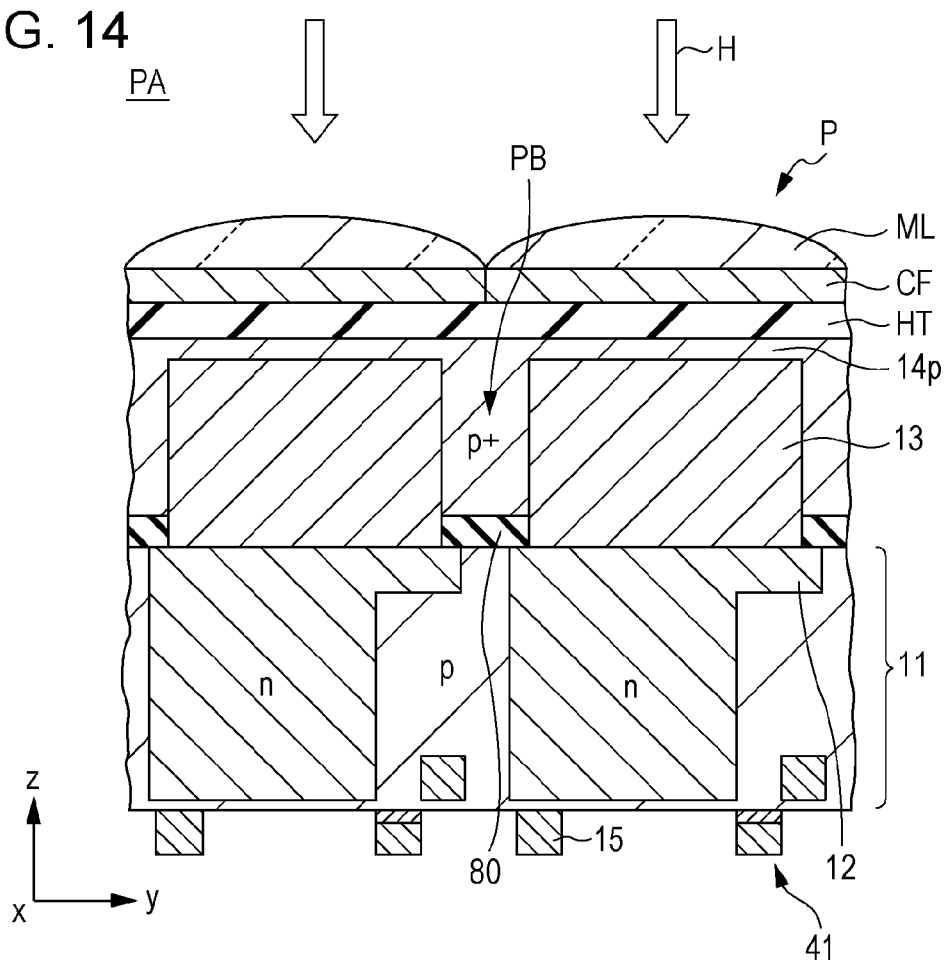
FIG. 14 is a diagram showing a key portion of a solid-state imaging device according to a second embodiment of the present invention.

FIG. 14 is a diagram showing a key portion of a solid-state imaging device according to a second embodiment of the present invention.

Here, FIG. 14 shows a cross section of a pixel P, as in FIG. 3.

As shown in FIG. 14, in the present embodiment, an insulating film 80 is disposed. The present embodiment is the same as the first embodiment except this point. Therefore, explanations of the same portions are omitted hereafter.

As shown in FIG. 14, the insulating film 80 is disposed on the one surface of the silicon substrate 11.

Here, on the silicon substrate 11, the insulating film 80 is disposed on a portion, on which the pixel isolation portion PB is disposed, in the side of a surface (backside) opposite to the surface (frontside) provided with the reading electrode 15. For example, a silicon oxide film is disposed as this insulating film 80. Alternatively, a silicon nitride film or the like may be disposed as this insulating film 80.

On the surface (backside) of the silicon substrate 11, the insulating film 80 is disposed on a surface of a portion other than the portion, on which the chalcopyrite photoelectric conversion film 13 is formed, in order to selectively grow the crystal of the chalcopyrite photoelectric conversion film 13, as is described later in detail.

Then, the pixel isolation portion PB is disposed on the silicon substrate 11 with the insulating film 80 therebetween.

(B) Manufacturing Method

A key portion of a method for manufacturing the above-described solid-state imaging device will be described.

Figure 15:
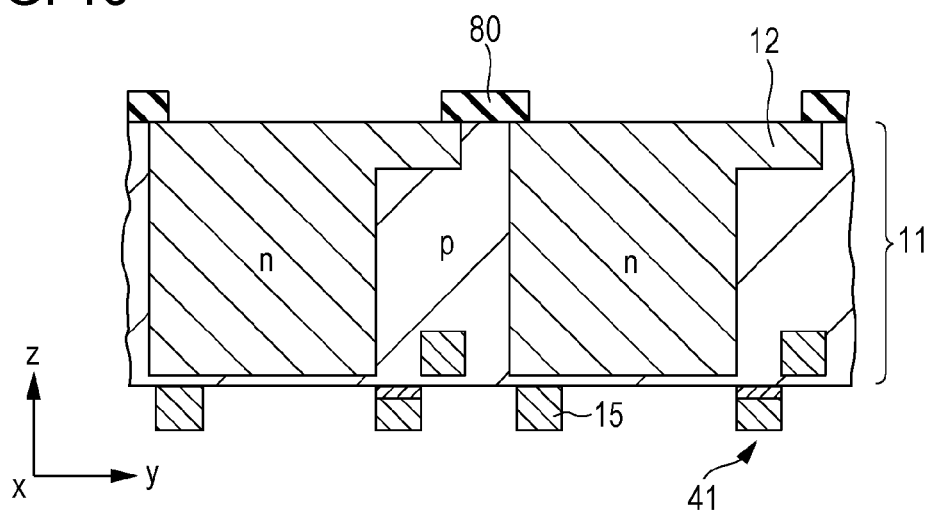
FIG. 15 is a diagram showing a method for manufacturing the solid-state imaging device according to the second embodiment of the present invention.
Figure 16:
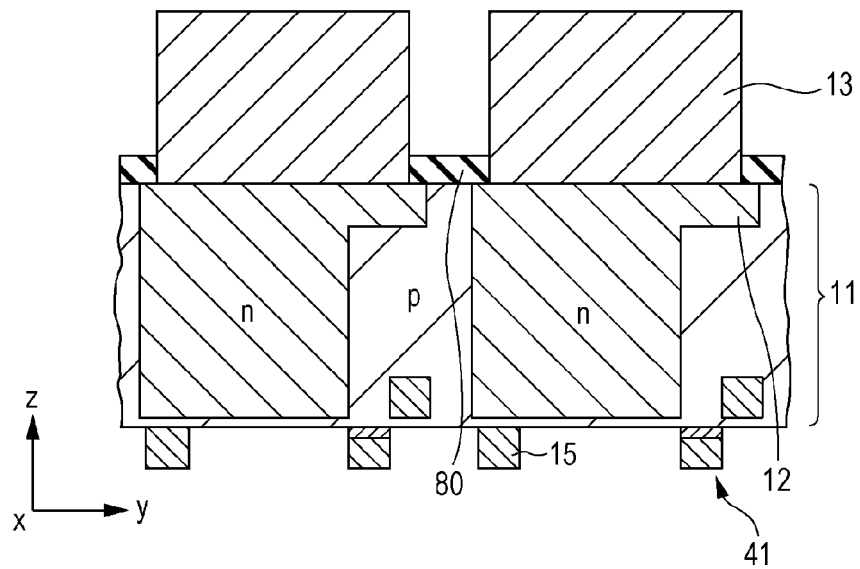
FIG. 16 is a diagram showing the method for manufacturing the solid-state imaging device according to the second embodiment of the present invention.
Figure 17:
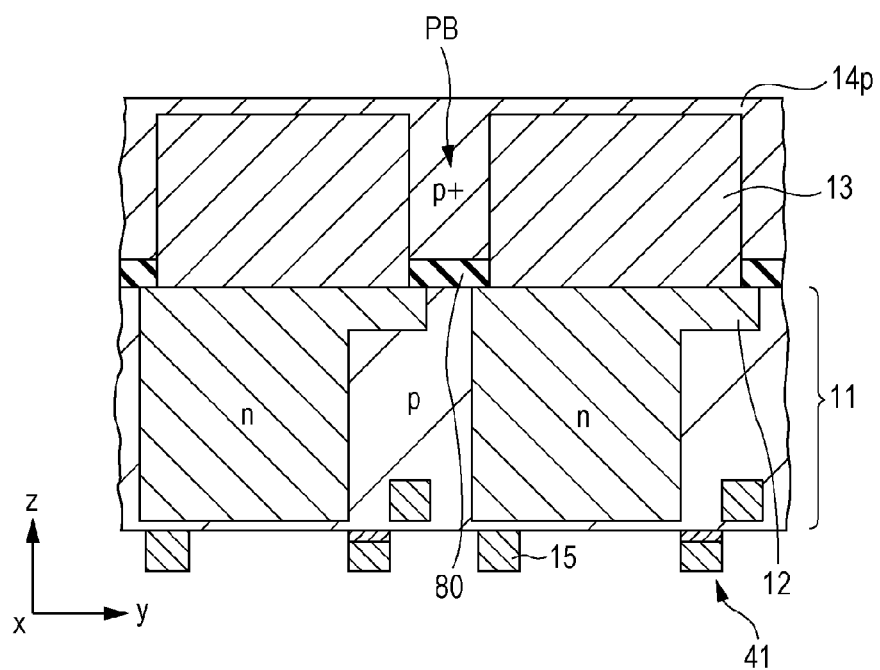
FIG. 17 is a diagram showing the method for manufacturing the solid-state imaging device according to the second embodiment of the present invention.

FIG. 15 to FIG. 17 are diagrams showing a method for manufacturing the solid-state imaging device according to the second embodiment of the present invention.

FIG. 15 to FIG. 17 show a cross section as in FIG. 14, and the solid-state imaging device shown in FIG. 14 is produced through each of the steps shown in FIG. 15 to FIG. 17 sequentially.

(B-1) Formation of Insulating Film 80

Initially, as shown in FIG. 15, the insulating film 80 is formed.

Here, before the insulating film 80 is formed, in a manner similar to that in the first embodiment, each portion of the reading electrode 15, the gate MOS 41, and the reading circuit 51 is formed on a surface of the silicon substrate 11. Subsequently, a wiring layer (not shown in the drawing) is formed on the surface (frontside) of the silicon substrate 11 in such a way as to cover each of the portions, e.g., the reading circuit 51.

Thereafter, as shown in FIG. 15, on the silicon substrate 11, the insulating film 80 is formed on a portion, on which the pixel isolation portion PB is disposed, in the side of the surface (backside) opposite to the surface (frontside) provided with each of the portions, e.g., the reading electrode 15. That is, the insulating film 80 is formed in such a way as to partition between the plurality of pixels P.

Specifically, for example, a silicon oxide film (not shown in the drawing) is formed in such a way as to cover the backside (upper surface) of the silicon substrate 11. Then, the resulting silicon oxide film is patterned through photolithography, so that the insulating film 80 is formed.

For example, this insulating film 80 is formed in such a way that the film thickness becomes 50 to 100 nm.

(B-2) Formation of Chalcopyrite Photoelectric Conversion Film 13

Next, as shown in FIG. 16, the chalcopyrite photoelectric conversion film 13 is formed.

Here, as shown in FIG. 16, on the silicon substrate 11, the chalcopyrite photoelectric conversion film 13 is formed on the surface (backside) opposite to the surface provided with each of the portions, e.g., the reading electrode 15.

For example, the chalcopyrite photoelectric conversion film 13 is formed from a chalcopyrite-structure compound semiconductor composed of a copper-aluminum-gallium-indium-sulfur-selenium based mixed crystal in such a way as to lattice-match the silicon substrate 11.

For example, in a manner similar to that in the first embodiment, the chalcopyrite photoelectric conversion film 13 is formed by epitaxially growing the above-described compound semiconductor on the silicon substrate 11 by a method, e.g., the MOCVD method or the MBE method.

In the present embodiment, in contrast to the first embodiment, the chalcopyrite photoelectric conversion film 13 is formed by epitaxially growing the above-described compound semiconductor in such a way as to selectively cover a portion, on which the photoelectric conversion film is formed, on the upper surface of the silicon substrate 11.

As shown in FIG. 15, the insulating film 80 is disposed on the silicon substrate 11 in such a way as to partition between the plurality of pixels P. Consequently, on the surface of the silicon substrate 11, a crystal of the chalcopyrite photoelectric conversion film 13 is selectively grown on an exposed portion other than the portion, on which the insulating film 80 is disposed. Here, the chalcopyrite photoelectric conversion film 13 is formed in such a way that the film thickness becomes larger than the film thickness of the insulating film 80, and trenches TR are disposed between the chalcopyrite photoelectric conversion films 13 formed in accordance with the individual pixels P.

(B-3) Formation of Pixel Isolation Portion PB and P⁺-Layer 14p

Subsequently, as shown in FIG. 17, the pixel isolation portion PB and the p⁺-layer 14p are formed.

Here, as shown in FIG. 17, on the silicon substrate 11, the pixel isolation portion PB and the p⁺-layer 14p are formed on the surface (backside) opposite to the surface provided with each of the portions, e.g., the reading electrode 15. That is, on the backside of the silicon substrate 11, the pixel isolation portion PB and the p⁺-layer 14p are formed in such a way that the pixel isolation portion PB covers the insulating film 80 and the p⁺-layer 14p covers the chalcopyrite photoelectric conversion film 13.

For example, each of the pixel isolation portion PB and the p⁺-layer 14p is formed from a chalcopyrite-structure compound semiconductor composed of a copper-aluminum-gallium-indium-sulfur-selenium based mixed crystal.

Specifically, the above-described compound semiconductor is laterally grown under the condition in which much p-type impurities, e.g., Ga, In, As, and P, are contained. In this manner, the above-described compound semiconductor is filled into the trench TR between the chalcopyrite photoelectric conversion films 13 so as to form the pixel isolation portion PB and, in addition, the p⁺-layer 14p is formed on the chalcopyrite photoelectric conversion films 13.

For example, the pixel isolation portion PB and the p⁺-layer 14p are formed in such a way that the impurity concentration becomes $10^{17}$ to $10^{19}$ cm$^{-3}$.

In this manner, on the silicon substrate 11, the pixel isolation portion PB is formed by epitaxially growing the compound semiconductor in such a way as to cover a portion, on which the pixel isolation portion PB is formed. In addition to this, the p⁺-layer 14p is formed by growing a crystal of the compound semiconductor in such a way as to cover the upper surface of the chalcopyrite photoelectric conversion film 13.

Then, as shown in FIG. 14, each portion of the color filter CF, the on-chip lens ML, and the like is disposed in the upper surface (backside) side of the silicon substrate 11. In this manner, the backside-illumination type CMOS image sensor is completed.

(C) Overview

As described above, in the present embodiment, as in the first embodiment, the chalcopyrite photoelectric conversion film 13 is a chalcopyrite-structure compound semiconductor and is formed on the silicon substrate 11 in such a way as to lattice-match the silicon substrate concerned. Consequently, the crystallinity of the chalcopyrite photoelectric conversion film 13 becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PB is formed from a compound semiconductor subjected to doping concentration control in such a way as to become a potential barrier between the chalcopyrite photoelectric conversion films 13 disposed in accordance with the plurality of pixels P (refer to FIG. 14). Consequently, in the present embodiment, an occurrence of color mixing can be prevented by the pixel isolation portion PB.

The second embodiment has a favorable effect from the viewpoint of a production cost because the number of process steps, e.g., ion implantation and annealing, is reduced as compared with the first embodiment. Furthermore, ion implantation and annealing are not necessary and, therefore, there is no damage due to those processes (for example, damage during ion implantation and an adverse effect on a wiring layer during annealing).

3. Third Embodiment

Figure 18:
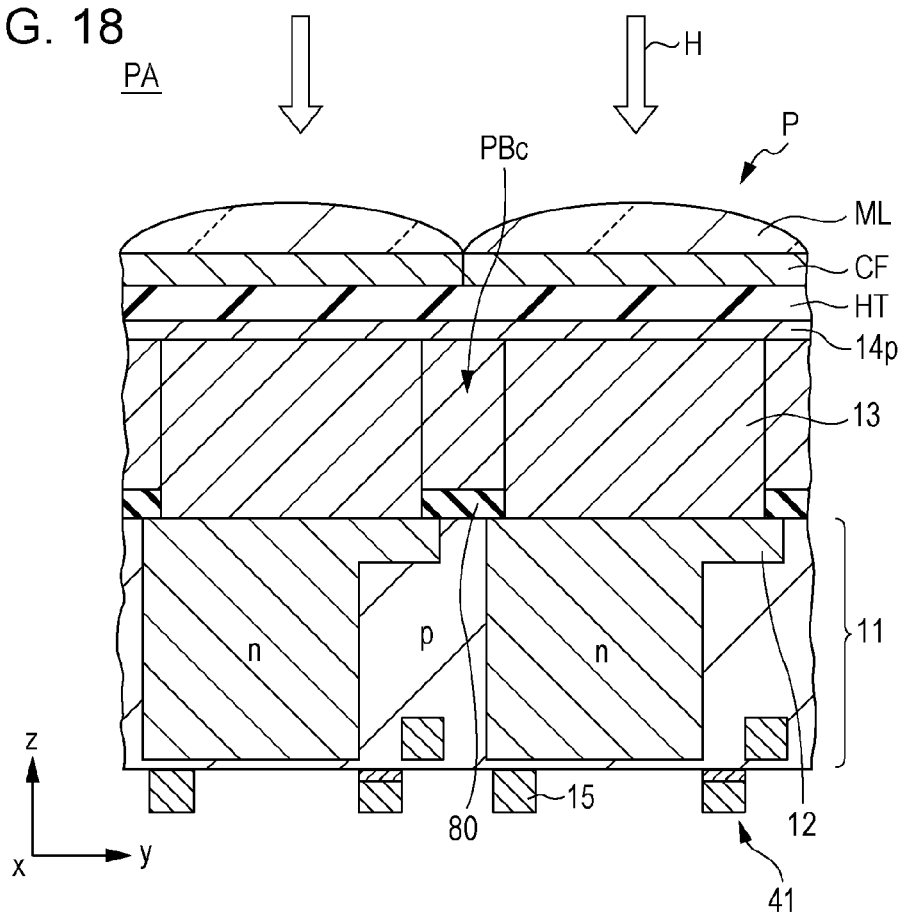
FIG. 18 is a diagram showing a key portion of a solid-state imaging device according to a third embodiment of the present invention.

Formation of Pixel Isolation (Non-Doped) Through Composition Control (A) Apparatus Configuration and the Like FIG. 18 is a diagram showing a key portion of a solid-state imaging device according to a third embodiment of the present invention.

Here, FIG. 18 shows a cross section of a pixel P, as in FIG. 14.

As shown in FIG. 18, in the present embodiment, a pixel isolation portion PBc is different from that in the second embodiment. The present embodiment is the same as the second embodiment except this point. Therefore, explanations of the same portions are omitted hereafter.

As shown in FIG. 18, the pixel isolation portion PBc is disposed between the plurality of chalcopyrite photoelectric conversion films 13, which are formed in accordance with the pixels P, in such a way as to cover the insulating film 80.

In the present embodiment, the pixel isolation portion PBc is formed from a semiconductor not containing a p-type impurity in contrast to the second embodiment. For example, the pixel isolation portion PBc is formed from a chalcopyrite based compound semiconductor composed of a copper-aluminum-gallium-indium-sulfur-selenium based mixed crystal having a large band gap. For example, the pixel isolation portion PBc is disposed in such a way that the band gap difference becomes kT=27 meV or more. Consequently, potential barriers are formed between the plurality of chalcopyrite photoelectric conversion films 13 disposed in accordance with the pixels P and, thereby, the pixel isolation portion PBc isolates the pixels from each other.

(B) Manufacturing Method

A key portion of a method for manufacturing the above-described solid-state imaging device will be described.

Figure 19:
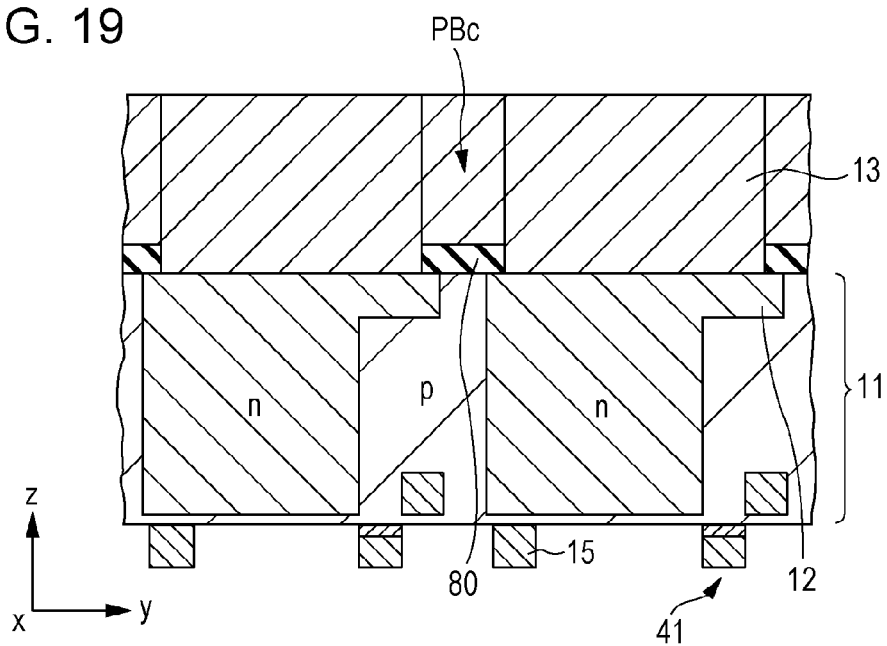
FIG. 19 is a diagram showing a method for manufacturing the solid-state imaging device according to the third embodiment of the present invention.
Figure 20:
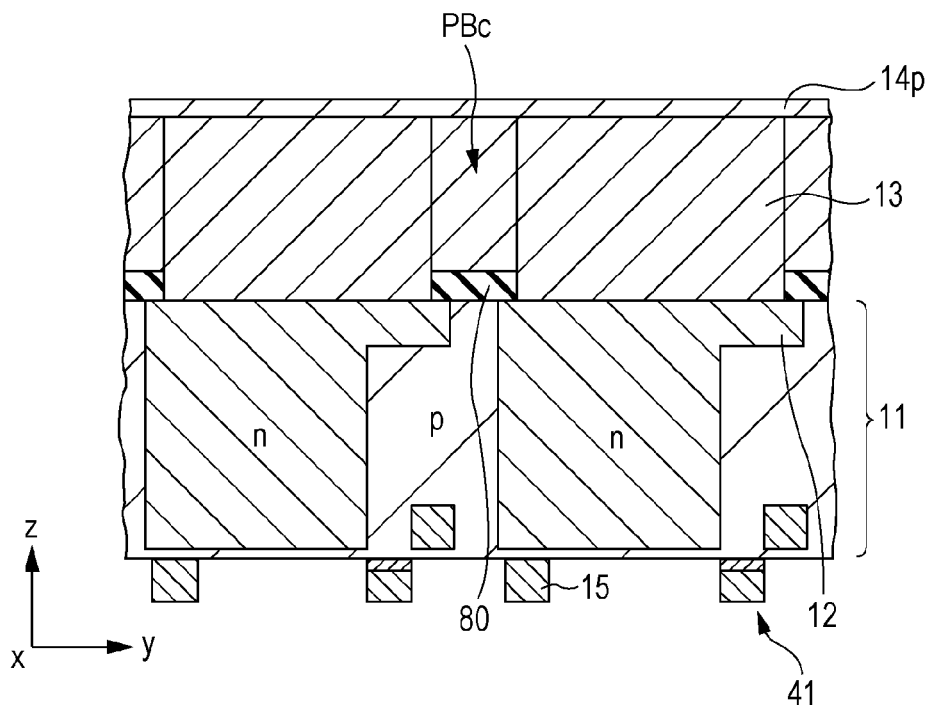
FIG. 20 is a diagram showing the method for manufacturing the solid-state imaging device according to the third embodiment of the present invention.

FIG. 19 and FIG. 20 are diagrams showing a method for manufacturing the solid-state imaging device according to the third embodiment of the present invention.

FIG. 19 and FIG. 20 show a cross section as in FIG. 18, and the solid-state imaging device shown in FIG. 18 is produced through each of the steps shown in FIG. 19 and FIG. 20 sequentially.

(B-1) Formation of Pixel Isolation Portion PBc

Initially, as shown in FIG. 19, the pixel isolation portion PBc is formed.

Here, prior to formation of the pixel isolation portion PBc, in a manner similar to that in the second embodiment, the insulating film 80 and the chalcopyrite photoelectric conversion film 13 are formed (refer to FIG. 15 and FIG. 16).

Thereafter, as shown in FIG. 19, the pixel isolation portion PBc is formed between the plurality of chalcopyrite photoelectric conversion films 13, which are disposed in accordance with the pixels, in such a way as to cover the insulating film 80.

In the present step, for example, the pixel isolation portion PBc is formed from a chalcopyrite based compound semiconductor composed of a copper-aluminum-gallium-indium-sulfur-selenium based mixed crystal having a large band gap.

Specifically, in contrast to the second embodiment, the above-described compound semiconductor is laterally grown under the condition in which a p-type impurity is not contained. In this manner, the above-described compound semiconductor is filled into the trench TR between the chalcopyrite photoelectric conversion films 13 so as to form the pixel isolation portion PBc.

For example, the pixel isolation portion PBc is formed in such a way that the composition ratio of copper-aluminum-gallium-indium-sulfur-selenium becomes 1.0:0.36:0.64:0:1.28:0.72 or 1.0:0.24:0.23:0.53:2.0:0.

That is, the pixel isolation portion PBc is formed in such a way as to result in $CuAl_{0.36}Ga_{0.64}S_{1.28}Se_{0.72}$ or $CuAl_{0.24}Ga_{0.23}In_{0.53}S_2$.

(B-2) Formation of $p^+$-Layer 14$p$

As shown in FIG. 20, the $p^+$-layer 14$p$ is formed. Here, as shown in FIG. 20, on the backside (upper surface) of the silicon substrate 11, the $p^+$-layer 14$p$ is formed in such a way as to cover the upper surface of the chalcopyrite photoelectric conversion film 13 and the upper surface of the pixel isolation portion PBc.

For example, in a manner similar to that in the second embodiment, the $p^+$-layer 14$p$ is formed from a chalcopyrite-structure compound semiconductor composed of a copper-aluminum-gallium-indium-sulfur-selenium based mixed crystal.

Specifically, the $p^+$-layer 14$p$ is formed by growing a crystal of the above-described compound semiconductor under the condition in which much impurities, e.g., Ga, In, As, and P, are contained.

Then, as shown in FIG. 18, each portion of the color filter CF, the on-chip lens ML, and the like is disposed on the upper surface (backside) side of the silicon substrate 11. In this manner, the backside-illumination type CMOS image sensor is completed.

(C) Overview

As described above, in the present embodiment, as in the first embodiment, the chalcopyrite photoelectric conversion film 13 is a chalcopyrite-structure compound semiconductor and is formed on the silicon substrate 11 in such a way as to lattice-match the silicon substrate concerned. Consequently, the crystallinity of the chalcopyrite photoelectric conversion film 13 becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PBc is formed from a compound semiconductor subjected to composition control in such a way as to become a potential barrier between the chalcopyrite photoelectric conversion films 13 disposed in accordance with the plurality of pixels P (refer to FIG. 18). Consequently, in the present embodiment, an occurrence of color mixing can be prevented by the pixel isolation portion PBc.

Furthermore, regarding the potential barrier through band gap control, it is not typically necessary to dope the barrier layer, and there is a favorable effect that the crystallinity is improved as compared with the first and the second embodiments. Moreover, there is a favorable effect from the viewpoint of a production cost because the number of process steps, e.g., ion implantation and annealing, is reduced as compared with the first embodiment.

4. Fourth Embodiment

Surface-Illumination Type 1

(A) Apparatus Configuration and the Like

Figure 21:
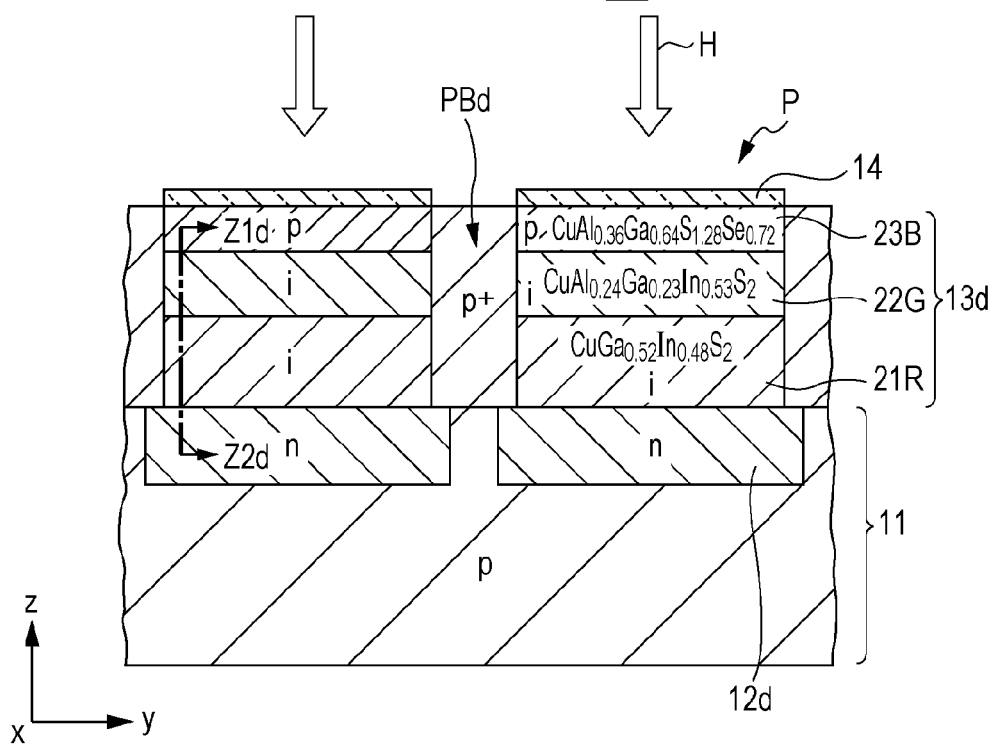
FIG. 21 is a diagram showing a key portion of a solid-state imaging device according to a fourth embodiment of the present invention.

FIG. 21 is a diagram showing a key portion of a solid-state imaging device according to a fourth embodiment of the present invention.

Here, FIG. 21 shows a cross section of a pixel P, as in FIG. 3.

As shown in FIG. 21, in the present embodiment, the configuration of the pixel P is different from that in the first embodiment. The present embodiment is the same as the first embodiment except this point. Therefore, explanations of the same portions are omitted appropriately.

As shown in FIG. 21, the solid-state imaging device includes a silicon substrate 11, and a chalcopyrite photoelectric conversion film 13d and a pixel isolation portion PBd are disposed on one surface (upper surface) of the silicon substrate 11.

Although not shown in the drawing, a reading electrode, a gate MOS, and a reading circuit are disposed on the one surface (upper surface) of this silicon substrate 11, in contrast to the first embodiment. Each of these portions is disposed between the pixels P on the one surface of this silicon substrate 11 and is covered with a wiring layer (not shown in the drawing).

Then, incident light H is received by the chalcopyrite photoelectric conversion film 13d on the surface (frontside), on which each of the portions, e.g., the chalcopyrite photoelectric conversion film 13d is disposed, of the silicon substrate 11. Specifically, on-chip lenses (not shown in the drawing) are disposed in accordance with the pixels P on the upper surface (frontside) side of the silicon substrate 11, and the chalcopyrite photoelectric conversion films 13d receive the incident light condensed with the on-chip lenses. That is, the solid-state imaging device in the present embodiment is a "surface-illumination type CMOS image sensor". However, in the present embodiment, a color filter is not disposed.

Each portion will be described sequentially.
(A-1) Chalcopyrite Photoelectric Conversion Film 13d In the solid-state imaging device, as shown in FIG. 21, a plurality of chalcopyrite photoelectric conversion films 13d are disposed in such a way as to correspond to the plurality of pixels P.

As shown in FIG. 21, the chalcopyrite photoelectric conversion film 13d is disposed on one surface of the silicon substrate 11 which is, for example, a p-type silicon semiconductor. Here, on the silicon substrate 11, the chalcopyrite photoelectric conversion films 13d are disposed on the upper surfaces of n-type impurity regions 12d formed in accordance with the plurality of pixels P.

As shown in FIG. 21, a transparent electrode 14 is disposed on the upper surface of the chalcopyrite photoelectric conversion film 13d in such a way as to cover the chalcopyrite photoelectric conversion film 13d. The transparent electrode 14 is formed from a transparent, electrically conductive material, e.g., indium tin oxide (ITO), zinc oxide, or indium zinc oxide. The transparent electrode 14 is grounded and prevents charging due to hole accumulation.

As shown in FIG. 21, the pixel isolation portion PBd is disposed on the side surface of the chalcopyrite photoelectric conversion film 13d.

In a manner similar to that in the first embodiment, the chalcopyrite photoelectric conversion film 13d is a chalcopyrite-structure compound semiconductor and is formed in such a way as to lattice-match the silicon substrate 11 (Si (100) substrate). Here, the chalcopyrite photoelectric conversion film 13d is a chalcopyrite-structure compound semiconductor composed of a copper-aluminum-gallium-indium-sulfur-selenium based mixed crystal and is formed in such a way as to lattice-match the silicon substrate 11 which is a p-type silicon semiconductor.

In the present embodiment, in contrast to the first embodiment, the chalcopyrite photoelectric conversion film 13d disperses the incident light into the light of each of the colors of red, green, and blue in the depth direction z and photoelectrically converts. Here, as shown in FIG. 21, the chalcopyrite photoelectric conversion film 13d includes a first photoelectric conversion film 21R, a second photoelectric conversion film 22G, and a third photoelectric conversion film 23B, and each film is layered on the surface of the silicon substrate 11 sequentially. In the chalcopyrite photoelectric conversion film 13d, the first photoelectric conversion film 21R and the second photoelectric conversion film 22G are the i-type and the third photoelectric conversion film 23B is the p-type. That is, a p-i-n structure is formed as a whole.

As shown in FIG. 21, in the chalcopyrite photoelectric conversion film 13d, the first photoelectric conversion film 21R is disposed directly on the surface of the silicon substrate 11. This first photoelectric conversion film 21R is configured to selectively disperse and photoelectrically convert red light in the incident light incident from above. That is, the first photoelectric conversion film 21R is disposed in such a way as to receive, with high sensitivity, the light in the red wavelength band in the light passed through each of the portions, e.g., the transparent electrode 14, the third photoelectric conversion film 23B, and the second photoelectric conversion film 22G, and photoelectrically convert to generate a charge.

As shown in FIG. 21, in the chalcopyrite photoelectric conversion film 13d, the second photoelectric conversion film 22G is disposed on the surface of the silicon substrate 11 with the first photoelectric conversion film 21R therebetween. This second photoelectric conversion film 22G is configured to selectively disperse and photoelectrically convert green light in the incident light incident from above. That is, the second photoelectric conversion film 22G is disposed in such a way as to receive, with high sensitivity, the light in the green wavelength band in the light passed through each of the portions, e.g., the transparent electrode 14, and the third photoelectric conversion film 23B, and photoelectrically convert to generate a charge.

As shown in FIG. 21, in the chalcopyrite photoelectric conversion film 13d, the third photoelectric conversion film 23B is disposed on the surface of the silicon substrate 11 with the first photoelectric conversion film 21R and the second photoelectric conversion film 22G therebetween. This third photoelectric conversion film 23B is configured to selectively disperse and photoelectrically convert blue light in the incident light incident from above. That is, the third photoelectric conversion film 23B is disposed in such a way as to receive, with high sensitivity, the light in the blue wavelength band in the light passed through each of the portions, e.g., the transparent electrode 14, and photoelectrically convert to generate a charge.

Figure 22:
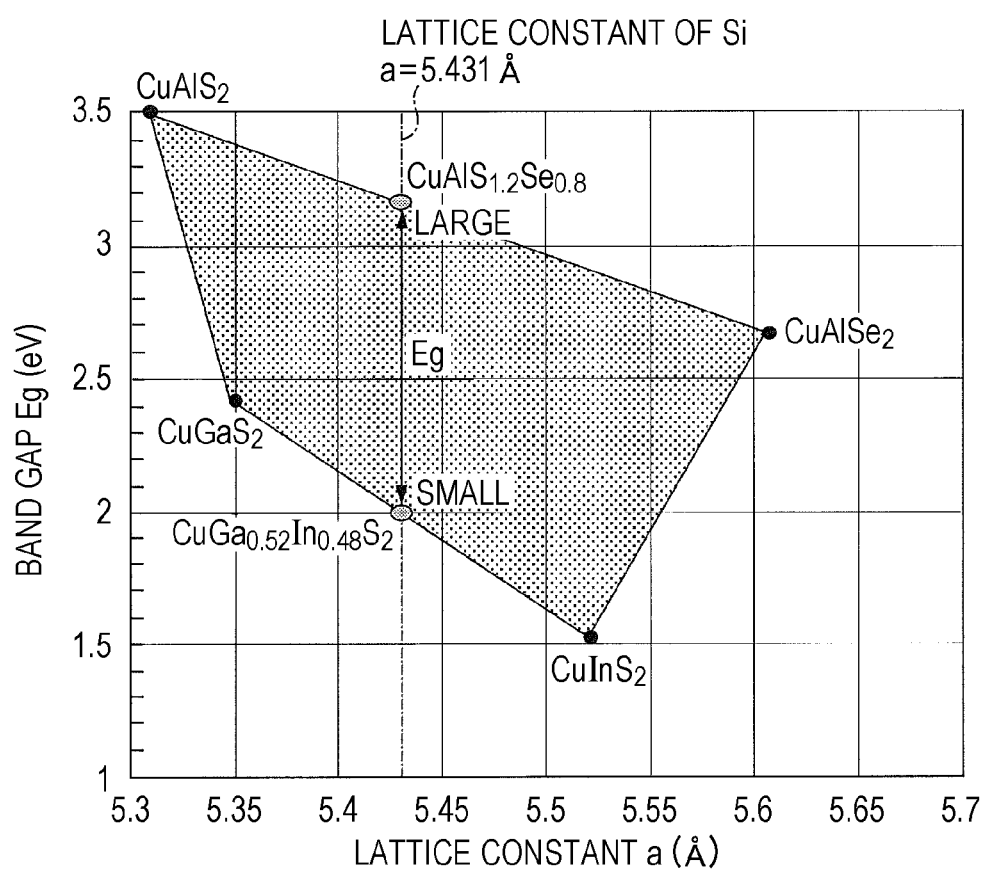
FIG. 22 is a diagram showing the relationship between the band gap and the lattice constant regarding chalcopyrite based materials.

FIG. 22 is a diagram showing the relationship between the band gap and the lattice constant regarding chalcopyrite based materials.

As indicated by alternate long and short dashed lines shown in FIG. 22, the band gap can be specified optionally by adjusting the composition of the chalcopyrite based material under the condition of the lattice constant a of 5.431 Å, which is the lattice constant of silicon (Si). Therefore, each of the first photoelectric conversion film 21R, the second photoelectric conversion film 22G, and the third photoelectric conversion film 23B is formed while the composition is adjusted in such a way that the first photoelectric conversion film 21R, the second photoelectric conversion film 22G, and the third photoelectric conversion film 23B selectively photoelectrically convert the red light, the green light, and the blue light, respectively.

Specifically, the first photoelectric conversion film 21R is formed in such a way that the band gap becomes within the range of 2.00 eV±0.1 eV (wavelength 590 nm to 650 nm). Therefore, as shown in FIG. 22, the first photoelectric conversion film 21R is formed in such a way that the following mathematical expressions are satisfied regarding the composition represented by $CuAl_xGa_yIn_zS_2$.

$0 \leq x \leq 0.12$ $0.38 \leq y \leq 0.52$ $0.48 \leq z \leq 0.50$ $x+y+z=1$

The second photoelectric conversion film 22G is formed in such a way that the band gap becomes within the range of 2.20 eV±0.15 eV (wavelength 530 nm to 605 nm). Therefore, as shown in FIG. 22, the second photoelectric conversion film 22G is formed in such a way that the following mathematical expressions are satisfied regarding the composition represented by $CuAl_xGa_yIn_zS_2$.

$0.06 \leq x \leq 0.41$ $0.01 \leq y \leq 0.45$ $0.49 \leq z \leq 0.58$ $x+y+z=1$ The third photoelectric conversion film 23B is formed in such a way that the band gap becomes within the range of 2.51 eV±0.2 eV (wavelength 460 nm to 535 nm). Therefore, as shown in FIG. 22, the third photoelectric conversion film 23B is formed in such a way that the following mathematical expressions are satisfied regarding the composition represented by $CuAl_xGa_yS_uSe_v$.

$0.31 \leq x \leq 0.52$ $0.48 \leq y \leq 0.69$ $1.33 \leq u \leq 1.38$ $0.62 \leq v \leq 0.67$ $x+y+u+v=3$ (or $x+y=1$ and $u+v=2$)

For example, each of the first photoelectric conversion film 21R, the second photoelectric conversion film 22G, and the third photoelectric conversion film 23B is formed in such a way as to have the following composition.

First photoelectric conversion film 21R: $CuGa_{0.52}In_{0.48}S_2$ film (band gap: 2.00 eV)

Second photoelectric conversion film 22G: $CuAl_{0.24}Ga_{0.23}In_{0.53}S_2$ film (band gap: 2.20 eV)

Third photoelectric conversion film 23B: $CuAl_{0.36}Ga_{0.64}S_{1.28}Se_{0.72}$ film (band gap: 2.51 eV)

In this regard, as shown in FIG. 22, the case of the Vegard's law (linear) is shown in the above description. However, in the case where bowing is present and deviation from the Vegard's law occurs, each of the photoelectric conversion films 21R, 22G, and 23B may be formed while the above-described composition is changed in such a way that a desired band gap is obtained.

Although not shown in FIG. 21, in the above-described chalcopyrite photoelectric conversion film 13d, a spike-shaped energy barrier is disposed at each interface portion to confine carriers. The band structure of the chalcopyrite photoelectric conversion film 13d will be described later in detail.

(A-2) Pixel Isolation Portion PBd

In the solid-state imaging device, in a manner similar to that in the first embodiment, the pixel isolation portion PBd is disposed while being interposed between the plurality of pixels P in such a way as to isolate the pixels P from each other.

As shown in FIG. 21, on one surface of the silicon substrate 11, the pixel isolation portion PBd is disposed on the side surface of the chalcopyrite photoelectric conversion film 13d disposed on a pixel P basis.

In the present embodiment, the pixel isolation portion PBd is formed from a semiconductor containing a p-type impurity. For example, the pixel isolation portion PBd is formed from a chalcopyrite based compound semiconductor composed of a copper-aluminum-gallium-indium-sulfur-selenium based mixed crystal containing a high-concentration p-type impurity.

(A-3) Others

In the above-described solid-state imaging device, in reading of each signal, for example, low voltage driving of avalanche multiplication is effected at the same time.

FIG. 23 to FIG. 26 are diagrams showing band structures of the solid-state imaging device according to the fourth embodiment of the present invention.

FIG. 23 to FIG. 26 show the band structures of the portion Z1d-Z2d indicated by alternate long and short dashed lines shown in FIG. 21. That is, the band structures of the chalcopyrite photoelectric conversion film 13d and the silicon substrate 11 in the depth direction z are shown.

Figure 23:
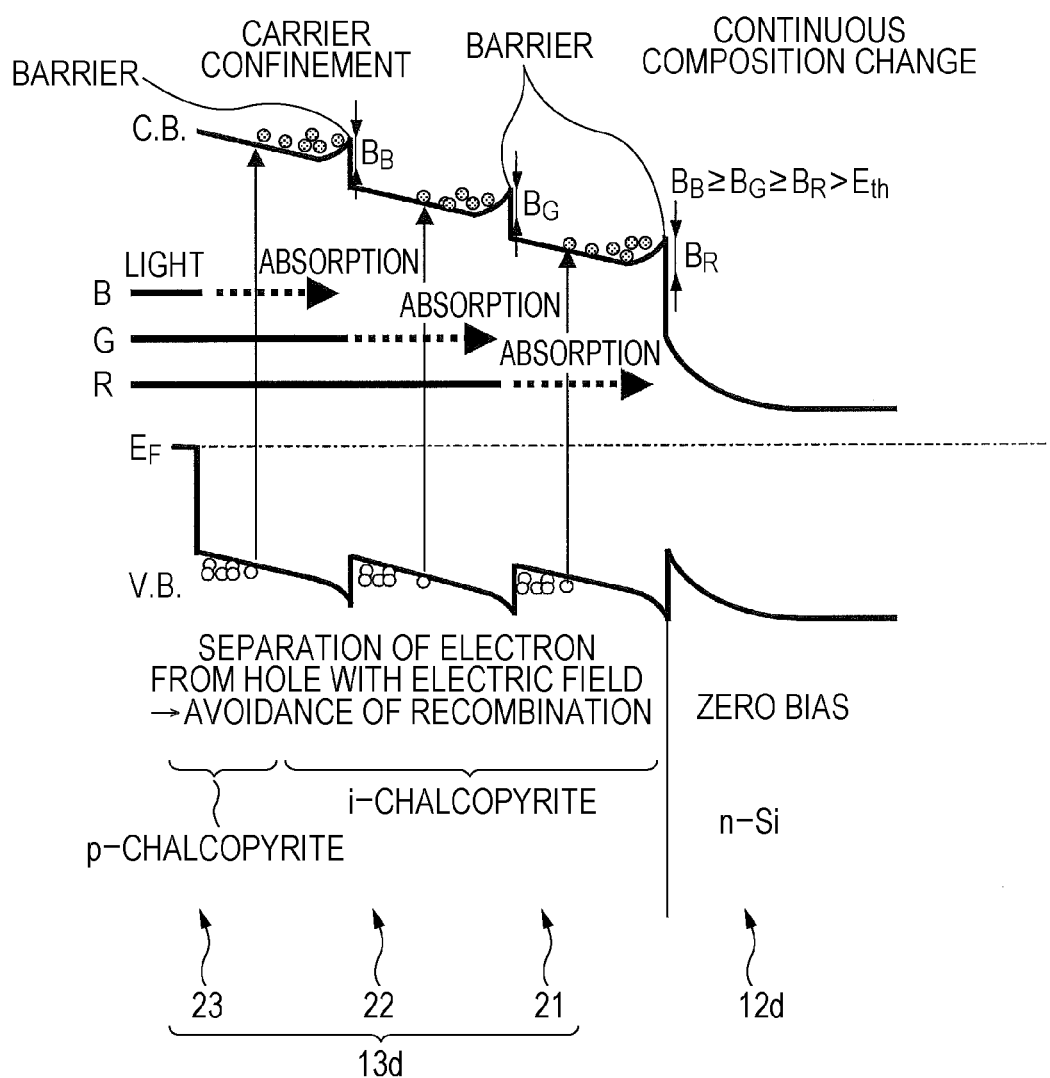
FIG. 23 is a diagram showing a band structure of the solid-state imaging device according to the fourth embodiment of the present invention.

Among these drawings, FIG. 23 shows the state before an operation, e.g., signal reading, is performed. That is, the state of zero bias is shown.

Figure 24:
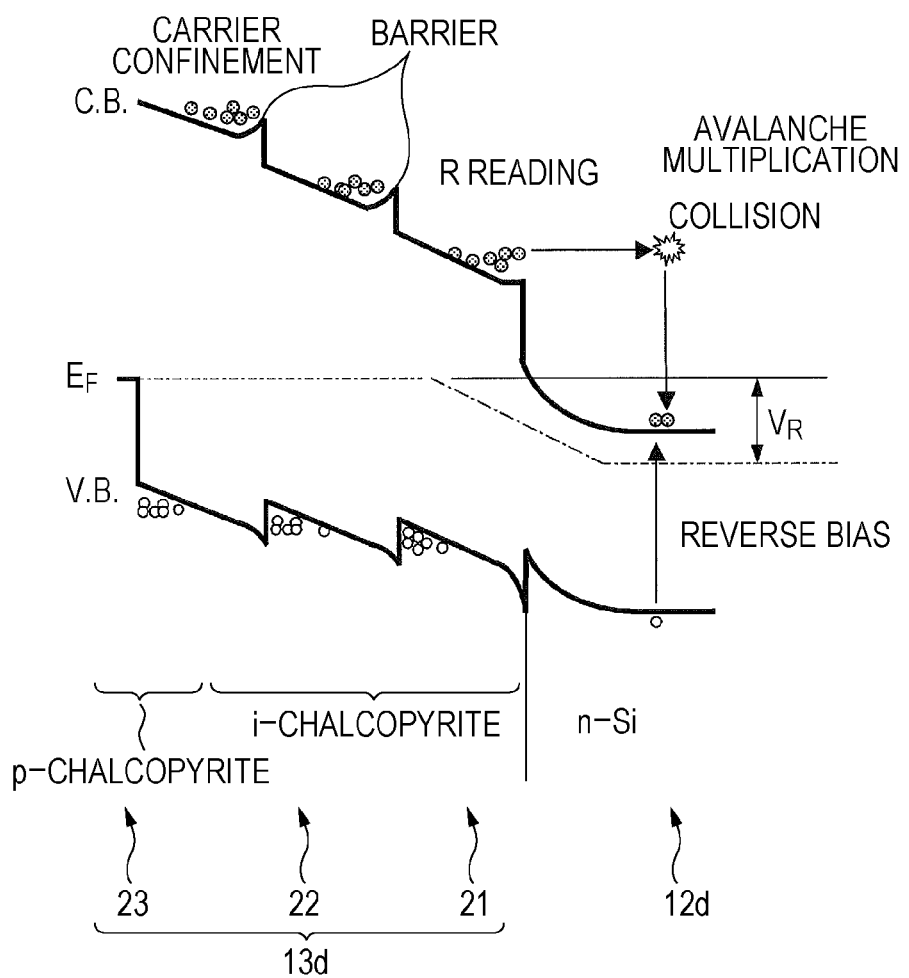
FIG. 24 is a diagram showing a band structure of the solid-state imaging device according to the fourth embodiment of the present invention.
Figure 25:
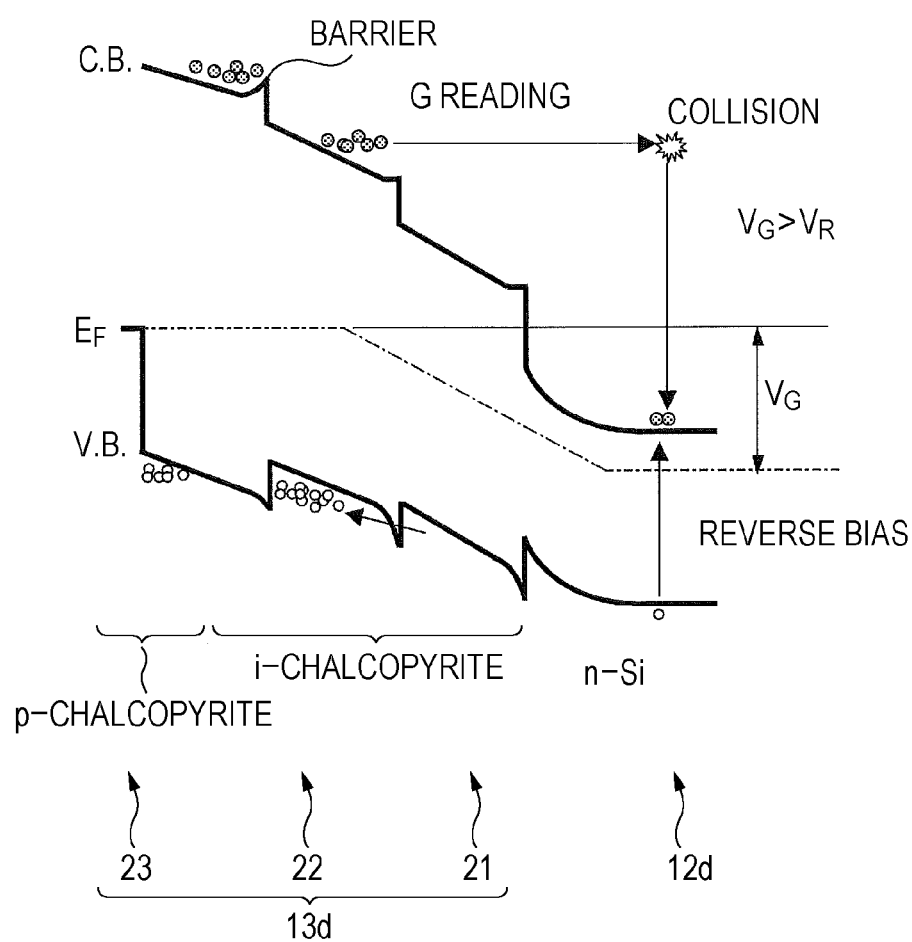
FIG. 25 is a diagram showing a band structure of the solid-state imaging device according to the fourth embodiment of the present invention.
Figure 26:
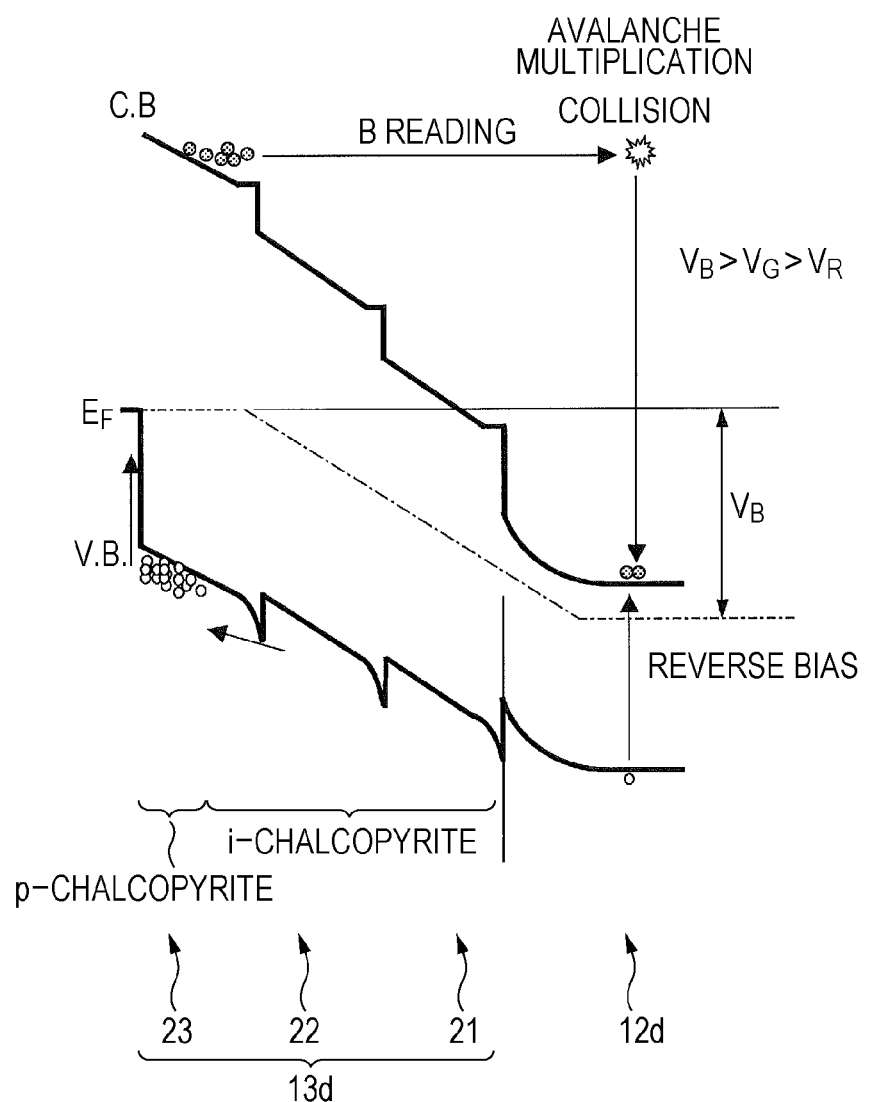
FIG. 26 is a diagram showing a band structure of the solid-state imaging device according to the fourth embodiment of the present invention.

Meanwhile, FIG. 24 to FIG. 26 show the state when an operation, e.g., signal reading, is performed. That is, the cases where predetermined reverse biases $V_R$, $V_G$, and $V_B$ are applied to the chalcopyrite photoelectric conversion film 13d are shown. Here, FIG. 24 shows the case where a red signal (R signal) obtained from the first photoelectric conversion film 21R is read. FIG. 25 shows the case where a green signal (G signal) obtained from the second photoelectric conversion film 22G is read. FIG. 26 shows the case where a blue signal (B signal) obtained from the third photoelectric conversion film 23B is read.

In the depth direction z, the chalcopyrite photoelectric conversion film 13d has the p-i-n structure as a whole, and as shown in FIG. 23, the band is inclined due to an internal electric field. Consequently, an electron-hole pair generated through incidence of light is spatially separated into an electron and a hole because of this inclination.

Furthermore, regarding the chalcopyrite photoelectric conversion film 13d, as shown in FIG. 23, a spike-shaped energy barrier is formed at each interface between the n-type impurity region 12d, the first photoelectric conversion film 21R, the second photoelectric conversion film 22G, and the third photoelectric conversion film 23B. Here, a spike-shaped energy barrier is formed on the wide gap side in the vicinity of each interface in such a way as to satisfy the following formula. That is, the spike-shaped energy barrier is formed in such a way as to become substantially higher than the thermal energy of room temperature.

In the following formula, $B_R$ represents energy of the barrier at the interface between the n-type impurity region 12$d$ and the first photoelectric conversion film 21R, $B_G$ represents energy of the barrier at the interface between the first photoelectric conversion film 21R and the second photoelectric conversion film 22G, $B_B$ represents energy of the barrier at the interface between the second photoelectric conversion film 22G and the third photoelectric conversion film 23B, k represents the Boltzmann constant, and kT represents a value corresponding to the thermal energy of room temperature.

$$B_B \geq B_G \geq B_R > kT (=26\ meV)$$

The band structure of the solid-state imaging device is formed as described above and, thereby, photoelectrons are confined in each of the first photoelectric conversion film 21R, the second photoelectric conversion film 22G, and the third photoelectric conversion film 23B. Consequently, signal charges corresponding to the individual colors can be accumulated (photoelectron accumulation).

In the case where the signal charge is accumulated in each of the first photoelectric conversion film 21R, the second photoelectric conversion film 22G, and the third photoelectric conversion film 23B, as described above, the signal charges are read as signals from the individual films sequentially.

Initially, as shown in FIG. 24, the signal charge is read as an R signal from the first photoelectric conversion film 21R.

Here, as shown in FIG. 24, the R signal is read by applying a reverse bias $V_R$. The G signal and the B signal are confined by spike-shaped barriers and are not read.

In the case where this signal is read, the charge is once accumulated in the n-type impurity region 12$d$, and the signal is read with the gate MOS (not shown in the drawing) and the reading circuit (not shown in the drawing).

As shown in FIG. 24, an energy difference of conduction band is disposed between the n-type impurity region 12$d$ and the first photoelectric conversion film 21R (i-CuGa$_{0.52}$In$_{0.48}$S$_2$ film). Consequently, even when a low voltage is applied, large kinetic energy due to collision is given to the lattice and, thereby, new electron-hole pairs are generated through ionization and avalanche multiplication occurs.

Then, as shown in FIG. 25, the signal charge is read as a G signal from the second photoelectric conversion film 22G.

Here, as shown in FIG. 25, the G signal is read by applying a reverse bias $V_G$. In this case, the reverse bias $V_G$ applied is higher than the reverse bias voltage applied when the signal charge is read as the R signal from the first photoelectric conversion film 21R.

In this case as well, as shown in FIG. 25, avalanche multiplication also occurs and the G signal is read in a manner similar to that in the case where the signal charge is read as the R signal from the first photoelectric conversion film 21R.

Next, as shown in FIG. 26, the signal charge is read as the B signal from the third photoelectric conversion film 23B.

Here, as shown in FIG. 26, the B signal is read by applying a reverse bias $V_B$. In this case, the reverse bias $V_B$ applied is higher than the reverse bias voltage applied when the signal charge is read as the R signal from the first photoelectric conversion film 21R and the reverse bias voltage applied when the signal charge is read as the G signal from the second photoelectric conversion film 22G.

In this case as well, as shown in FIG. 26, avalanche multiplication also occurs and the B signal is read.

Each of the R signal, the G signal, and the B signal can be read by applying the reverse bias voltages $V_R$, $V_G$, and $V_B$ sequentially, as described above (where $V_B > V_G > V_R$).

In the above-described reading method, the gate MOS is used for reading the signals, although not limited to this. The gate MOS is not formed and a reading electrode may be formed directly in the n-type impurity region 12$d$ so as to perform reading of the signals.

(B) Manufacturing Method

A key portion of a method for manufacturing the above-described solid-state imaging device will be described.

Initially, as shown in FIG. 21, a (100) silicon substrate is prepared as the silicon substrate 11. Thereafter, the n-type impurity region 12$d$ is formed in the resulting silicon substrate 11. In addition to this, the reading electrode, the reading circuit, and the like are formed on the silicon substrate 11.

Subsequently, as shown in FIG. 21, the first photoelectric conversion film 21R, the second photoelectric conversion film 22G, and the third photoelectric conversion film 23B are disposed on the silicon substrate 11 sequentially.

Here, the first photoelectric conversion film 21R is formed by, for example, the MBE method in which crystal growth of an i-CuGa$_{0.52}$In$_{0.48}$S$_2$ mixed crystal is effected on the silicon substrate 11.

In this case, formation of the first photoelectric conversion film 21R is performed in such a way that a barrier having the following energy $B_R$ is disposed at the interface between the first photoelectric conversion film 21R and the silicon substrate 11.

$$B_R > kT = 26\ meV$$

For example, initially, crystal growth is started with a composition of i-CuAl$_{0.06}$Ga$_{0.45}$In$_{0.49}$S$_2$. Thereafter, the crystal growth is effected while the compositions of Al and In are reduced gradually and the composition of Ga is increased gradually at the same time in such a way that the composition becomes i-CuGa$_{0.52}$In$_{0.48}$S$_2$.

For example, the first photoelectric conversion film 21R is formed in such a way that the thickness of the above-described barrier is 100 nm and the total thickness of the first photoelectric conversion film 21R becomes, for example, 0.8 μm. In this regard, in the above description, $B_R$ is 50 meV or less and is sufficiently higher than the thermal energy of room temperature.

Then, the second photoelectric conversion film 22G is formed on the upper surface of the first photoelectric conversion film 21R.

The second photoelectric conversion film 22G is formed by, for example, the MBE method in which crystal growth of an i-CuAl$_{0.24}$Ga$_{0.23}$In$_{0.53}$S$_2$ mixed crystal is effected on the silicon substrate 11.

In this case, formation of the second photoelectric conversion film 22G is performed in such a way that a barrier having the following energy $B_G$ is disposed at the interface to the first photoelectric conversion film 21R.

$$B_G > B_R > kT = 26\ meV$$

For example, initially, crystal growth is started with a composition of i-CuAl$_{0.33}$Ga$_{0.23}$In$_{0.53}$S$_2$. Thereafter, the crystal growth is effected while the compositions of Al and In are reduced gradually and the composition of Ga is increased gradually at the same time in such a way that the composition becomes i-CuAl$_{0.24}$Ga$_{0.23}$In$_{0.53}$S$_2$.

For example, the second photoelectric conversion film 22G is formed in such a way that the thickness of the above-described barrier is 100 nm and the total thickness of the second photoelectric conversion film 22G becomes, for example, 0.7 μm. In this regard, in the above description, $B_G$ is 84 meV or less and is sufficiently higher than the thermal energy of room temperature.

Then, the third photoelectric conversion film 23B is formed on the upper surface of the second photoelectric conversion film 22G.

The third photoelectric conversion film 23B is formed by, for example, the MBE method in which crystal growth of a p-CuAl$_{0.36}$Ga$_{0.64}$S$_{1.28}$Se$_{0.72}$ mixed crystal is effected on the silicon substrate 11.

In this case, formation of the third photoelectric conversion film 23B is performed in such a way that a barrier having the following energy $B_B$ is disposed at the interface to the second photoelectric conversion film 22G.

$$B_B > B_G > B_R > kT = 26 \text{ meV}$$

For example, initially, crystal growth is started with a composition of p-CuAl$_{0.42}$Ga$_{0.58}$S$_{1.36}$Se$_{0.64}$. Thereafter, the crystal growth is effected while the compositions of Al and S are reduced gradually and the composition of Ga is increased gradually at the same time in such a way that the composition becomes p-CuAl$_{0.36}$Ga$_{0.64}$S$_{1.28}$Se$_{0.72}$.

For example, the third photoelectric conversion film 23B is formed in such a way that the thickness of the above-described barrier is 100 nm and the total thickness of the third photoelectric conversion film 23B becomes, for example, 0.3 μl. In this regard, in the above description, $B_B$ is 100 meV or less and is sufficiently higher than the thermal energy of room temperature.

In the above description, a silicon oxide film (not shown in the drawing) is formed on the surface of the silicon substrate 11 before the above-described crystal growth is effected. Thereafter, the silicon oxide film (not shown in the drawing) is patterned in such a way that the portion, on which the chalcopyrite photoelectric conversion film 13 is formed, is exposed at the surface of the silicon substrate 11.

Subsequently, as described above, crystals of the above-described compound semiconductors are selectively grown on the portion, on which the chalcopyrite photoelectric conversion film 13d is formed, so that the first photoelectric conversion film 21R and the like are formed sequentially.

Then, the pixel isolation portion PBd is formed.

Here, the pixel isolation portion PBd is formed in a manner similar to that in the second embodiment.

For example, a compound semiconductor is laterally grown under the condition in which much p-type impurities are contained while a silicon oxide film (not shown in the drawing) is formed in such a way as to partition between the chalcopyrite photoelectric conversion films 13d. In this manner, the compound semiconductor is filled between the chalcopyrite photoelectric conversion films 13d so as to form the pixel isolation portion PBd.

Next, the transparent electrode 14 is disposed on the upper surface of the chalcopyrite photoelectric conversion film 13d.

Here, an ITO film (not shown in the drawing) is formed on the chalcopyrite photoelectric conversion film 13d by, for example, forming a film of transparent, electrically conductive material, e.g., indium tin oxide (ITO), by a sputtering evaporation method. Thereafter, the resulting ITO film is patterned so as to dispose the transparent electrode 14.

Then, each portion of the on-chip lens and the like is disposed on the upper surface (frontside) side of the silicon substrate 11 appropriately. In this manner, the surface-illumination type CMOS image sensor is completed.

(C) Overview

As described above, in the present embodiment, as in the first embodiment, the chalcopyrite photoelectric conversion film 13d is a chalcopyrite-structure compound semiconductor and is formed on the silicon substrate 11 in such a way as to lattice-match the silicon substrate 11. Consequently, regarding the present embodiment, the crystallinity of the chalcopyrite photoelectric conversion film 13d becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PBd is formed from a compound semiconductor doped in such a way as to become a potential barrier between the chalcopyrite photoelectric conversion films 13d formed in accordance with the plurality of pixels P (refer to FIG. 21). Consequently, in the present embodiment, an occurrence of color mixing can be prevented by the pixel isolation portion PBd.

In addition, in the present embodiment, the chalcopyrite photoelectric conversion film 13d includes the first photoelectric conversion film 21R, the second photoelectric conversion film 22G, and the third photoelectric conversion film 23B. The first photoelectric conversion film 21R is disposed on the silicon substrate 11 and is formed in such a way as to selectively photoelectrically convert the red component light in the light incident from above. The second photoelectric conversion film 22G is disposed on the silicon substrate 11 with the first photoelectric conversion film 21R therebetween and is formed in such a way as to selectively photoelectrically convert the green component light in the light incident from above. The third photoelectric conversion film 23B is disposed on the silicon substrate 11 with the first photoelectric conversion film 21R and the second photoelectric conversion film 22G therebetween and is formed in such a way as to selectively photoelectrically convert the blue component light in the light incident from above (refer to FIG. 21). Furthermore, regarding the interface portion between the first photoelectric conversion film 21R and the second photoelectric conversion film 22G and the interface portion between the second photoelectric conversion film 22G and the third photoelectric conversion film 23B, the band structures are formed in such a way that the band structures become wide gaps as compared with portions other than the interface portions concerned (refer to FIG. 23). Then, the reverse bias voltage $V_R$ is applied to the first photoelectric conversion film 21R and, thereby, the signal charge is read as a red signal from the first photoelectric conversion film 21R. The reverse bias voltage $V_G$ is applied to the second photoelectric conversion film 22G and, thereby, the signal charge is read as a green signal from the second photoelectric conversion film 22G. The reverse bias voltage $V_B$ is applied to the third photoelectric conversion film 23B and, thereby, the signal charge is read as a blue signal from the third photoelectric conversion film 23B. In this case, the individual reverse bias voltages are applied to their respective portions sequentially in the order of $V_R$, $V_G$, and $V_B$ in such a way that the relationship of $V_B > V_G > V_R$ is satisfied. Consequently, in the present embodiment, a signal of each light of three primary colors of red, green, and blue can be obtained in the depth direction z. In this case, the voltage of avalanche multiplication can be reduced. Moreover, the light-receiving area can be increased by such a reading method and, thereby, the sensitivity can be improved and cost reduction can be realized because of simplification of the production process.

Figure 27:
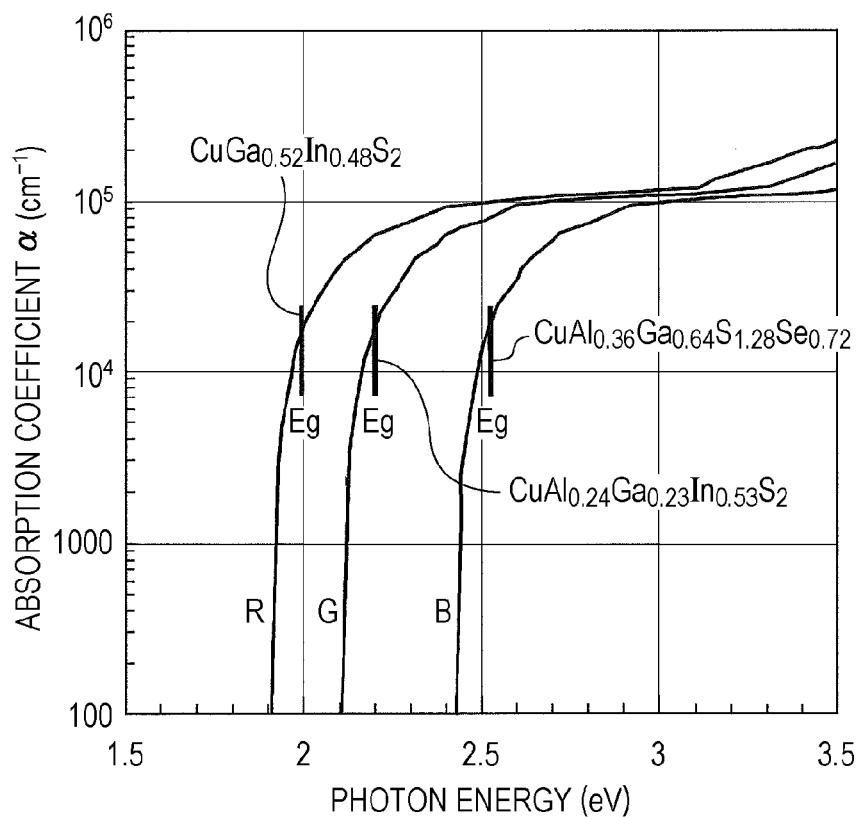
FIG. 27 is a diagram showing the wavelength dependence of the absorption coefficient $\alpha$ predicted from the band gap regarding each composition constituting a chalcopyrite photoelectric conversion film according to the fourth embodiment of the present invention.

FIG. 27 is a diagram showing the wavelength dependence of the absorption coefficient α predicted from the band gap regarding each composition constituting the chalcopyrite photoelectric conversion film 13d according to the fourth embodiment of the present invention.

As shown in FIG. 27, regarding each composition constituting the chalcopyrite photoelectric conversion film 13d, the absorption coefficient α is sharply reduced at photon energy in the side of energy lower than the band gap.

Figure 28:
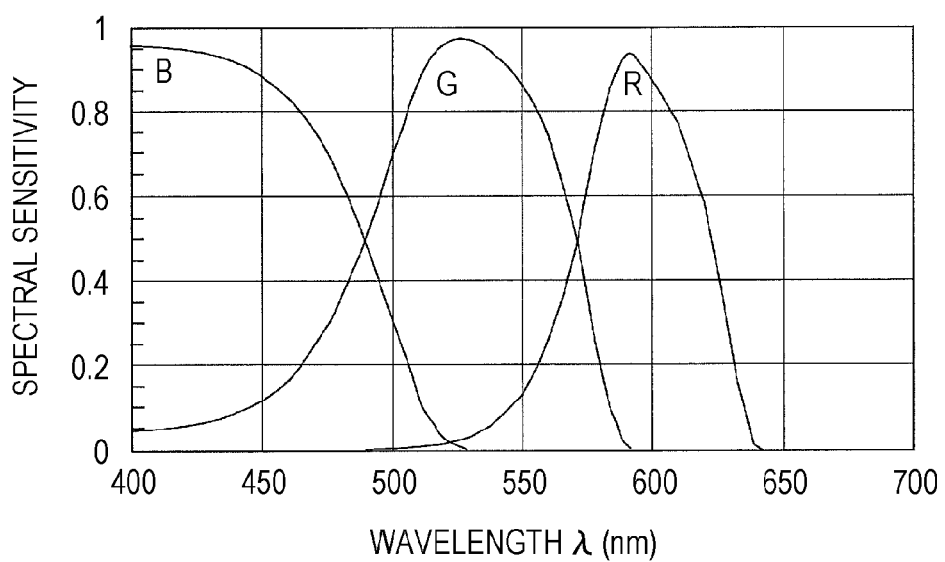
FIG. 28 is a diagram showing a spectral sensitivity characteristic of the solid-state imaging device according to the fourth embodiment of the present invention.
Figure 29:
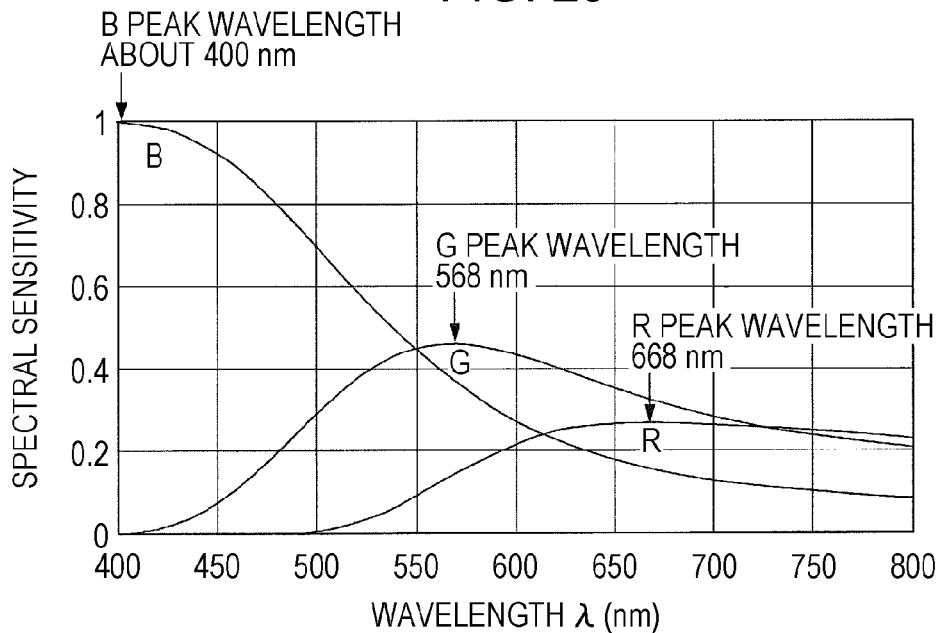
FIG. 29 is a diagram showing a spectral sensitivity characteristic of the solid-state imaging device according to the fourth embodiment of the present invention.

FIG. 28 and FIG. 29 are diagrams showing spectral sensitivity characteristics of the solid-state imaging device according to the fourth embodiment of the present invention.

FIG. 28 shows the case where the first photoelectric conversion film 21R, the second photoelectric conversion film 22G, and the third photoelectric conversion film 23B are formed as described below.

First photoelectric conversion film 21R: $CuGa_{0.52}In_{0.48}S_2$ film (thickness 0.8 μm)

Second photoelectric conversion film 22G: $CuAl_{0.24}Ga_{0.23}In_{0.53}S_2$ film (thickness 0.7 μm)

Third photoelectric conversion film 23B: $CuAl_{0.36}Ga_{0.64}S_{1.28}Se_{0.72}$ film (thickness 0.3 μm)

Meanwhile, FIG. 29 shows the case where the first photoelectric conversion film 21R, the second photoelectric conversion film 22G, and the third photoelectric conversion film 23B are formed while being changed as described below.

First photoelectric conversion film 21R: Si film (thickness 2.6 μm)

Second photoelectric conversion film 22G: Si film (thickness 1.7 μm)

Third photoelectric conversion film 23B: Si film (thickness 0.6 μl)

As is clear from comparisons between FIG. 28 and FIG. 29, in the case where each of the photoelectric conversion films 21R, 22G, and 23B is formed from the chalcopyrite based compound semiconductor as in the present embodiment, separation of each color is favorable and an occurrence of color mixing can be suppressed as compared with that in the case where each film is formed from silicon as described above.

Consequently, in the present embodiment, color separation is favorable even when the color filter is not used. The incident light is not cut by the color filter and, therefore, the light can be used with a high degree of efficiency, and the sensitivity can be improved.

Furthermore, signals of three colors of RGB are obtained in the depth direction of one pixel P and, therefore, demosaic processing is unnecessary, a false color does not occur in theory, and higher resolution can be realized easily. Moreover, it is unnecessary to dispose a low-pass filter and, therefore, cost reduction can be realized.

In the present embodiment, as in the first embodiment, the case where the pixel isolation portion PBd is formed by ion-implanting the impurity into the above-described compound semiconductor layer is shown, although not limited to this.

In a manner similar to that in the second embodiment, a crystal of the chalcopyrite photoelectric conversion film 13d may be selectively grown on a part of the surface of the silicon substrate 11 and, thereafter, the pixel isolation portion PBd may be formed through lateral growth in such a way as to fill between the plurality of chalcopyrite photoelectric conversion films 13d.

Furthermore, in a manner similar to that in the third embodiment, the potential barrier may be formed between the pixels by using a compound semiconductor having a large band gap so as to form the pixel isolation portion PBd.

(D) Modified Examples (D-1) Modified Example 4-1

In the above explanation, the chalcopyrite photoelectric conversion film 13d is formed from the chalcopyrite-structure compound semiconductor composed of a copper-aluminum-gallium-indium-sulfur-selenium based mixed crystal, although not limited to this.

The chalcopyrite photoelectric conversion film can also be formed from a chalcopyrite-structure compound semiconductor composed of a mixed crystal of CuGaInSSe system in such a way as to lattice-match the silicon substrate.

Figure 30:
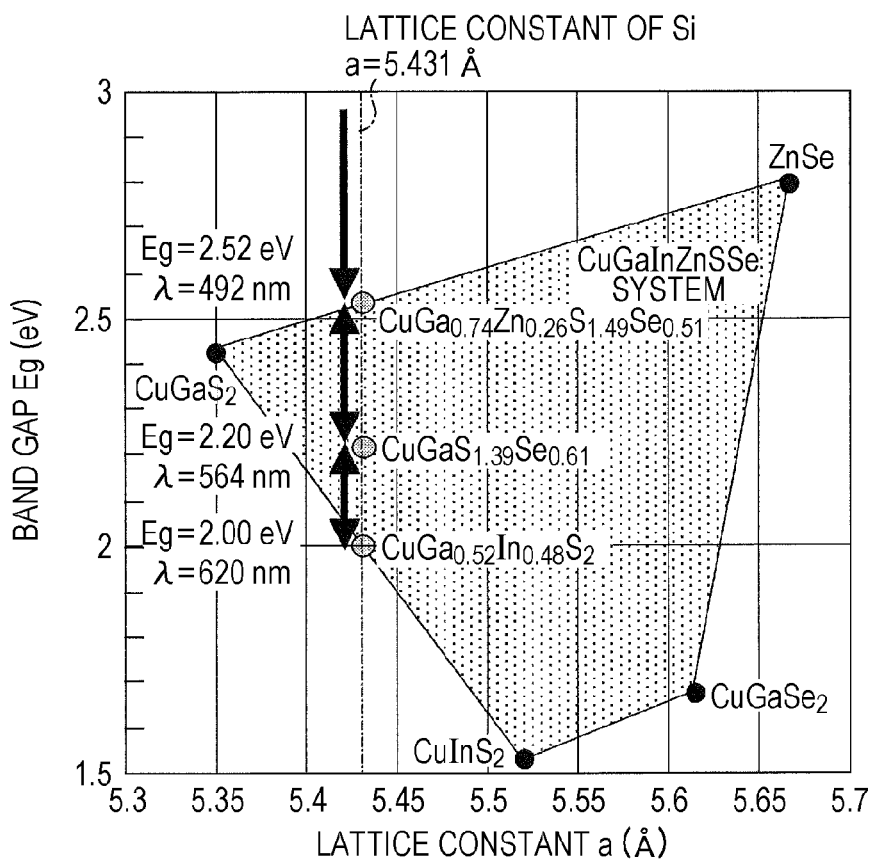
FIG. 30 is a diagram showing the relationship between the band gap and the lattice constant regarding chalcopyrite based materials composed of a mixed crystal of CuGaIn-ZnSSe system.

FIG. 30 is a diagram showing the relationship between the band gap and the lattice constant regarding chalcopyrite based materials composed of a mixed crystal of CuGaInZnSSe system.

As indicated by alternate long and short dashed lines shown in FIG. 30, the band gap can be specified optionally by adjusting the composition of the chalcopyrite based material under the condition of the lattice constant a of 5.431 Å, which is the lattice constant of silicon (Si). Therefore, in the case of a mixed crystal of CuGaInZnSSe system as well, each of the first photoelectric conversion film 21R, the second photoelectric conversion film 22G, and the third photoelectric conversion film 23B can be formed in such a way as to selectively photoelectrically convert the red light, the green light, and the blue light, respectively.

Specifically, the first photoelectric conversion film 21R is formed in such a way that the band gap becomes within the range of 2.00 eV±0.1 eV (wavelength 590 nm to 650 nm). Therefore, as shown in FIG. 30, the first photoelectric conversion film 21R is formed in such a way that the following mathematical expressions are satisfied regarding the composition represented by $CuGa_yIn_zS_uSe_v$.

$$0.52 \leq y \leq 0.76$$

$$0.24 \leq z \leq 0.48$$

$$1.70 \leq u \leq 2.00$$

$$0 \leq v \leq 0.30$$

$$y+z+u+v=3 \text{ or } y+z=1 \text{ and } u+v=2$$

The second photoelectric conversion film 22G is formed in such a way that the band gap becomes within the range of 2.20 eV±0.15 eV (wavelength 530 nm to 605 nm). Therefore, as shown in FIG. 30, the second photoelectric conversion film 22G is formed in such a way that the following mathematical expressions are satisfied regarding the composition represented by $CuGa_yIn_zZn_wS_uSe_v$.

$$0.64 \leq y \leq 0.88$$

$$0 \leq z \leq 0.36$$

$$0 \leq w \leq 0.12$$

$$0.15 \leq u \leq 1.44$$

$$0.56 \leq v \leq 1.85$$

$$y+z+w+u+v=3 \text{ or } y+z+w=1 \text{ and } u+v=2$$

The third photoelectric conversion film 23B is formed in such a way that the band gap becomes within the range of 2.51 eV±0.2 eV (wavelength 460 nm to 535 nm). Therefore, as shown in FIG. 30, the third photoelectric conversion film 23B is formed in such a way that the following mathematical expressions are satisfied regarding the composition represented by $CuGa_yZn_wS_uSe_v$.

$$0.74 \leq y \leq 0.91$$

$$0.09 \leq w \leq 0.26$$

$$1.42 \leq u \leq 1.49$$

$$0.51 \leq v \leq 0.58$$

$$y+w+u+v=3$$

For example, each of the first photoelectric conversion film 21R, the second photoelectric conversion film 22G, and the third photoelectric conversion film 23B is formed in such a way as to have the following composition.

First photoelectric conversion film 21R: $CuGa_{0.52}In_{0.48}S_2$ film

Second photoelectric conversion film 22G: $CuGaIn_{1.39}Se_{0.6}$ film

Third photoelectric conversion film 23B: $CuGa_{0.74}Zn_{0.26}S_{1.49}Se_{0.51}$ film In this regard, a part of the above-described compositions of CuAlGaInSSe system may be replaced by these compositions, or all the compositions may be replaced.

(D-2) Modified Example 4-2

Application of Superlattice

Regarding the above-described crystal growth in formation of the chalcopyrite photoelectric conversion film 13d, the growth of solid solution is difficult in some cases. Therefore, the chalcopyrite photoelectric conversion film 13d may be formed by growing a pseudo-mixed crystal on the basis of superlattice.

For example, as for the first photoelectric conversion film 21R to disperse red light, i-$CuInS_2$ films and i-$CuGaS_2$ films are layered alternately in such a way that the composition ratio of the whole composition becomes i-$CuGa_{0.52}In_{0.48}S_2$. Here, film formation of each of the i-$CuInS_2$ film and the i-$CuGaS_2$ film is performed in such a way that the film thickness of each of the i-$CuInS_2$ film and the i-$CuGaS_2$ film becomes within the critical film thickness hc. In this regard, the critical film thickness is specified by "Matthews and Blakeslee's expression" (refer to J. W. Matthews and A. E. Blakeslee, J. Cryst. Growth 27 (1974) 118-125) or "People and Bean's expression" (refer to R. People and J. C. Bean, Appl. Phys. Lett. 47 (1985) 322-324).

In the above description, for example, an X-ray diffraction method is used and the i-$CuInS_2$ films and the i-$CuGaS_2$ films are layered so as to determine the growth condition to lattice-match the silicon (100) substrate in advance. Thereafter, layering is performed in such a way that the total composition becomes a desired composition.

If film formation of each layer of the superlattice is performed while the critical film thickness hc is exceeded, defects of misfit dislocation occur and the crystallinity is impaired. However, in the present embodiment, an occurrence of such an inconvenience can be prevented because the film thickness is specified to be within the critical film thickness hc.

(D-3) Modified Example 4-3

In the above description, the structure to disperse in the depth direction z and the structure to effect the avalanche multiplication at the same time are explained. However, the avalanche multiplication may be effected without dispersion in the depth direction.

Figure 31:
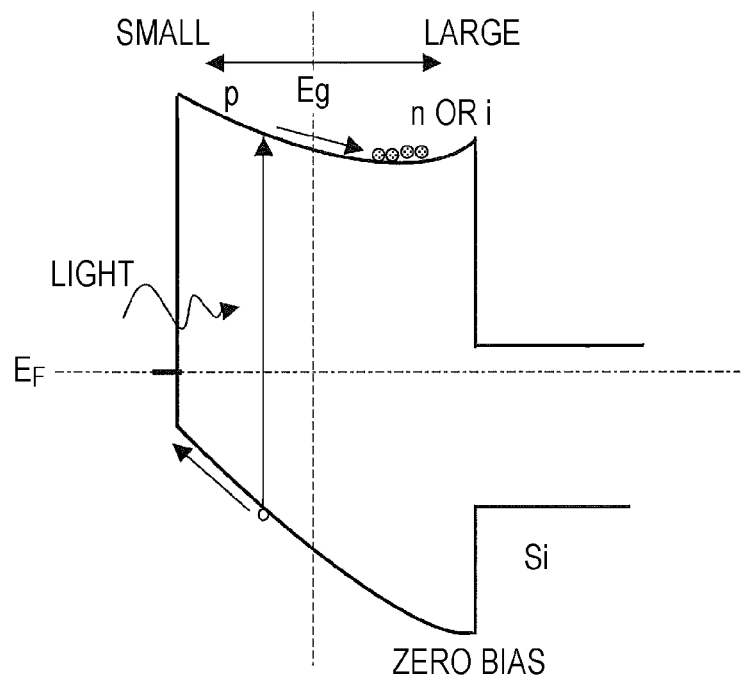
FIG. 31 is a diagram showing a band structure of a solid-state imaging device according to a modified example of the fourth embodiment of the present invention.
Figure 32:
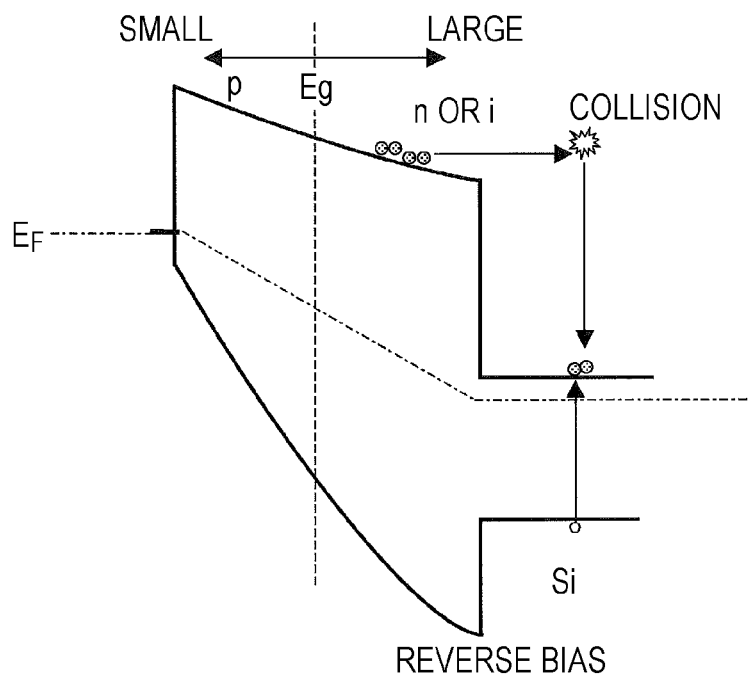
FIG. 32 is a diagram showing a band structure of a solid-state imaging device according to a modified example of the fourth embodiment of the present invention.

FIG. 31 and FIG. 32 are diagrams showing band structures of the solid-state imaging device according to modified examples of the fourth embodiment of the present invention.

Here, FIG. 31 shows the state before an operation, e.g., signal reading, is performed as in FIG. 23. That is, the state of zero bias is shown.

Meanwhile, FIG. 32 shows the state when an operation of signal reading is performed as in FIG. 24 and the like. That is, the case where a predetermined reverse bias is applied is shown.

As shown in FIG. 31 and FIG. 32, a large energy difference is obtained by changing the band gap continuously or step-wise.

In this case, the energy difference of the conduction band becomes still larger as compared with the cases shown in FIG. 23 to FIG. 26. Consequently, a larger degree of avalanche multiplication is effected at a low drive voltage.

In this case, color separation may be performed by disposing a color filter on the surface side.

5. Fifth Embodiment

Surface-Illumination Type 2

(A) Apparatus Configuration and the Like

Figure 33:
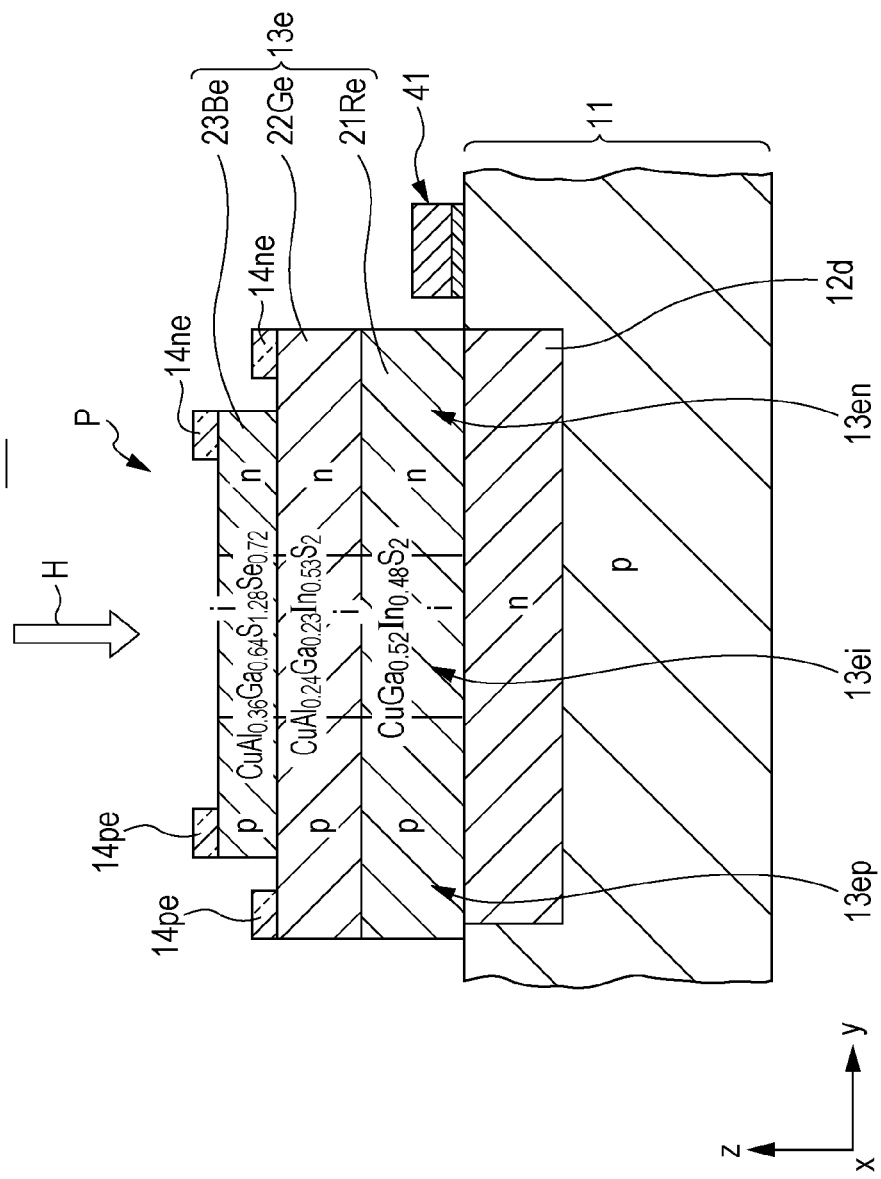
FIG. 33 is a diagram showing a key portion of a solid-state imaging device according to a fifth embodiment of the present invention.

FIG. 33 is a diagram showing a key portion of a solid-state imaging device according to a fifth embodiment of the present invention.

Here, FIG. 33 shows a cross section of a pixel P, as in FIG. 21. FIG. 33 shows a key portion of one pixel P in contrast to FIG. 21.

As shown in FIG. 33, in the present embodiment, the configuration of the pixel P is different from that in the fourth embodiment. The present embodiment is the same as the fourth embodiment except this point. Therefore, explanations of the same portions are omitted appropriately.

As shown in FIG. 33, the solid-state imaging device includes the silicon substrate 11, and a chalcopyrite photoelectric conversion film 13e is disposed on one surface (upper surface) of the silicon substrate 11.

As shown in FIG. 33, a gate MOS 41 is disposed on the one surface (upper surface) of this silicon substrate 11. Although not shown in the drawing, each of portions, e.g., the pixel isolation portion, the reading electrode, and the reading circuit, is disposed on the one surface (upper surface) of this silicon substrate 11, as in the fourth embodiment.

That is, the solid-state imaging device in the present embodiment is a "surface-illumination type CMOS image sensor".

Each portion will be described sequentially.

(A-1) Chalcopyrite Photoelectric Conversion Film 13e

In the solid-state imaging device, as shown in FIG. 33, a plurality of chalcopyrite photoelectric conversion films 13e are disposed in such a way as to correspond to the plurality of pixels P.

As shown in FIG. 33, the chalcopyrite photoelectric conversion film 13e is disposed on one surface of the silicon substrate 11 which is, for example, a p-type silicon semiconductor. Here, on the silicon substrate 11, the chalcopyrite photoelectric conversion film 13*e* is disposed on the upper surface of the n-type impurity region 12*d* formed in accordance with the plurality of pixels P.

In a manner similar to that in the fourth embodiment, the chalcopyrite photoelectric conversion film 13*e* is a chalcopyrite-structure compound semiconductor and is formed in such a way as to lattice-match the silicon substrate 11 (Si (100) substrate). Here, the chalcopyrite photoelectric conversion film 13*e* is a chalcopyrite-structure compound semiconductor composed of a copper-aluminum-gallium-indium-sulfur-selenium based mixed crystal and is formed in such a way as to lattice-match the silicon substrate 11 which is a p-type silicon semiconductor.

The chalcopyrite photoelectric conversion film 13*e* is configured to disperse the incident light into the light of each of the colors of red, green, and blue in the depth direction z and photoelectrically convert, in a manner similar to that in the fourth embodiment. Here, as shown in FIG. 33, the chalcopyrite photoelectric conversion film 13*e* includes a first photoelectric conversion film 21Re, a second photoelectric conversion film 22Ge, and a third photoelectric conversion film 23Be, and each film is layered on the surface of the silicon substrate 11 sequentially.

As shown in FIG. 33, in the chalcopyrite photoelectric conversion film 13*e*, the first photoelectric conversion film 21Re is disposed directly on the surface of the silicon substrate 11. This first photoelectric conversion film 21Re is configured to selectively disperse and photoelectrically convert red light in the incident light incident from above. In the present embodiment, the first photoelectric conversion film 21Re is disposed in such a way as to have the same composition as that in the fourth embodiment.

As shown in FIG. 33, in the chalcopyrite photoelectric conversion film 13*e*, the second photoelectric conversion film 22Ge is disposed on the surface of the silicon substrate 11 with the first photoelectric conversion film 21Re therebetween. This second photoelectric conversion film 22Ge is configured to selectively disperse and photoelectrically convert green light in the incident light incident from above. In the present embodiment, the second photoelectric conversion film 22Ge is disposed in such a way as to have the same composition as that in the fourth embodiment.

As shown in FIG. 33, in the chalcopyrite photoelectric conversion film 13*e*, the third photoelectric conversion film 23Be is disposed on the surface of the silicon substrate 11 with the first photoelectric conversion film 21Re and the second photoelectric conversion film 22Ge therebetween. This third photoelectric conversion film 23Be is configured to selectively disperse and photoelectrically convert blue light in the incident light incident from above. In the present embodiment, the third photoelectric conversion film 23Be is disposed in such a way as to have the same composition as that in the fourth embodiment.

However, in the present embodiment, in contrast to the fourth embodiment, the first to the third photoelectric conversion films 21Re, 22Ge, and 23Be are configured in such a way that a p-layer 13*ep*, an i-layer 13*ei*, and an n-layer 13*en* are aligned in a surface direction (here, y direction) of the silicon substrate 11, as shown in FIG. 33. Here, the i-layer 13*ei* is disposed in a center portion, and the p-layer 13*ep* and the n-layer 13*en* are disposed in such a way as to sandwich the i-layer 13*ei* in the surface direction of the silicon substrate 11. That is, the chalcopyrite photoelectric conversion film 13*e* is configured to have a p-i-n structure as a whole.

As shown in FIG. 33, p-type electrodes 14*pe* and n-type electrodes 14*ne* are disposed on the upper surfaces of the second photoelectric conversion film 22Ge and the third photoelectric conversion film 23Be in the chalcopyrite photoelectric conversion film 13*e*.

As shown in FIG. 33, the p-type electrode 14*pe* is disposed on the p-layer 13*ep* of each of the second photoelectric conversion film 22Ge and the third photoelectric conversion film 23Be. The n-type electrode 14*ne* is disposed on the n-layer 13*en* of each of the second photoelectric conversion film 22Ge and the third photoelectric conversion film 23Be.

(A-2) Others

Although not shown in the drawing, in the solid-state imaging device, the pixel isolation portion is disposed in such a way as to be interposed between the plurality of pixels and isolate the pixels P from each other, as in the fourth embodiment.

Here, on one surface of the silicon substrate 11, the pixel isolation portion (not shown in the drawing) is disposed on the side surface of the chalcopyrite photoelectric conversion film 13*e* disposed on a pixel P basis, as in the fourth embodiment.

In the present embodiment, the pixel isolation portion (not shown in the drawing) is disposed between the pixels P in such a way that a potential barrier is formed on a portion other than the portions provided with the reading electrode (not shown in the drawing), the gate MOS (not shown in the drawing), and the reading circuit (not shown in the drawing).

The pixel isolation portion (not shown in the drawing) is formed from, for example, a compound semiconductor ion-implanted with an impurity, as in the above-described first embodiment. Furthermore, the pixel isolation portion (not shown in the drawing) may be formed from a compound semiconductor having a composition with a large band gap. Moreover, spaces are interposed in the portions provided with the reading electrode (not shown in the drawing), the gate MOS (not shown in the drawing), and the reading circuit (not shown in the drawing).

Figure 34:
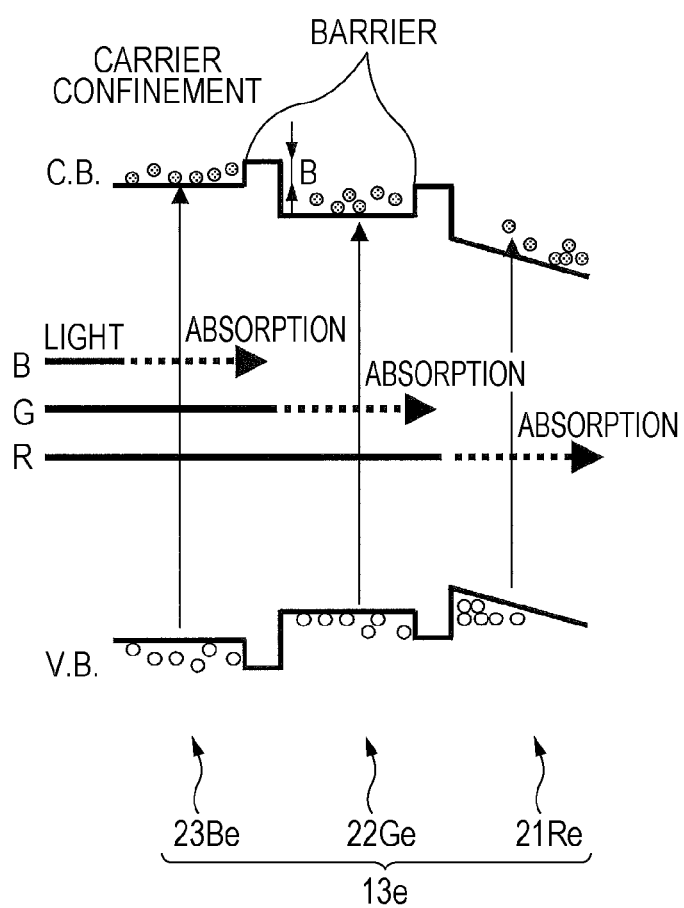
FIG. 34 is a diagram showing a band structure of the solid-state imaging device according to the fifth embodiment of the present invention.

FIG. 34 is a diagram showing a band structure of the solid-state imaging device according to the fifth embodiment of the present invention.

Regarding the chalcopyrite photoelectric conversion film 13*e*, as shown in FIG. 34, an energy barrier is formed at each interface between the first photoelectric conversion film 21Re, the second photoelectric conversion film 22Ge, and the third photoelectric conversion film 23Be. Here, each barrier is formed on the wide gap side in the vicinity of each interface in such a way as to satisfy the following formula. That is, each barrier is formed in such a way that the energy B of each barrier becomes substantially higher than the thermal energy of room temperature.

$$B > kT (=26 \text{ meV})$$

The band structure of the solid-state imaging device is formed as described above and, thereby, photoelectrons are confined in each of the first photoelectric conversion film 21Re, the second photoelectric conversion film 22Ge, and the third photoelectric conversion film 23Be. Consequently, signal charges corresponding to the individual colors can be accumulated.

After the signal charge is accumulated in each of the first photoelectric conversion film 21Re, the second photoelectric conversion film 22Ge, and the third photoelectric conversion film 23Be, the signal charge is read as a signal from each film sequentially by applying a voltage to each film.

For example, the signal of red light is read by using the gate MOS 41 and the like after electrons are moved from the first photoelectric conversion film 21Re to the n-type impurity region 12*d*.

Although not shown in the drawing, the signal of green light and the signal of blue light are read by using the gate MOS and the like after the p-type electrode 14*pe* is connected to the ground, and electrons read from the n-type electrode 14*ne* are temporarily accumulated in an accumulation layer disposed in the Si substrate 11.

(B) Manufacturing Method

A key portion of a method for manufacturing the above-described solid-state imaging device will be described.

Initially, as shown in FIG. 33, a (100) silicon substrate is prepared as the silicon substrate 11. Thereafter, the n-type impurity region 12*d* is formed on the resulting silicon substrate 11. In addition to this, the reading electrode, the reading circuit, and the like are formed on the silicon substrate 11.

Subsequently, as shown in FIG. 33, the first photoelectric conversion film 21Re, the second photoelectric conversion film 22Ge, and the third photoelectric conversion film 23Be are disposed on the silicon substrate 11 sequentially.

Here, the first photoelectric conversion film 21Re is formed by, for example, the MBE method in which crystal growth of an i-$CuGa_{0.52}In_{0.48}S_2$ mixed crystal is effected on the silicon substrate 11. For example, the first photoelectric conversion film 21Re is formed in such a way that the thickness becomes, for example, 0.8 μm.

Then, the second photoelectric conversion film 22Ge is formed on the upper surface of the first photoelectric conversion film 21Re.

The second photoelectric conversion film 22Ge is formed by, for example, the MBE method in which crystal growth of an i-$CuAl_{0.24}Ga_{0.23}In_{0.53}S_2$ mixed crystal is effected on the silicon substrate 11.

In this case, formation of the second photoelectric conversion film 22Ge is performed in such a way that a barrier having the above-described energy B is disposed at the interface to the first photoelectric conversion film 21Re.

For example, initially, crystal growth is started with a composition of i-$CuAl_{0.33}Ga_{0.11}In_{0.56}S_2$. Thereafter, the crystal growth is effected while the compositions of Al and In are reduced gradually and the composition of Ga is increased gradually at the same time in such a way that the composition becomes i-$CuAl_{0.24}Ga_{0.23}In_{0.53}S_2$.

For example, the second photoelectric conversion film 22Ge is formed in such a way that the thickness of the above-described barrier is 50 nm and the total thickness of the second photoelectric conversion film 22Ge becomes, for example, 0.7 μm.

Then, the third photoelectric conversion film 23Be is formed on the upper surface of the second photoelectric conversion film 22Ge.

The third photoelectric conversion film 23Be is formed by, for example, the MBE method in which crystal growth of an i-$CuAl_{0.36}Ga_{0.64}S_{1.28}Se_{0.72}$ mixed crystal is effected on the silicon substrate 11.

In this case, formation of the third photoelectric conversion film 23Be is performed in such a way that a barrier having the above-described energy B is disposed at the interface to the second photoelectric conversion film 22Ge.

For example, initially, crystal growth is started with a composition of i-$CuAl_{0.42}Ga_{0.58}S_{1.36}Se_{0.64}$. Thereafter, the crystal growth is effected while the compositions of Al and S are reduced gradually and the composition of Ga is increased gradually at the same time in such a way that the composition becomes i-$CuAl_{0.36}Ga_{0.64}S_{1.28}Se_{0.72}$.

For example, the third photoelectric conversion film 23Be is formed in such a way that the thickness of the above-described barrier is 50 nm and the total thickness of the third photoelectric conversion film 23Be becomes, for example, 0.3 μm.

Subsequently, as shown in FIG. 33, the p-layer 13*ep* and the n-layer 13*en* are formed.

Here, regarding the first photoelectric conversion film 21Re, the second photoelectric conversion film 22Ge, and the third photoelectric conversion film 23Be, the p-layers 13*ep* are formed by selectively ion-implanting the p-type impurity into the portions in which the p-layers 13*ep* are formed. For example, the p-layers 13*ep* are formed by ion-implanting gallium (Ga) as a p-type dopant.

Furthermore, regarding the first photoelectric conversion film 21Re, the second photoelectric conversion film 22Ge, and the third photoelectric conversion film 23Be, the n-layers 13*en* are formed by selectively ion-implanting the n-type impurity into the portions in which the n-layers 13*en* are formed. For example, the n-layers 13*en* are formed by ion-implanting zinc (Zn) as an n-type dopant.

Then, annealing is performed after ion implantation to activate the dopant, so that the p-i-n structure chalcopyrite photoelectric conversion film 13*e* is formed.

Subsequently, each portion of the pixel isolation portion and the like is disposed in a manner similar to that in the above-described fourth embodiment, so that the surface-illumination type CMOS image sensor is completed.

(C) Overview

As described above, in the present embodiment in which the configuration of the pixel P is different from that in the fourth embodiment, the chalcopyrite photoelectric conversion film 13*e* is formed on the silicon substrate 11 in such a way as to lattice-match the silicon substrate 11, as in the fourth embodiment. Consequently, regarding the present embodiment, the crystallinity of the chalcopyrite photoelectric conversion film 13*e* becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In addition, in the present embodiment, the chalcopyrite photoelectric conversion film 13*e* includes the first photoelectric conversion film 21R, the second photoelectric conversion film 22G, and the third photoelectric conversion film 23B which are layered on the silicon substrate 11 sequentially, as in the fourth embodiment. Consequently, in the present embodiment, a signal of each light of three primary colors of red, green, and blue can be obtained in the depth direction z.

However, in the present embodiment, in contrast to the fourth embodiment, regarding the first photoelectric conversion film 21Re, the second photoelectric conversion film 22Ge, and the third photoelectric conversion film 23Be, the p-layer 13*ep*, the i-layer 13*ei*, and the n-layer 13*en* are arranged side by side in a surface (xy plane) direction of the silicon substrate 11.

Consequently, signals can be read almost at the same time and, thereby, excellence in imaging of a moving subject is exhibited as compared with that in the fourth embodiment. Furthermore, excellent saturation sensitivity characteristics are exhibited because an accumulation layer can be disposed separately.

In the above description, the chalcopyrite photoelectric conversion film 13*e* is configured to have the p-i-n structure as a whole, although not limited to this. The same operation effects can also be exerted in the case where a pn structure is formed.

In the above description, the p-type electrode 14pe is disposed, although not limited to this. In the case where the p concentration of the p-layer 13ep is high, holes flow to the substrate side naturally. That is, the effective potential barrier at each interface is reduced, and holes can surmount the interface of each p-layer and reach the substrate side. In this case, the p-type electrodes 14pe is unnecessary.

(D) Modified Example 5-1

Figure 35:
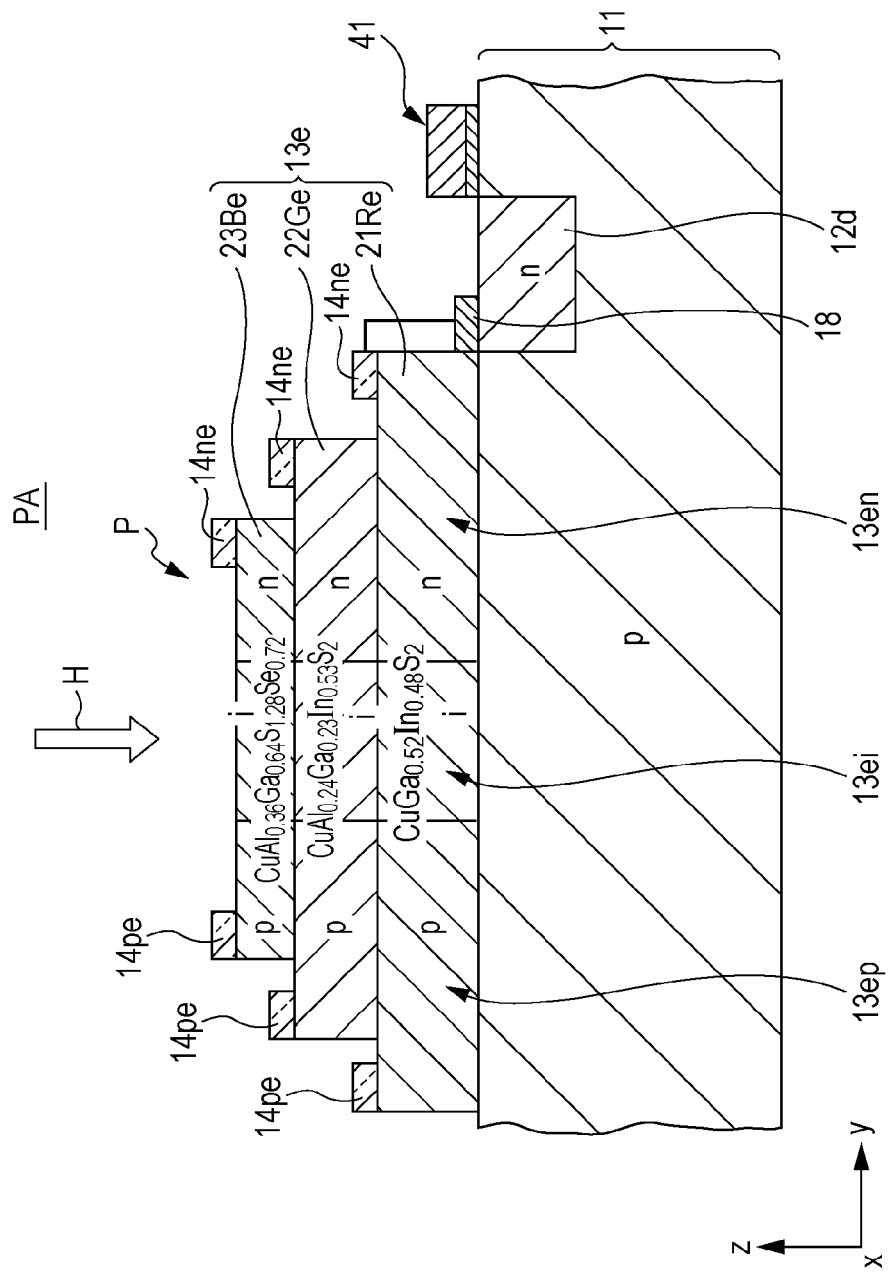
FIG. 35 is a diagram showing a key portion of a solid-state imaging device according to Modified example 5-1 of the fifth embodiment of the present invention.

FIG. 35 is a diagram showing a key portion of a solid-state imaging device according to Modified example 5-1 of the fifth embodiment of the present invention.

Here, FIG. 35 shows a cross section of a pixel P, as in FIG. 33.

As shown in FIG. 35, in the present modified example, the configuration of the pixel P is different from that in the above-described fifth embodiment. The present modified example is the same as the fifth embodiment except this point. Therefore, explanations of the same portions are omitted appropriately.

As shown in FIG. 35, on the surface of the silicon substrate 11, in the solid-state imaging device, an n-type impurity region 12d is disposed in the side portion of the portion provided with the chalcopyrite photoelectric conversion film 13e. That is, on the surface of the silicon substrate 11, the chalcopyrite photoelectric conversion film 13e is disposed on a surface of a portion on which the n-type impurity region 12d is not disposed.

The chalcopyrite photoelectric conversion film 13e includes the first photoelectric conversion film 21Re, the second photoelectric conversion film 22Ge, and the third photoelectric conversion film 23Be, and each film is layered on the surface of the silicon substrate 11 sequentially, in a manner similar to that in the fifth embodiment.

However, in the present modified example, in contrast to the above-described embodiment, the p-type electrode 14pe and the n-type electrode 14ne are disposed on the upper surface of the first photoelectric conversion film 21Re, as in the second photoelectric conversion film 22Ge and the third photoelectric conversion film 23Be.

As shown in FIG. 35, the p-type electrode 14pe is disposed on the p-layer 13ep of the first photoelectric conversion film 21Re, as in the second photoelectric conversion film 22Ge and the third photoelectric conversion film 23Be. The n-type electrode 14ne is disposed on the p-layer 13en of the first photoelectric conversion film 21Re as in the second photoelectric conversion film 22Ge and the third photoelectric conversion film 23Be.

Then, as shown in FIG. 35, a wiring 18 is disposed on the upper surface of the n-type impurity region 12d, and the wiring 18 is electrically connected to the n-type electrode 14ne disposed on the n-layer 13en of the first photoelectric conversion film 21Re.

Figure 36:
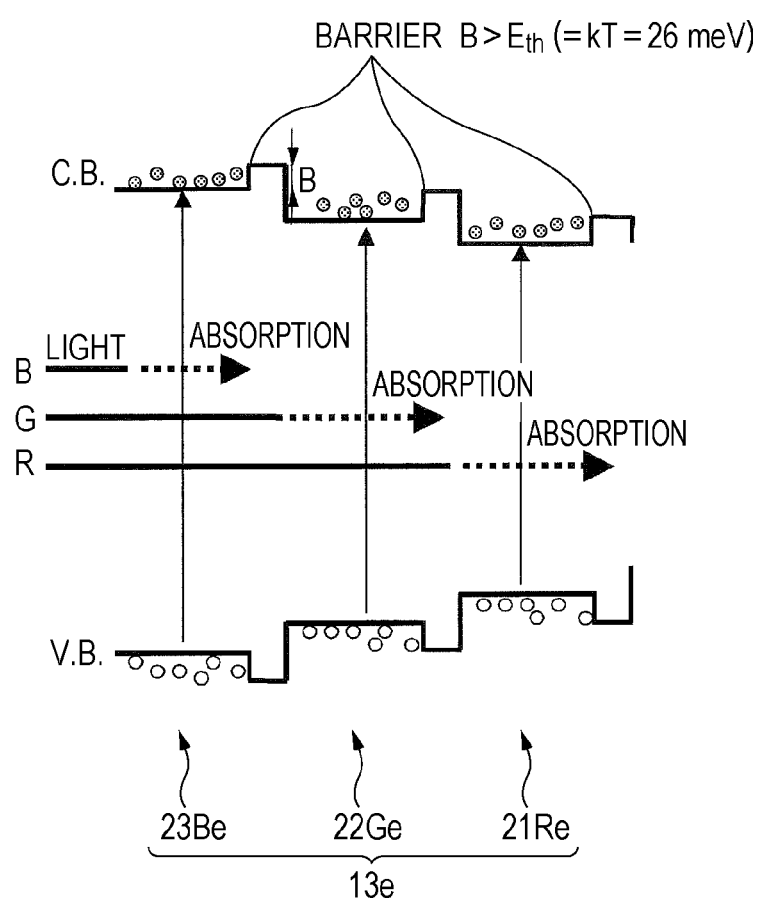
FIG. 36 is a diagram showing a band structure of a solid-state imaging device according to a modified example of the fifth embodiment of the present invention.

FIG. 36 is a diagram showing a band structure of the solid-state imaging device according to the modified example of the fifth embodiment of the present invention.

Regarding the chalcopyrite photoelectric conversion film 13e, as shown in FIG. 36, an energy barrier is formed at each interface between the silicon substrate 11, the first photoelectric conversion film 21Re, the second photoelectric conversion film 22Ge, and the third photoelectric conversion film 23Be. Here, each barrier is formed in the wide gap side in the vicinity of each interface in such a way that the energy B of each barrier becomes substantially higher than the thermal energy of room temperature.

Consequently, in the present modified example as well, photoelectrons are confined in each of the first photoelectric conversion film 21Re, the second photoelectric conversion film 22Ge, and the third photoelectric conversion film 23Be. Therefore, signal charges corresponding to the individual colors can be accumulated.

After the signal charge is accumulated in each of the first photoelectric conversion film 21Re, the second photoelectric conversion film 22Ge, and the third photoelectric conversion film 23Be, the signal charge is read as a signal from each film by applying a voltage to each film.

Although not shown in the drawing, each signal is read by using the gate MOS and the like after the p-type electrode 14pe is connected to the ground side, and electrons read from the n-type electrode 14ne are temporarily accumulated in an accumulation layer disposed in the Silicon substrate 11 side.

Besides the above description, since the n-type electrode 14ne is disposed on the first photoelectric conversion film 21Re, electrons accumulated in the first photoelectric conversion film 21Re may be read directly from the n-type electrode 14ne.

All the red (R) signal, the green (G) signal, and the blue (B) may be temporarily separately accumulated in the silicon substrate 11 and be read with the gate MOS 41.

Here, the p-type electrode 14pe is to take out holes and charge up can be avoided by direct connection to the ground. Furthermore, holes can be relieved to the silicon substrate 11 side by increasing the p-type concentration. In this case, the p-type electrode 14pe is not typically necessary.

In the above-described case, avalanche multiplication does not typically occur with low voltage drive because there is no energy difference except reading of the red (R) signal. However, there is an advantage that reading of signals is not performed sequentially, as described above, but the signal of each color can be read at the same time.

6. Sixth Embodiment

Surface-Illumination Type 3

(A) Apparatus Configuration and the Like

Figure 37:
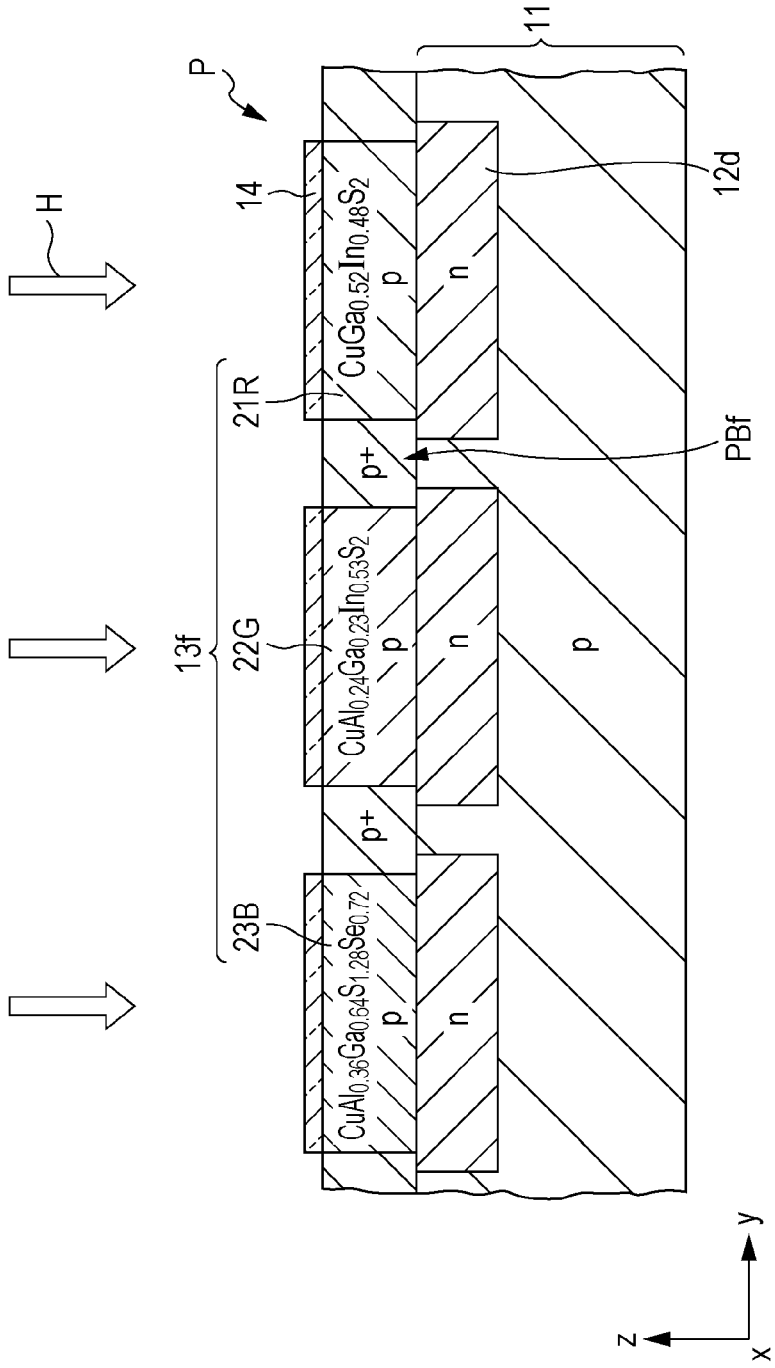
FIG. 37 is a diagram showing a key portion of a solid-state imaging device according to a sixth embodiment of the present invention.

FIG. 37 is a diagram showing a key portion of a solid-state imaging device according to a sixth embodiment of the present invention.

Here, FIG. 37 shows a cross section of a pixel P, as in FIG. 21.

As shown in FIG. 37, in the present embodiment, the configuration of the pixel P is different from that in the fourth embodiment. The present embodiment is the same as the fourth embodiment except this point. Therefore, explanations of the same portions are omitted appropriately.

As shown in FIG. 37, the solid-state imaging device includes the silicon substrate 11, and a chalcopyrite photoelectric conversion film 13f and a pixel isolation portion PBf are disposed on one surface (upper surface) of the silicon substrate 11.

Although not shown in the drawing, the reading electrode, the gate MOS, and the reading circuit are disposed on the one surface (upper surface) of this silicon substrate 11, as in the fourth embodiment. Each of these portions is disposed between the pixels P on the one surface of this silicon substrate 11 and is covered with a wiring layer (not shown in the drawing).

Then, incident light H is received by the chalcopyrite photoelectric conversion film 13f on the surface (frontside), on which each portions, e.g., the chalcopyrite photoelectric conversion film 13f is disposed, of the silicon substrate 11. That is, the solid-state imaging device in the present embodiment is a "surface-illumination type CMOS image sensor".

Each portion will be described sequentially.

(A-1) Chalcopyrite Photoelectric Conversion Film 13f

In the solid-state imaging device, as shown in FIG. 37, the chalcopyrite photoelectric conversion film 13f is disposed on the one surface of silicon substrate 11 which is, for example, a p-type silicon semiconductor.

In the present embodiment, in contrast to the fourth embodiment, the chalcopyrite photoelectric conversion film 13f is not configured to disperse the incident light into the light of each of the colors of red, green, and blue in the depth direction z and photoelectrically convert.

Here, as shown in FIG. 37, the chalcopyrite photoelectric conversion film 13f includes the first photoelectric conversion film 21R, the second photoelectric conversion film 22G, and the third photoelectric conversion film 23B, and each film is arranged side by side on the surface (xy plane) of the silicon substrate 11.

Each of the first photoelectric conversion film 21R, the second photoelectric conversion film 22G, and the third photoelectric conversion film 23B is the p-type and is disposed on the upper surface of the n-type impurity region 12d formed in such a way as to correspond to a plurality of pixels P, on the silicon substrate 11. That is, a pn structure is formed.

The first photoelectric conversion film 21R is configured to selectively disperse and photoelectrically convert red light in the incident light incident from above. The second photoelectric conversion film 22G is configured to selectively disperse and photoelectrically convert green light in the incident light incident from above. The third photoelectric conversion film 23B is configured to selectively disperse and photoelectrically convert blue light in the incident light incident from above.

For example, as in the fourth embodiment, each of the first photoelectric conversion film 21R, the second photoelectric conversion film 22G, and the third photoelectric conversion film 23B is formed from a CuAlGaInSSe based mixed crystal lattice-matched with the silicon substrate 11 (Si(100) substrate). Specifically, each film is formed in such a way as to have the following composition.

First photoelectric conversion film 21R: $CuGa_{0.52}In_{0.48}S_2$ film

Second photoelectric conversion film 22G: $CuAl_{0.24}Ga_{0.23}In_{0.53}S_2$ film Third photoelectric conversion film 23B: $CuAl_{0.36}Ga_{0.64}S_{1.28}Se_{0.72}$ film Furthermore, each of the first photoelectric conversion film 21R, the second photoelectric conversion film 22G, and the third photoelectric conversion film 23B is formed in such a way as to have the following thickness.

First photoelectric conversion film 21R: 0.8 μm

Second photoelectric conversion film 22G: 0.7 μm

Third photoelectric conversion film 23B: 0.7 μm

Then, as shown in FIG. 37, a transparent electrode 14 is disposed in such a way as to cover the upper surface of each of the first photoelectric conversion film 21R, the second photoelectric conversion film 22G, and the third photoelectric conversion film 23B constituting the chalcopyrite photoelectric conversion film 13f.

Each of the first photoelectric conversion film 21R, the second photoelectric conversion film 22G, and the third photoelectric conversion film 23B is disposed on a pixel P basis in such a way as to correspond to the Bayer pattern. In this regard, each of the first photoelectric conversion film 21R, the second photoelectric conversion film 22G, and the third photoelectric conversion film 23B may be disposed in such a way as to correspond to various color arrays not limited to the Bayer pattern.

(A-2) Pixel Isolation Portion PBf

In the solid-state imaging device, in a manner similar to that in the fourth embodiment, the pixel isolation portion PBf is disposed while being interposed between the plurality of pixels P in such a way as to isolate the pixels P from each other.

As shown in FIG. 37, the pixel isolation portion PBf is disposed on the side surface of each of the first photoelectric conversion film 21R, the second photoelectric conversion film 22G, and the third photoelectric conversion film 23B.

Here, as shown in FIG. 37, on one surface of the silicon substrate 11, the pixel isolation portion PBf is disposed on the side surface of each of the first photoelectric conversion film 21R, the second photoelectric conversion film 22G, and the third photoelectric conversion film 23B formed on a pixel P basis.

In the present embodiment, in a manner similar to that in the fourth embodiment, the pixel isolation portion PBf is formed from a semiconductor containing a p-type impurity. The pixel isolation portion PBf is formed from, for example, a chalcopyrite based compound semiconductor composed of a copper-aluminum-gallium-indium-sulfur-selenium based mixed crystal containing a high-concentration p-type impurity.

(A-3) Others

In the above-described solid-state imaging device, photoelectrons move to the silicon substrate 11 (silicon) side naturally due to a difference in energy without applying a reverse bias voltage to each of the first photoelectric conversion film 21R, the second photoelectric conversion film 22G, and the third photoelectric conversion film 23B. Therefore, the photoelectrons are read as signals by using the gate MOS (not shown in the drawing) and the like. For example, signals are read from each of the first photoelectric conversion film 21R, the second photoelectric conversion film 22G, and the third photoelectric conversion film 23B at the same time.

Figure 38:
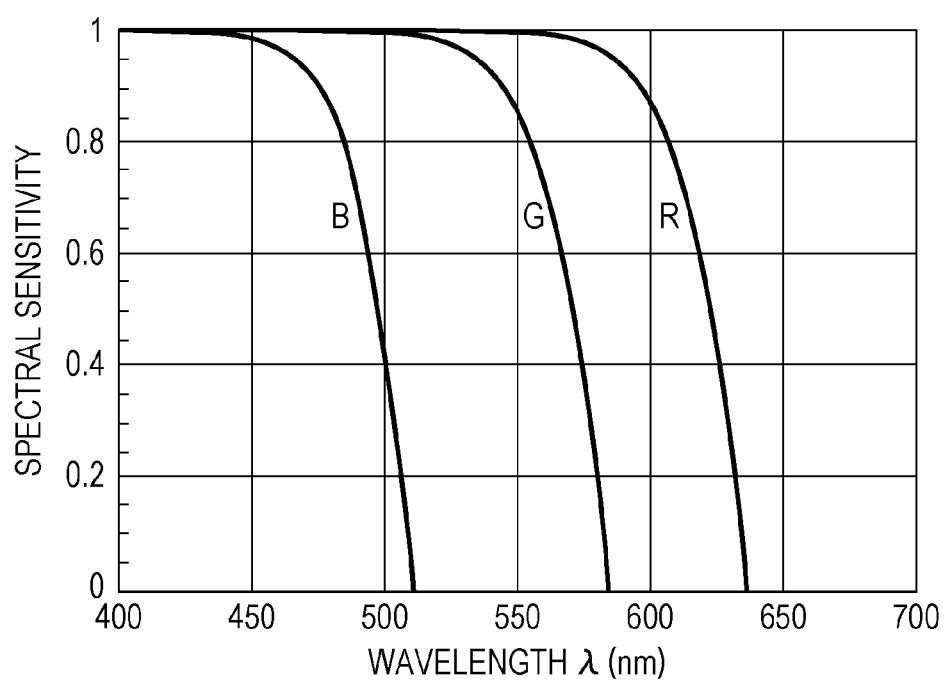
FIG. 38 is a diagram showing a spectral sensitivity characteristic of the solid-state imaging device according to the sixth embodiment of the present invention.

FIG. 38 is a diagram showing a spectral sensitivity characteristic of the solid-state imaging device according to the sixth embodiment of the present invention. In FIG. 38, the spectral sensitivity characteristic with respect to the red light is indicated by "R", the green light is indicated by "G", and the blue light is indicated by "B".

As shown in FIG. 38, the short wavelength side is not cut. Consequently, for example, after demosaic processing, color arithmetic processing represented by the following formulae is performed.

$$R = r - g, \; G = g - b, \; B = b$$

In the above description, r represents a value of RAW Data obtained in the first photoelectric conversion film 21R, g represents a value of RAW Data obtained in the second photoelectric conversion film 22G, b represents a value of RAW Data obtained in the third photoelectric conversion film 23B, and R, G, and B represent values of red signal, green signal, and blue signal, respectively, after the color arithmetic processing.

(B) Manufacturing Method

A key portion of a method for manufacturing the above-described solid-state imaging device will be described.

Initially, as shown in FIG. 37, a (100) silicon substrate is prepared as the silicon substrate 11. Thereafter, the n-type impurity region 12d is formed in the resulting silicon substrate 11. In addition to this, the reading electrode, the reading circuit, and the like are formed on the silicon substrate 11.

Subsequently, as shown in FIG. 37, the first photoelectric conversion film 21R, the second photoelectric conversion film 22G, and the third photoelectric conversion film 23B are disposed on the silicon substrate 11 sequentially.

Here, initially, a silicon oxide film (not shown in the drawing) is formed on the surface of the silicon substrate 11. Thereafter, on the surface of the silicon substrate 11, the silicon oxide film (not shown in the drawing) is patterned in such a way that the portion, on which the first photoelectric conversion film 21R is formed, is exposed. Subsequently, the first photoelectric conversion film 21R is formed by, for example, the MBE method in which crystal growth of a p-$CuGa_{0.52}In_{0.48}S_2$ mixed crystal is effected on the silicon substrate 11. Then, the silicon oxide film (not shown in the drawing) is removed.

Next, a silicon oxide film (not shown in the drawing) is formed on the surface of the silicon substrate 11. Thereafter, on the surface of the silicon substrate 11, the silicon oxide film (not shown in the drawing) is patterned in such a way that the portion, on which the second photoelectric conversion film 22G is formed, is exposed. Subsequently, the second photoelectric conversion film 22G is formed by, for example, the MBE method in which crystal growth of a p-$CuAl_{0.24}Ga_{0.23}In_{0.53}S_2$ mixed crystal is effected on the silicon substrate 11. Then, the silicon oxide film (not shown in the drawing) is removed.

Next, a silicon oxide film (not shown in the drawing) is formed on the surface of the silicon substrate 11. Thereafter, on the surface of the silicon substrate 11, the silicon oxide film (not shown in the drawing) is patterned in such a way that the portion, on which the third photoelectric conversion film 23B is formed, is exposed. Subsequently, the third photoelectric conversion film 23B is formed by, for example, the MBE method in which crystal growth of a p-$CuAl_{0.36}Ga_{0.64}S_{1.28}Se_{0.72}$ mixed crystal is effected on the silicon substrate 11. Then, the silicon oxide film (not shown in the drawing) is removed.

In this regard, in the above description, each film can have p-type conductivity by specifying the Cu/group 13 element ratio to be 1 or less and, therefore, the above-described crystal growth is effected while this ratio is specified to be, for example, 0.98 to 0.99.

Alternatively, as described above, each film may be formed by growing a pseudo-mixed crystal on the basis of superlattice here.

Then, the pixel isolation portion PBf is formed.

Here, the pixel isolation portion PBf is formed in a manner similar to that in the second embodiment.

For example, a compound semiconductor is laterally grown under the condition in which much p-type impurities are contained, while a silicon oxide film is formed in such a way as to partition between the first photoelectric conversion film 21R, the second photoelectric conversion film 22G, and the third photoelectric conversion film 23B. In this manner, the compound semiconductor is filled between the first photoelectric conversion film 21R, the second photoelectric conversion film 22G, and the third photoelectric conversion film 23B so as to form the pixel isolation portion PBf.

Next, the transparent electrode 14 is disposed on the upper surfaces of the first photoelectric conversion film 21R, the second photoelectric conversion film 22G, and the third photoelectric conversion film 23B constituting the chalcopyrite photoelectric conversion film 13f.

Here, an ITO film (not shown in the drawing) is formed by, for example, forming a film of a transparent, electrically conductive material, e.g., indium tin oxide (ITO), by a sputtering evaporation method. Thereafter, the resulting ITO film is patterned so as to dispose the transparent electrode 14.

Then, each portion of the on-chip lens and the like is disposed on the upper surface (frontside) of the silicon substrate 11 appropriately. In this manner, the surface-illumination type CMOS image sensor is completed.

(C) Overview

As described above, in the present embodiment, the chalcopyrite photoelectric conversion film 13f is formed on the silicon substrate 11 in such a way as to lattice-match the silicon substrate 11, as in the forth embodiment except that the configuration of the pixel P is different from the fourth embodiment. Consequently, regarding the present embodiment, the crystallinity of the chalcopyrite photoelectric conversion film 13f becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PBf is formed from a compound semiconductor doped in such a way as to become a potential barrier between the chalcopyrite photoelectric conversion films 13f formed in accordance with the plurality of pixels P (refer to FIG. 37). Consequently, in the present embodiment, an occurrence of color mixing can be prevented by the pixel isolation portion PBf.

7. Seventh Embodiment

Other Backside-Illumination Type (A) Apparatus Configuration and the Like

Figure 39:
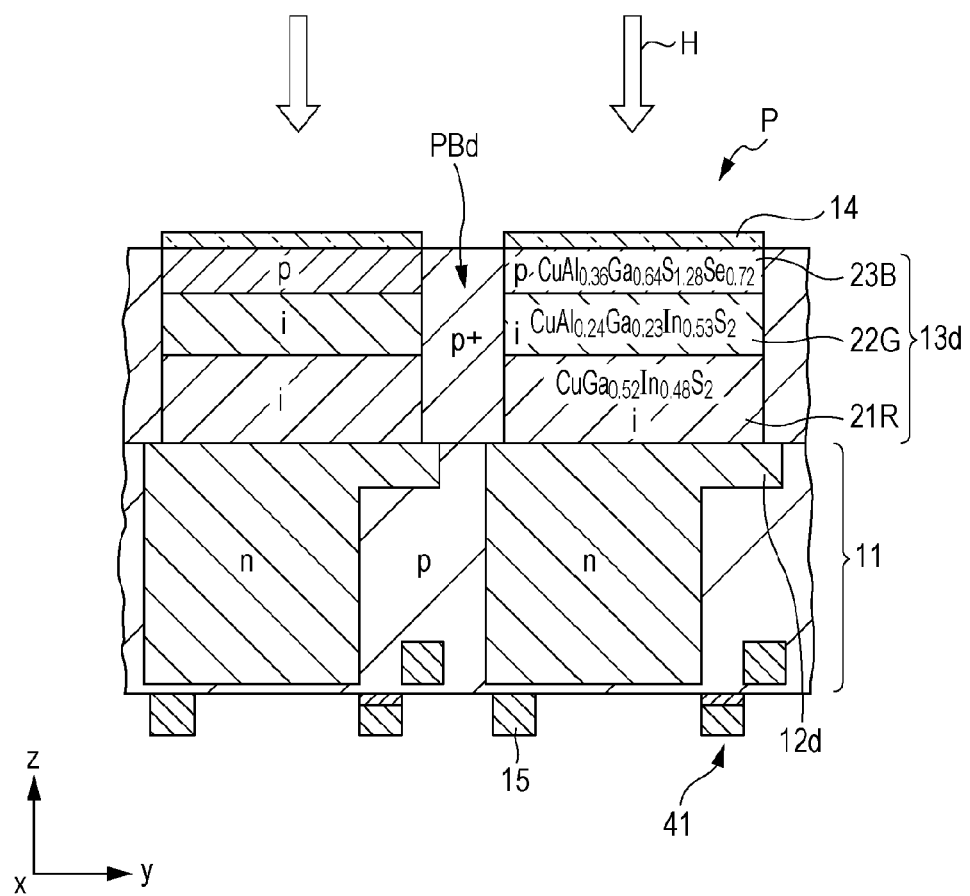
FIG. 39 is a diagram showing a key portion of a solid-state imaging device according to a seventh embodiment of the present invention.

FIG. 39 is a diagram showing a key portion of a solid-state imaging device according to a seventh embodiment of the present invention.

Here, FIG. 39 shows a cross section of a pixel P, as in FIG. 21.

As shown in FIG. 39, in the present embodiment, regarding the silicon substrate 11, a surface provided with the reading electrode 15 and the gate MOS 41 is different from that in the above-described fourth embodiment. Furthermore, although not shown in the drawing, regarding the silicon substrate 11, a surface provided with the reading circuit 51 is different from that in the above-described fourth embodiment. The present embodiment is the same as the fourth embodiment except these points. Therefore, explanations of the same portions are omitted appropriately.

As shown in FIG. 39, in the present embodiment, on the silicon substrate 11, the reading electrode 15 and the gate MOS 41 are disposed on a surface opposite to the surface provided with the chalcopyrite photoelectric conversion film 13d. On the substrate 11, the reading circuit 51 is also disposed on the surface opposite to the surface provided with the chalcopyrite photoelectric conversion film 13d, in a manner similar to those of the reading electrode 15 and the gate MOS 41.

In addition, in the inside of the silicon substrate 11, the n-type impurity region 12d is disposed between the backside of the substrate 11 and the vicinity of the frontside.

That is, in contrast to the fourth embodiment, the reading electrode 15, the gate MOS 41, and the reading circuit 51 are disposed on the frontside of the silicon substrate 11 and, therefore, the solid-state imaging device is configured to serve as a "backside-illumination type".

(B) Overview

As described above, the present embodiment is a "backside-illumination type", in contrast to the fourth embodiment, but the chalcopyrite photoelectric conversion film 13d is formed on the silicon substrate 11 in such a way as to lattice-match the silicon substrate 11, as in the fourth embodiment. Consequently, regarding the present embodiment, the crystallinity of the chalcopyrite photoelectric conversion film 13d becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PBd is formed from a compound semiconductor doped in such a way as to become a potential barrier between the chalcopyrite photoelectric conversion films 13d formed in accordance with the plurality of pixels P (refer to FIG. 39). Consequently, in the present embodiment, an occurrence of color mixing can be prevented by the pixel isolation portion PBd.

In addition, in the present embodiment, the chalcopyrite photoelectric conversion film 13d includes the first photoelectric conversion film 21R, the second photoelectric conversion film 22G, and the third photoelectric conversion film 23B which are layered on the silicon substrate 11 sequentially, as in the fourth embodiment. Consequently, in the present embodiment, as in the fourth embodiment, light of three primary colors can be dispersed in the depth direction z, and accumulation of photoelectrons, signal reading through three-stage application of voltage, and voltage reduction in avalanche multiplication can be performed at the same time. Moreover, the sensitivity can be improved because the light incident from the backside, which is opposite to the surface provided with the reading electrode 15 and the like and which has a wide opening for the light, is received and photoelectrically converted.

The present embodiment is a "backside-illumination type" and, therefore, the incident light can enter the chalcopyrite photoelectric conversion film 13d without interposing the wiring layer (not shown in the drawing).

(C) Modified Examples (C-1) Modified Example 7-1

Figure 40:
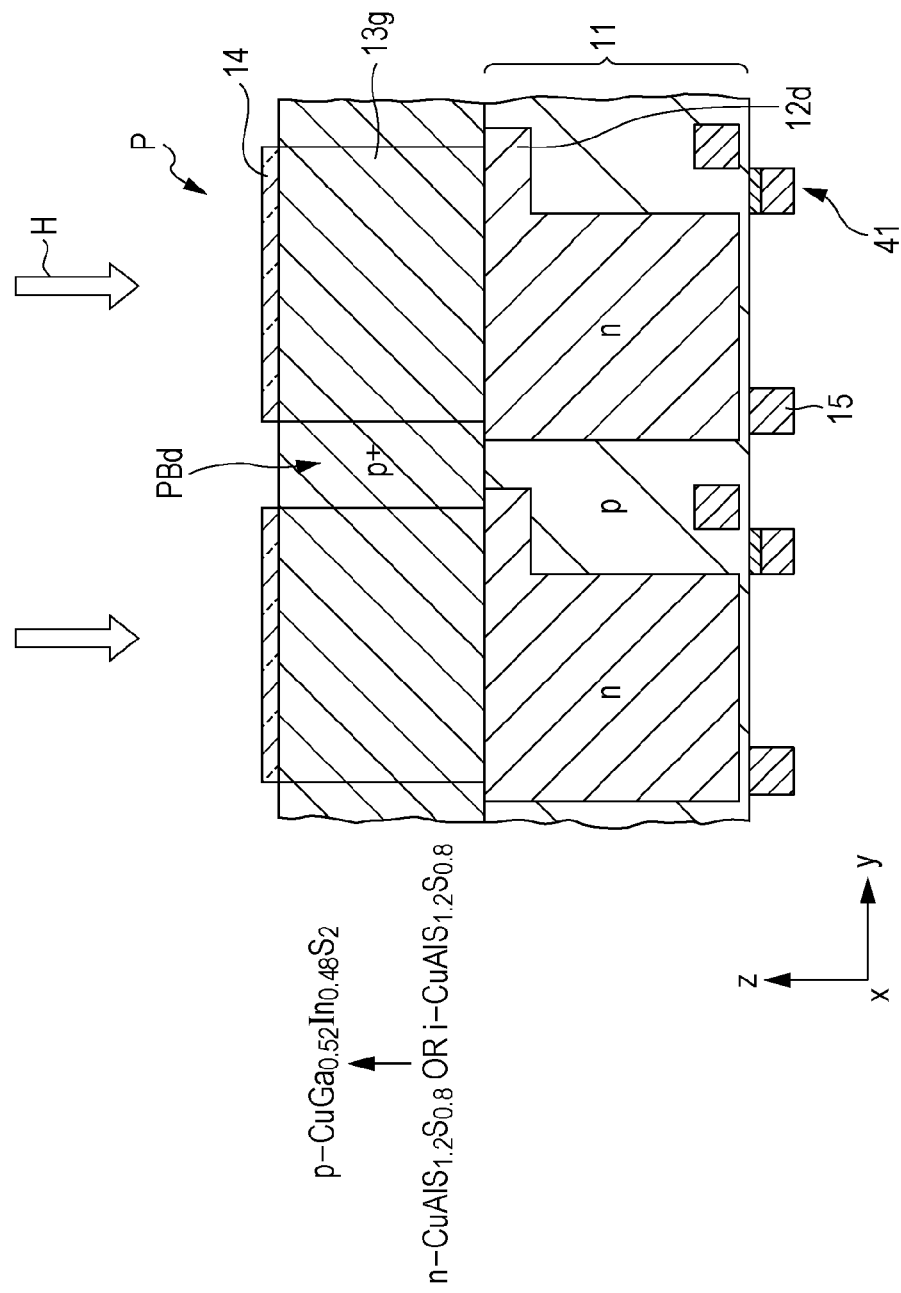
FIG. 40 is a diagram showing a key portion of a solid-state imaging device according to Modified example 7-1 of the seventh embodiment of the present invention.

FIG. 40 is a diagram showing a key portion of a solid-state imaging device according to Modified example 7-1 of the seventh embodiment of the present invention.

Here, FIG. 40 shows a cross section of a pixel P, as in FIG. 39.

As shown in FIG. 40, in the present modified example, the configuration of a chalcopyrite photoelectric conversion film 13g is different from that in the above-described seventh embodiment. Therefore, explanations of the same portions are omitted appropriately.

As shown in FIG. 40, the chalcopyrite photoelectric conversion film 13g is formed in such a way that the composition varies from n-$CuAlS_{1.2}Se_{0.8}$ or i-$CuAlS_{1.2}Se_{0.8}$ to p-$CuGa_{0.52}In_{0.48}S_2$ from the silicon substrate 11 side.

This chalcopyrite photoelectric conversion film 13g is formed by, for example, the MBE method in such a way that the total thickness becomes about 2 μm.

Specifically, initially, a crystal of n-$CuAlS_{1.2}Se_{0.8}$ or i-$CuAlS_{1.2}Se_{0.8}$ is grown. Thereafter, the compositions of Al and Se are reduced gradually and, in addition, the compositions of Ga and In are increased gradually in such a way that the composition becomes p-$CuGa_{0.52}In_{0.48}S_2$.

In this crystal growth, the n-type or i-type is changed to the p-type in midstream. In order to obtain the n-type conductivity, doping with a group 12 element is performed. For example, a very small amount of zinc (Zn) is added during the crystal growth. In order to obtain the i-type, doping is not performed. On the other hand, in order to obtain the p-type conductivity, the Cu/group 13 element ratio is specified to be 1 or less. For example, the crystal growth is effected while this ratio is specified to be 0.98 to 0.99.

Before this crystal growth is effected, on the surface of the silicon substrate 11, the portion other than the portion, on which the chalcopyrite photoelectric conversion film 13g is formed, is covered with silicon oxide film (not shown in the drawing). Subsequently, on the surface of the silicon substrate 11, a crystal of a compound semiconductor is selectively grown on the surface not covered with the silicon oxide film (not shown in the drawing), so as to form the above-described chalcopyrite photoelectric conversion film 13g.

In this modified example, color filters in, for example, the Bayer pattern are disposed on a pixel basis and, thereby, color separation is performed.

In the present modified example, the chalcopyrite photoelectric conversion film 13g is formed while the composition is changed within the range, in which lattice-match to the silicon substrate 11 is achieved and, in addition, the band gap can be maximized, as is clear with reference to FIG. 22. Consequently, in the case where a reverse bias is applied, a large energy difference is obtained by a small drive voltage, so that avalanche multiplication occurs to a large extent and high sensitivity is obtained.

(C-2) Modified Example 7-2

Figure 41:
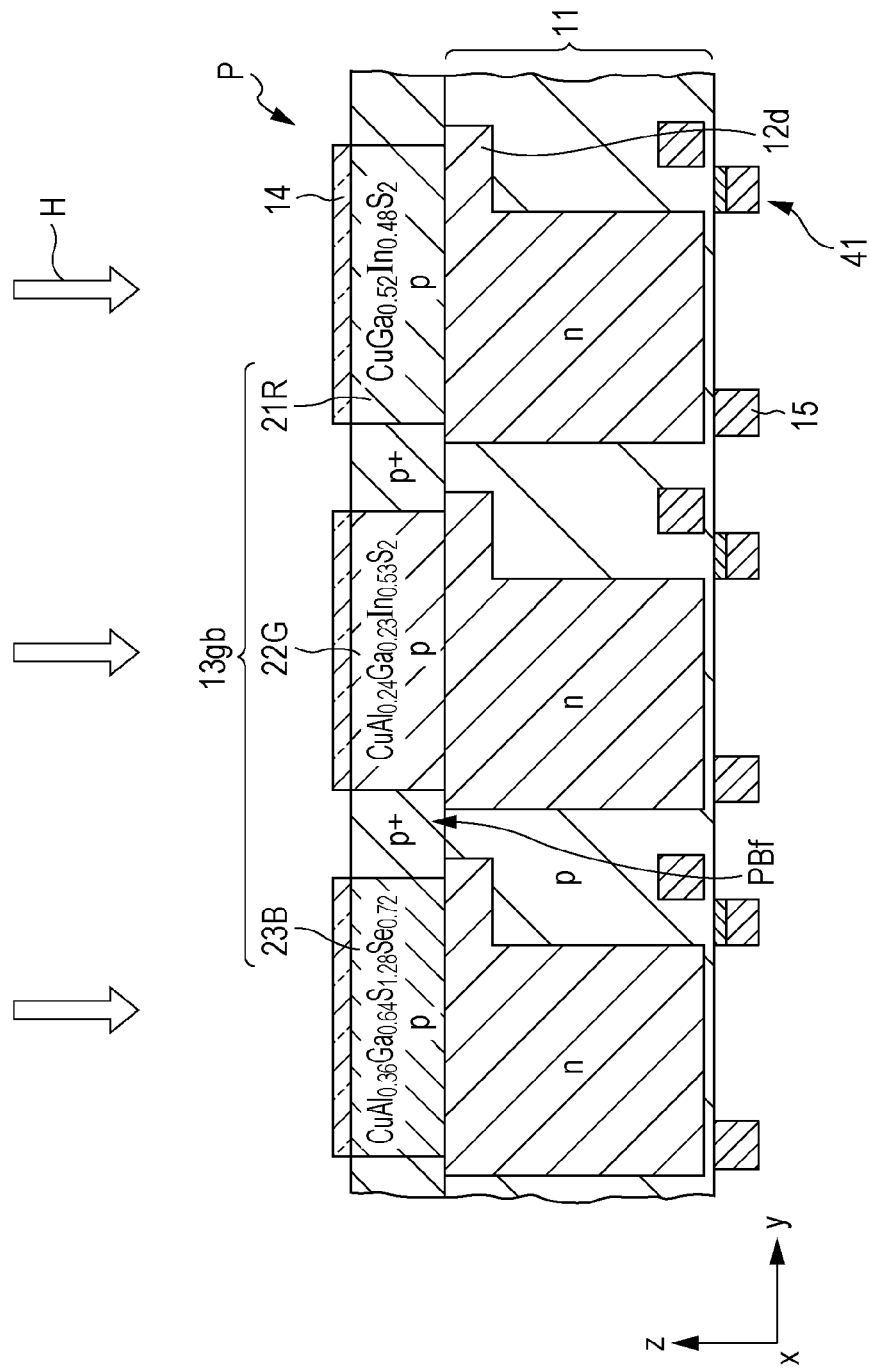
FIG. 41 is a diagram showing a key portion of a solid-state imaging device according to Modified example 7-2 of the seventh embodiment of the present invention.

FIG. 41 is a diagram showing a key portion of a solid-state imaging device according to Modified example 7-2 of the seventh embodiment of the present invention.

Here, FIG. 41 shows a cross section of a pixel P, as in FIG. 39.

As shown in FIG. 41, in the present modified example, the configuration of a chalcopyrite photoelectric conversion film 13gb is different from that in the above-described seventh embodiment. Therefore, explanations of the same portions are omitted appropriately.

As shown in FIG. 41, the solid-state imaging device is configured to serve as a "backside-illumination type".

As shown in FIG. 41, in the solid-state imaging device, in contrast to the above-described seventh embodiment, the chalcopyrite photoelectric conversion film 13gb is not configured to disperse the incident light into the light of each of the colors of red, green, and blue in the depth direction z and photoelectrically convert.

Here, as shown in FIG. 41, the chalcopyrite photoelectric conversion film 13gb includes the first photoelectric conversion film 21R, the second photoelectric conversion film 22G, and the third photoelectric conversion film 23B, and each film is arranged side by side on the surface (xy plane) of the silicon substrate 11.

The present modified example is the same as the sixth embodiment except that, for example, the reading electrode 15, the gate MOS 41, and the like are disposed on the frontside of the silicon substrate 11 and, thereby, a "backside-illumination type" is formed.

That is, each of the first photoelectric conversion film 21R, the second photoelectric conversion film 22G, and the third photoelectric conversion film 23B is formed in a manner similar to that in the sixth embodiment.

Specifically, as shown in FIG. 41, each film is formed in such a way as to have the following composition.

First photoelectric conversion film 21R: $CuGa_{0.52}In_{0.48}S_2$ film

Second photoelectric conversion film 22G: $CuAl_{0.24}Ga_{0.23}In_{0.53}S_2$ film Third photoelectric conversion film 23B: $CuAl_{0.36}Ga_{0.64}S_{1.28}Se_{0.72}$ film Furthermore, in a manner similar to that in the sixth embodiment, the pixel isolation portion PBf is disposed on the side surface of each of the first photoelectric conversion film 21R, the second photoelectric conversion film 22G, and the third photoelectric conversion film 23B.

In this case, the sensitivity can be improved because the light incident from the backside, which is opposite to the surface provided with the reading electrode 15 and the like and which has a wide opening for the light, is received and photoelectrically converted.

8. Eighth Embodiment

Reading of Hole as Signal

(A) Apparatus Configuration and the Like

Figure 42:
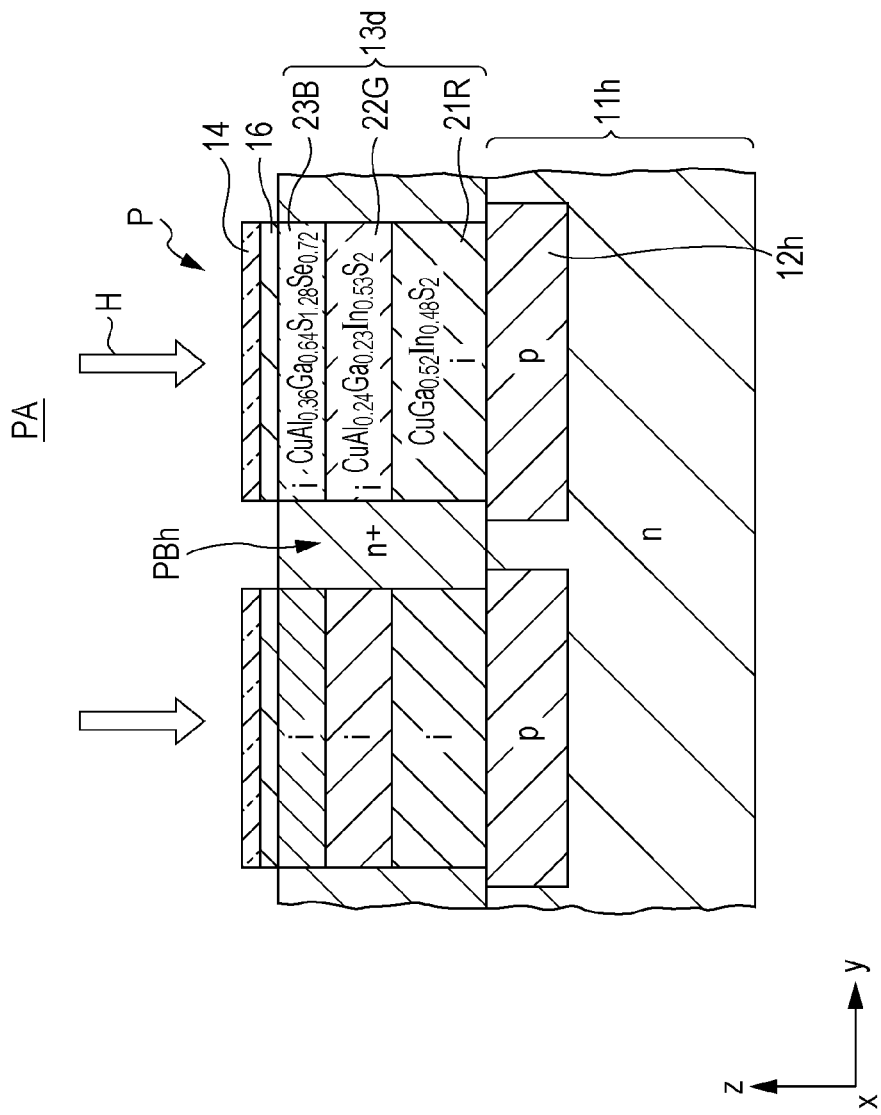
FIG. 42 is a diagram showing a key portion of a solid-state imaging device according to an eighth embodiment of the present invention.

FIG. 42 is a diagram showing a key portion of a solid-state imaging device according to an eighth embodiment of the present invention.

Here, FIG. 42 shows a cross section of a pixel P, as in FIG. 21 (fourth embodiment).

In the present embodiment, the "hole" is read as a signal in contrast to the fourth embodiment in which the "electron" is read as a signal. The present embodiment is the same as the fourth embodiment except the following points. Therefore, explanations of the same portions are omitted appropriately.

In the present embodiment, as shown in FIG. 42, the conduction type of a silicon substrate 11h is an n-type in contrast to that in the fourth embodiment.

In this silicon substrate 11h, a p-type impurity region 12h is disposed in place of the n-type impurity region.

The chalcopyrite photoelectric conversion film 13d is formed from a mixed crystal of CuGaInZnSSe system lattice-matched with the silicon substrate 11h, as in the fourth embodiment.

The chalcopyrite photoelectric conversion film 13d includes the first photoelectric conversion film 21R, the second photoelectric conversion film 22G, and the third photoelectric conversion film 23B, and each film is layered on the surface of the silicon substrate 11h sequentially, as in the fourth embodiment.

In this chalcopyrite photoelectric conversion film 13d, each of the first photoelectric conversion film 21R and the second photoelectric conversion film 22G is the i-type. However, the third photoelectric conversion film 23B is not the p-type, but the i-type in contrast to that in the fourth embodiment. That is, each of the first photoelectric conversion film 21R, the second photoelectric conversion film 22G, and the third photoelectric conversion film 23B constituting the chalcopyrite photoelectric conversion film 13d is not doped with an impurity. In this regard, the i-type is employed here, but the chalcopyrite photoelectric conversion film 13d may be formed in such a way as to become a lightly doped p-type.

Furthermore, regarding each of the first photoelectric conversion film 21R, the second photoelectric conversion film 22G, and the third photoelectric conversion film 23B, in the wide gap side in the vicinity of each interface, a spike-shaped energy barrier is formed in the valence band side in such a way as to satisfy the following formula.

$B_B \geq B_G \geq B_R > kT (=26\ meV)$

The above-described band structure is employed and, thereby, holes can be confined in each of the first photoelectric conversion film 21R, the second photoelectric conversion film 22G, and the third photoelectric conversion film 23B.

The pixel isolation portion PBh is formed in such a way that the conduction type is the n-type, in contrast to that in the fourth embodiment, and the concentration of the n-type impurity becomes high.

In addition, in contrast to the fourth embodiment, an intermediate layer 16 is disposed between the chalcopyrite photoelectric conversion film 13d and the transparent electrode 14. The intermediate layer 16 is, for example, a cadmium sulfide (CdS) layer and is disposed to lower the potential barrier against the movement of electrons to the transparent electrode 14 side and lower the drive voltage. The transparent electrode 14 is formed from, for example, an n-type transparent electrode material, e.g., zinc oxide.

In reading of signals in the present embodiment, the relationship between positive and negative of the applied voltage for reading is reversed as compared with that in the case of the structure to read electrons. That is, a negative voltage is applied to each of the first photoelectric conversion film 21R, the second photoelectric conversion film 22G, and the third photoelectric conversion film 23B in the order of $V_R$, $V_G$, and $V_B$ (where, $V_B < V_G < V_R \leq -kT$). In this manner, each of the red (R) signal, the green (G) signal, and the blue (B) signal can be read from each of the first photoelectric conversion film 21R, the second photoelectric conversion film 22G, and the third photoelectric conversion film 23B, respectively, sequentially.

(B) Overview

In the present embodiment configured to read the "hole" as a signal, in contrast to the fourth embodiment, the chalcopyrite photoelectric conversion film 13d is formed on the silicon substrate 11 in such a way as to lattice-match the silicon substrate 11, as in the fourth embodiment. Consequently, regarding the present embodiment, the crystallinity of the chalcopyrite photoelectric conversion film 13d becomes good, an occurrence of a dark current can be suppressed, and degradation of the image quality due to a white spot can be prevented. Furthermore, an improvement of the sensitivity can be realized and, thereby, imaging can be performed with high image quality even in a dark imaging environment (for example, nighttime).

In the present embodiment, the pixel isolation portion PBh is formed from a compound semiconductor doped in such a way as to become a potential barrier between the chalcopyrite photoelectric conversion films 13d formed in accordance with the plurality of pixels P (refer to FIG. 42). Consequently, in the present embodiment, an occurrence of color mixing can be prevented by the pixel isolation portion PBh.

In addition, in the present embodiment, the chalcopyrite photoelectric conversion film 13d includes the first photoelectric conversion film 21R, the second photoelectric conversion film 22G, and the third photoelectric conversion film 23B which are layered on the silicon substrate 11 sequentially, as in the fourth embodiment. Consequently, in the present embodiment, as in the fourth embodiment, light of three primary colors can be dispersed in the depth direction z, and accumulation of photoelectrons, signal reading through three-stage application of voltage, and voltage reduction in avalanche multiplication can be performed at the same time. Moreover, the sensitivity can be improved because the light incident from the backside, which is opposite to the surface provided with the reading electrode 15 and the like and which has a wide opening for the light, is received and photoelectrically converted.

(C) Modified Examples

The above-described embodiment shows an example in which the "hole" is read as a signal regarding the same configuration as that in the fourth embodiment. The "electron" may be read as a signal regarding the same configurations as those of the other embodiments besides the fourth embodiment. Examples thereof will be described below sequentially.

(C-1) Modified Example 8-1

Figure 43:
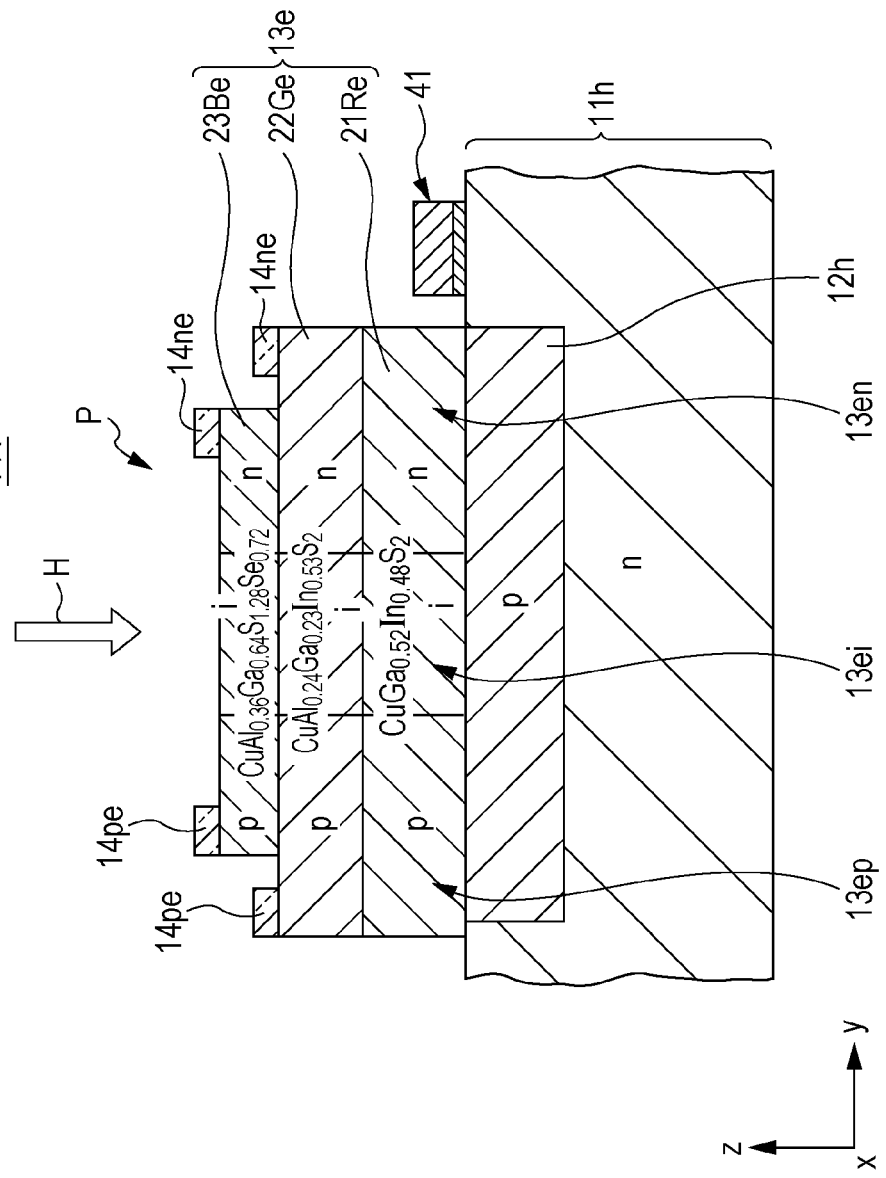
FIG. 43 is a diagram showing a key portion of a solid-state imaging device according to Modified example 8-1 of the eighth embodiment of the present invention.

FIG. 43 is a diagram showing a key portion of a solid-state imaging device according to Modified example 8-1 of the eighth embodiment of the present invention.

Here, FIG. 43 shows a cross section of a pixel P, as in FIG. 33 (fifth embodiment).

As shown in FIG. 43, the present embodiment shows the case where the "hole" is read as a signal regarding the same configuration as that in the fifth embodiment. The present embodiment is the same as the fifth embodiment except the following points. Therefore, explanations of the same portions are omitted appropriately.

In the present embodiment, as shown in FIG. 43, the conduction type of the silicon substrate 11$h$ is the n-type in contrast to that in the fifth embodiment.

In this silicon substrate 11$h$, the p-type impurity region 12$h$ is disposed in place of the n-type impurity region.

In the case where such a configuration is employed, holes can be read as each of the red (R) signal, the green (G) signal, and the blue (B) signal from each of the first photoelectric conversion film 21R, the second photoelectric conversion film 22G, and the third photoelectric conversion film 23B, respectively.

(C-2) Modified Example 8-2

FIG. 43 is a diagram showing a key portion of a solid-state imaging device according to Modified example 8-2 of the eighth embodiment of the present invention.

Figure 44:
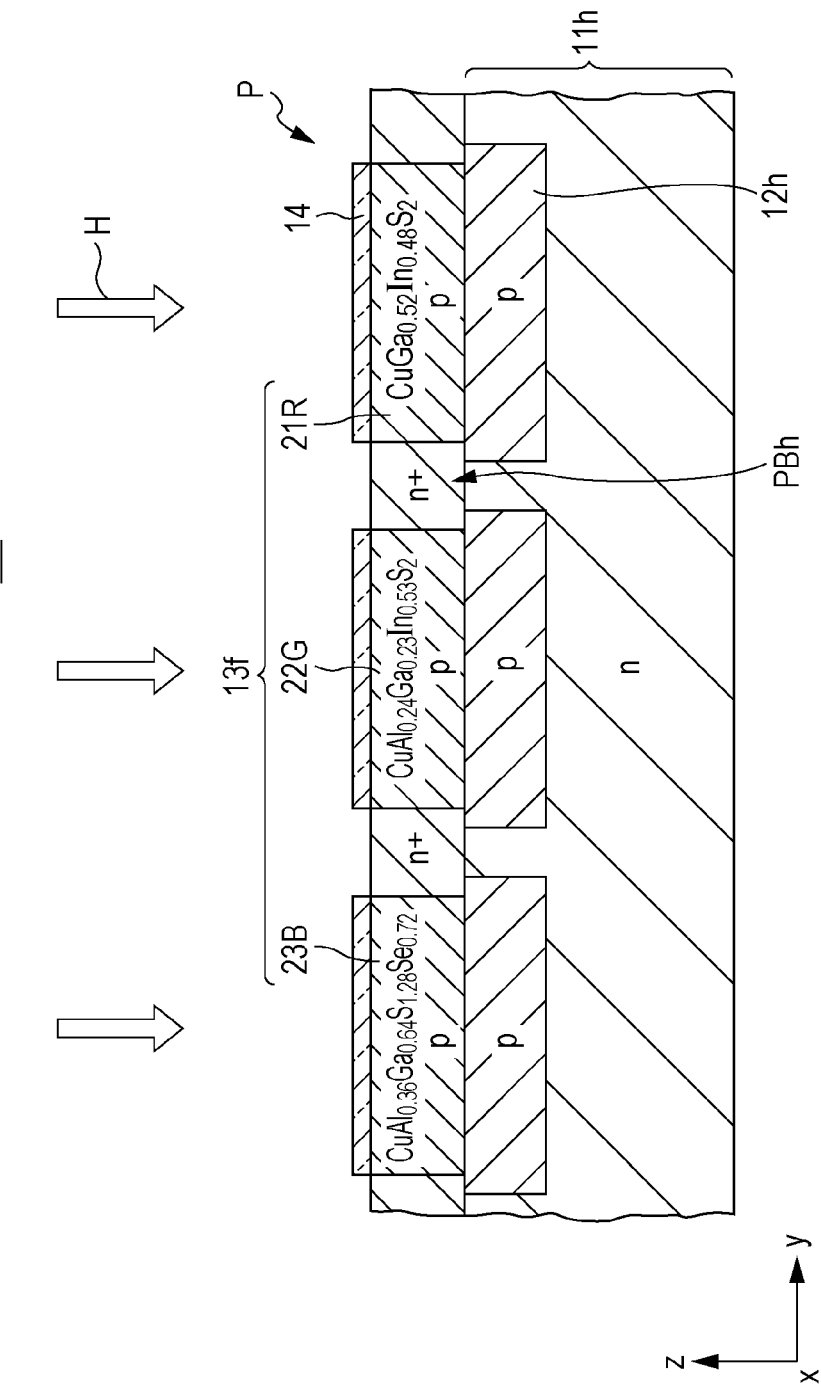
FIG. 44 is a diagram showing a key portion of a solid-state imaging device according to Modified example 8-2 of the eighth embodiment of the present invention.

Here, FIG. 44 shows a cross section of a pixel P, as in FIG. 37 (sixth embodiment).

As shown in FIG. 44, the present embodiment shows the case where the "hole" is read as a signal regarding the same configuration as that in the sixth embodiment. The present embodiment is the same as the sixth embodiment except the following points. Therefore, explanations of the same portions are omitted appropriately.

In the present embodiment, as shown in FIG. 44, the conduction type of the silicon substrate 11$h$ is the n-type in contrast to that in the sixth embodiment.

In this silicon substrate 11$h$, the p-type impurity region 12$h$ is disposed in place of the n-type impurity region.

In the case where such a configuration is employed, holes can be read as each of the red (R) signal, the green (G) signal, and the blue (B) signal from each of the first photoelectric conversion film 21R, the second photoelectric conversion film 22G, and the third photoelectric conversion film 23B, respectively.

(C-2) Modified Example 8-3

Figure 45:
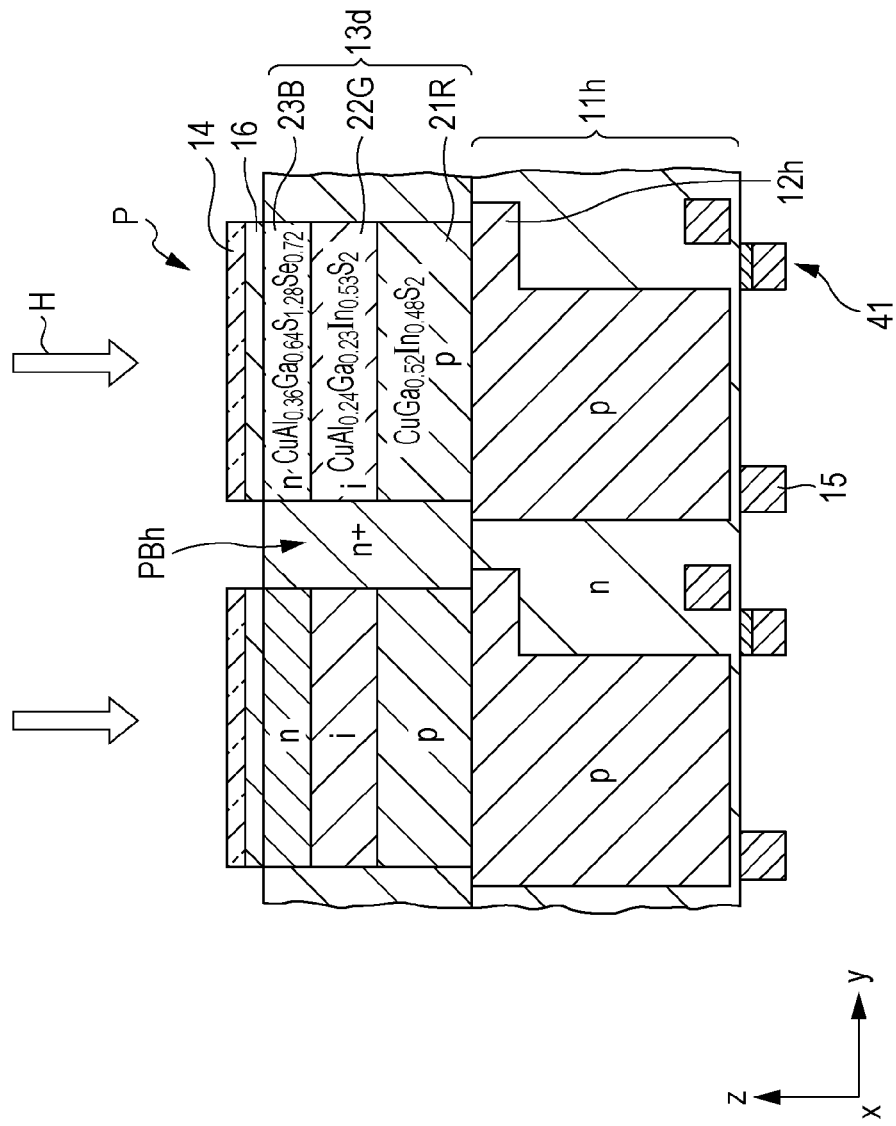
FIG. 45 is a diagram showing a key portion of a solid-state imaging device according to Modified example 8-3 of the eighth embodiment of the present invention.

FIG. 45 is a diagram showing a key portion of a solid-state imaging device according to Modified example 8-3 of the eighth embodiment of the present invention.

Here, FIG. 45 shows a cross section of a pixel P, as in FIG. 39 (seventh embodiment).

As shown in FIG. 45, the present embodiment shows the case where the "hole" is read as a signal regarding the same configuration as that in the seventh embodiment. The present embodiment is the same as the seventh embodiment except the following points. Therefore, explanations of the same portions are omitted appropriately.

In the present embodiment, as shown in FIG. 45, the conduction type of the silicon substrate 11$h$ is the n-type in contrast to that in the seventh embodiment.

In this silicon substrate 11$h$, the p-type impurity region 12$h$ is disposed in place of the n-type impurity region.

The chalcopyrite photoelectric conversion film 13$d$ is formed from a CuAlGaInSSe based mixed crystal lattice-matched with the silicon substrate 11$h$, as in the seventh embodiment.

The chalcopyrite photoelectric conversion film 13$d$ includes the first photoelectric conversion film 21R, the second photoelectric conversion film 22G, and the third photoelectric conversion film 23B, and each film is layered on the surface of the silicon substrate 11$h$ sequentially, as in the seventh embodiment.

Furthermore, each of the first photoelectric conversion film 21R, the second photoelectric conversion film 22G, and the third photoelectric conversion film 23B is formed in such a way as to have, for example, the following composition and thickness.

First photoelectric conversion film 21R: p-$CuGa_{0.52}In_{0.48}S_2$ film, 0.8 μm thickness Second photoelectric conversion film 22G: i-$CuAl_{0.24}Ga_{0.23}In_{0.53}S_2$ film, 0.7 μm thickness Third photoelectric conversion film 23B: n-$CuAl_{0.36}Ga_{0.64}S_{1.28}Se_{0.72}$ film, 0.7 μm thickness Regarding each of the first photoelectric conversion film 21R, the second photoelectric conversion film 22G, and the third photoelectric conversion film 23B, a spike-shaped energy barrier is formed in the wide gap side in the vicinity of each interface, as in the eighth embodiment.

The pixel isolation portion PBh is formed in such a way that the conduction type is the n-type, in contrast to that in the seventh embodiment, and the concentration of the n-type impurity becomes high.

In addition, in contrast to the eighth embodiment, the intermediate layer 16 is disposed between the chalcopyrite photoelectric conversion film 13$d$ and the transparent electrode 14. The intermediate layer 16 is, for example, a cadmium sulfide (CdS) layer and is disposed to lower the potential barrier against the movement of electrons to the transparent electrode 14 side and lower the drive voltage, as in the above-described eighth embodiment. The transparent electrode 14 is formed from, for example, an n-type transparent electrode material, e.g., zinc oxide.

In the case where such a configuration is employed, holes can be read as each of the red (R) signal, the green (G) signal, and the blue (B) signal from each of the first photoelectric conversion film 21R, the second photoelectric conversion film 22G, and the third photoelectric conversion film 23B, respectively.

(C-4) Modified Example 8-4

Figure 46:
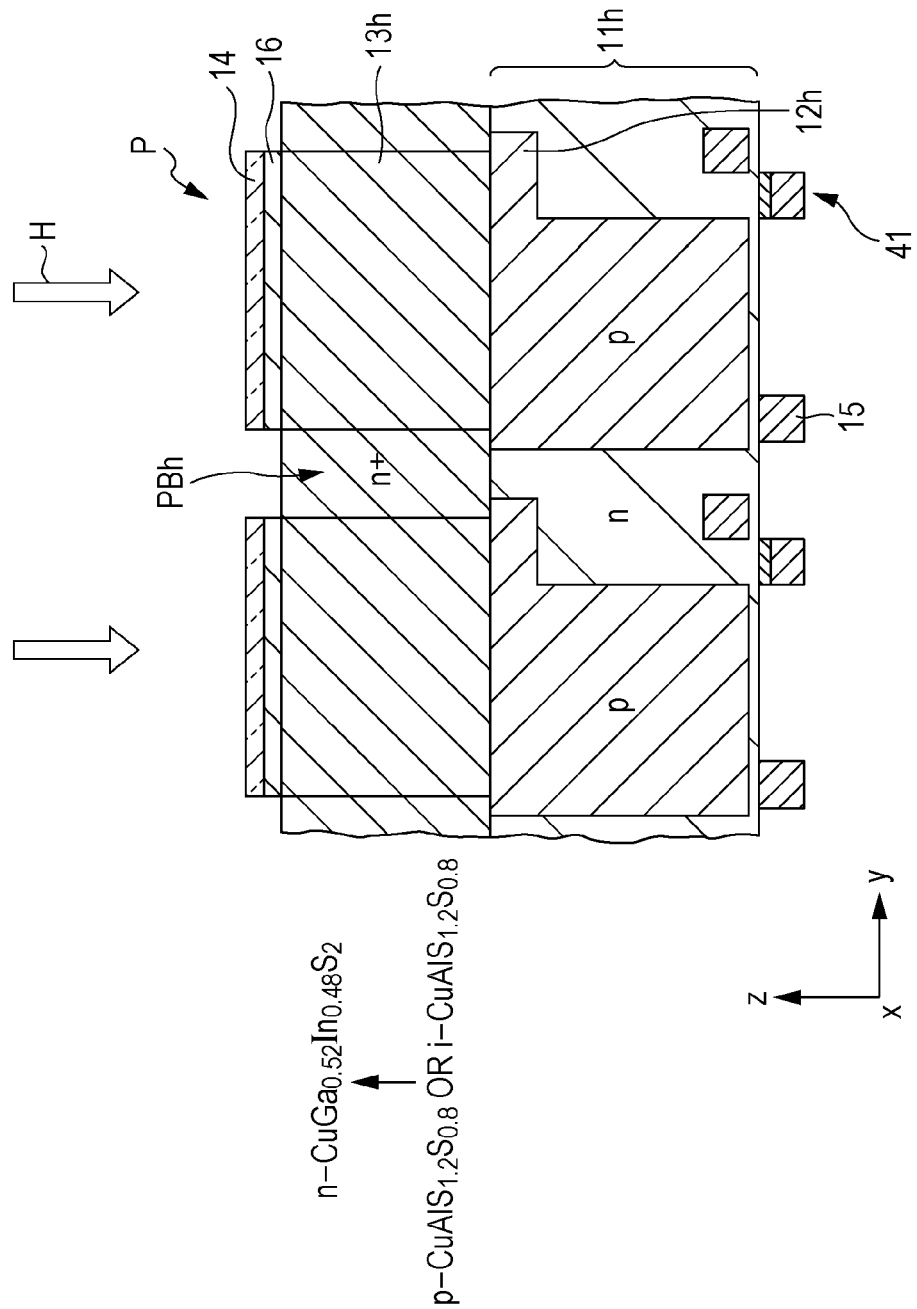
FIG. 46 is a diagram showing a key portion of a solid-state imaging device according to Modified example 8-4 of the eighth embodiment of the present invention.

FIG. 46 is a diagram showing a key portion of a solid-state imaging device according to Modified example 8-4 of the eighth embodiment of the present invention.

Here, FIG. 46 shows a cross section of a pixel P, as in FIG. 40 (Modified example 7-1 of the seventh embodiment).

As shown in FIG. 46, the present embodiment shows the case where the "hole" is read as a signal regarding the same configuration as that in the Modified example 7-1 of the seventh embodiment. The present embodiment is the same as the Modified example 7-1 of the seventh embodiment except the following points. Therefore, explanations of the same portions are omitted appropriately.

In the present embodiment, as shown in FIG. 46, the conduction type of a silicon substrate 11$h$ is the n-type in contrast to that in the Modified example 7-1 of the seventh embodiment. In this silicon substrate 11$h$, the p-type impurity region 12$h$ is disposed in place of the n-type impurity region.

The chalcopyrite photoelectric conversion film 13$h$ is formed in such a way that the composition varies from p-CuAlS$_{1.2}$Se$_{0.8}$ or i-CuAlS$_{1.2}$Se$_{0.8}$ to n-CuGa$_{0.52}$In$_{0.48}$S$_2$ gradually from the silicon substrate 11$h$ side in an upward direction.

The pixel isolation portion PBh is formed in such a way that the conduction type is the n-type, in contrast to that in the Modified example 7-1 of the seventh embodiment, and the concentration of the n-type impurity becomes high.

In addition, in contrast to Modified example 7-1 of the seventh embodiment, the intermediate layer 16 is disposed between the chalcopyrite photoelectric conversion film 13$d$ and the transparent electrode 14. The intermediate layer 16 is, for example, a cadmium sulfide (CdS) layer and is disposed to lower the potential barrier against the movement of electrons to the transparent electrode 14 side and lower the drive voltage, as in the above-described eighth embodiment. The transparent electrode 14 is formed from, for example, an n-type transparent electrode material, e.g., zinc oxide.

In the case where such a configuration is employed, holes can be read as each of the red (R) signal, the green (G) signal, and the blue (B) signal from each of the first photoelectric conversion film 21R, the second photoelectric conversion film 22G, and the third photoelectric conversion film 23B, respectively.

9. Ninth Embodiment

Use of Off Substrate (A) Configuration and the Like

The above-described embodiment shows the case where the silicon substrate, in which the principal surface is a (100) face, is used, and the chalcopyrite photoelectric conversion film is formed by epitaxially growing the above-described compound semiconductor on the principal surface. That is, the case where the {100} substrate is used is explained, although not limited to this.

In the case where the above-described compound semiconductor is epitaxially grown on a nonpolar silicon substrate having no ionicity by using an ionic element as a material, a defect referred to as an antiphase domain may occur. That is, a cation and an anion grow in a reverse phase locally, so that the an antiphase domain occurs.

Consequently, an off substrate may be used as the silicon substrate. An occurrence of an antiphase domain can be suppressed by effecting epitaxial growth on the off substrate (for example, refer to M. Kawabe, H. Takasugi, T. Ueda, S. Yokoyama, Y. Bando, "GaAs on Si no Shoki Seichou Katei (Initial Stage of Growth of GaAs on Si)" JSAP Division of Crystal Science and Technology, Text of the 4th Crystal Science and Technology Symposium (1987. 7. 17) pp. 1-8).

Figure 47:
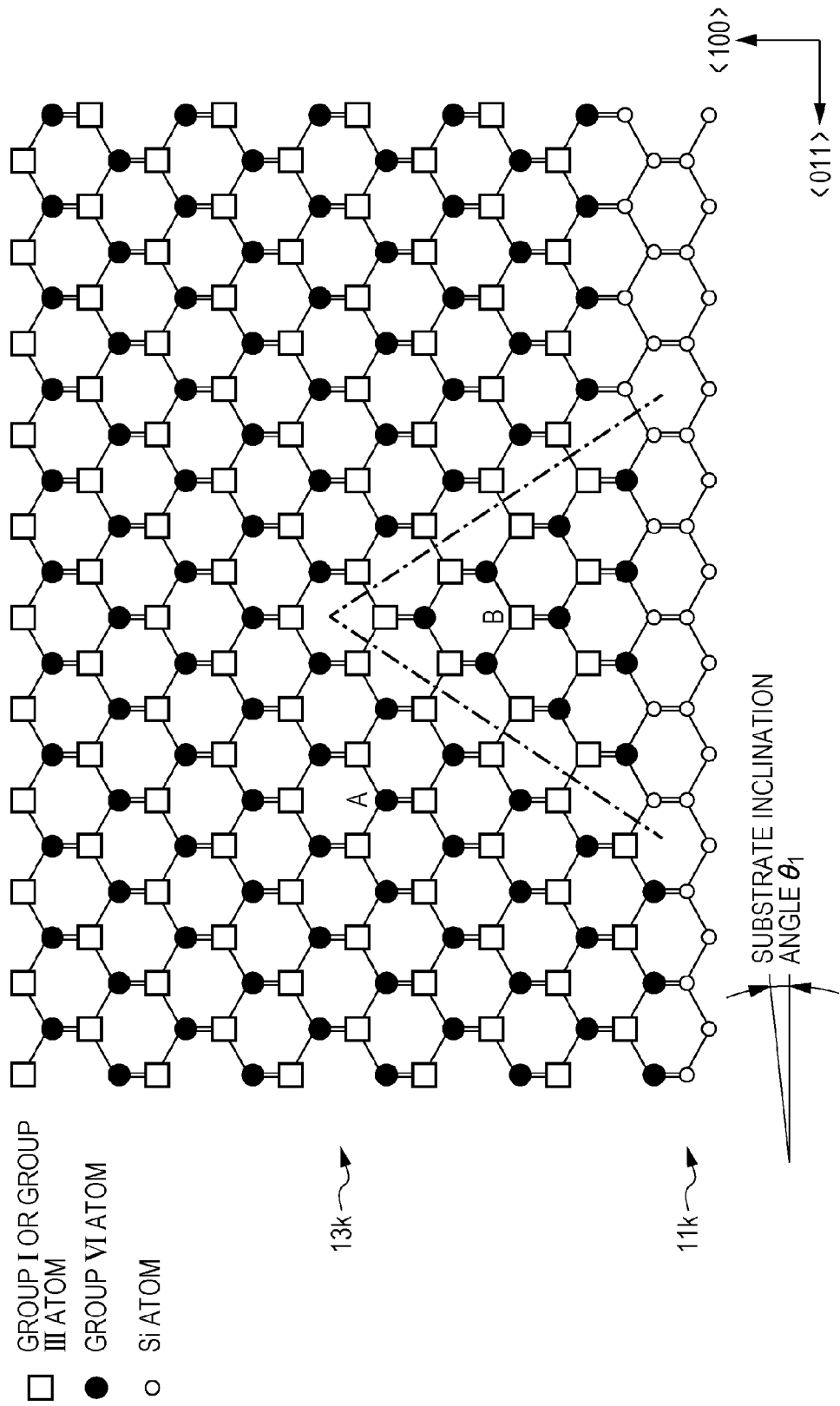
FIG. 47 is a diagram showing an atomic arrangement in the case where a chalcopyrite photoelectric conversion film is disposed on a silicon substrate, which is an off substrate, according to a ninth embodiment of the present invention.
Figure 48:
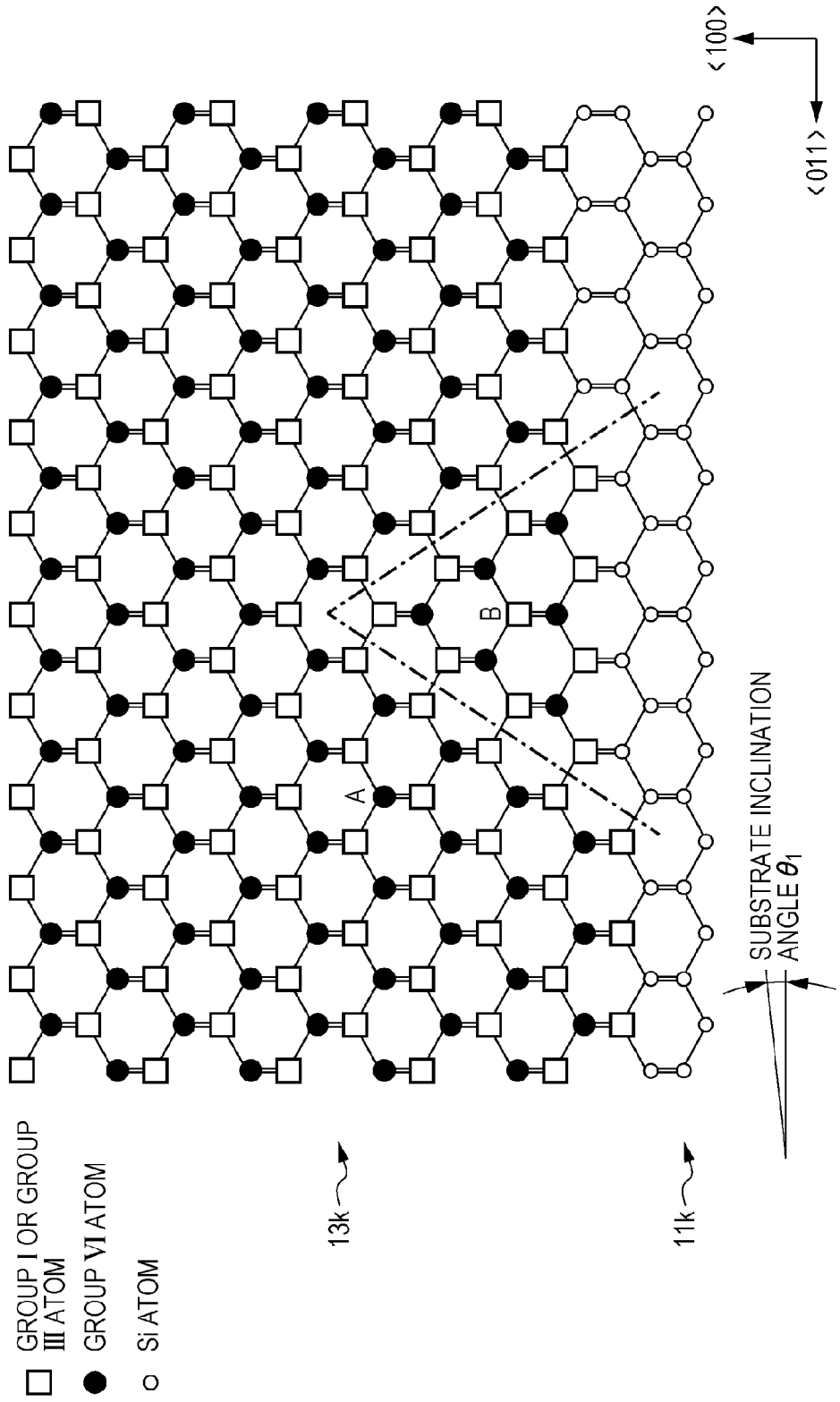
FIG. 48 is a diagram showing an atomic arrangement in the case where a chalcopyrite photoelectric conversion film is disposed on a silicon substrate, which is an off substrate, according to the ninth embodiment of the present invention.
Figure 49:
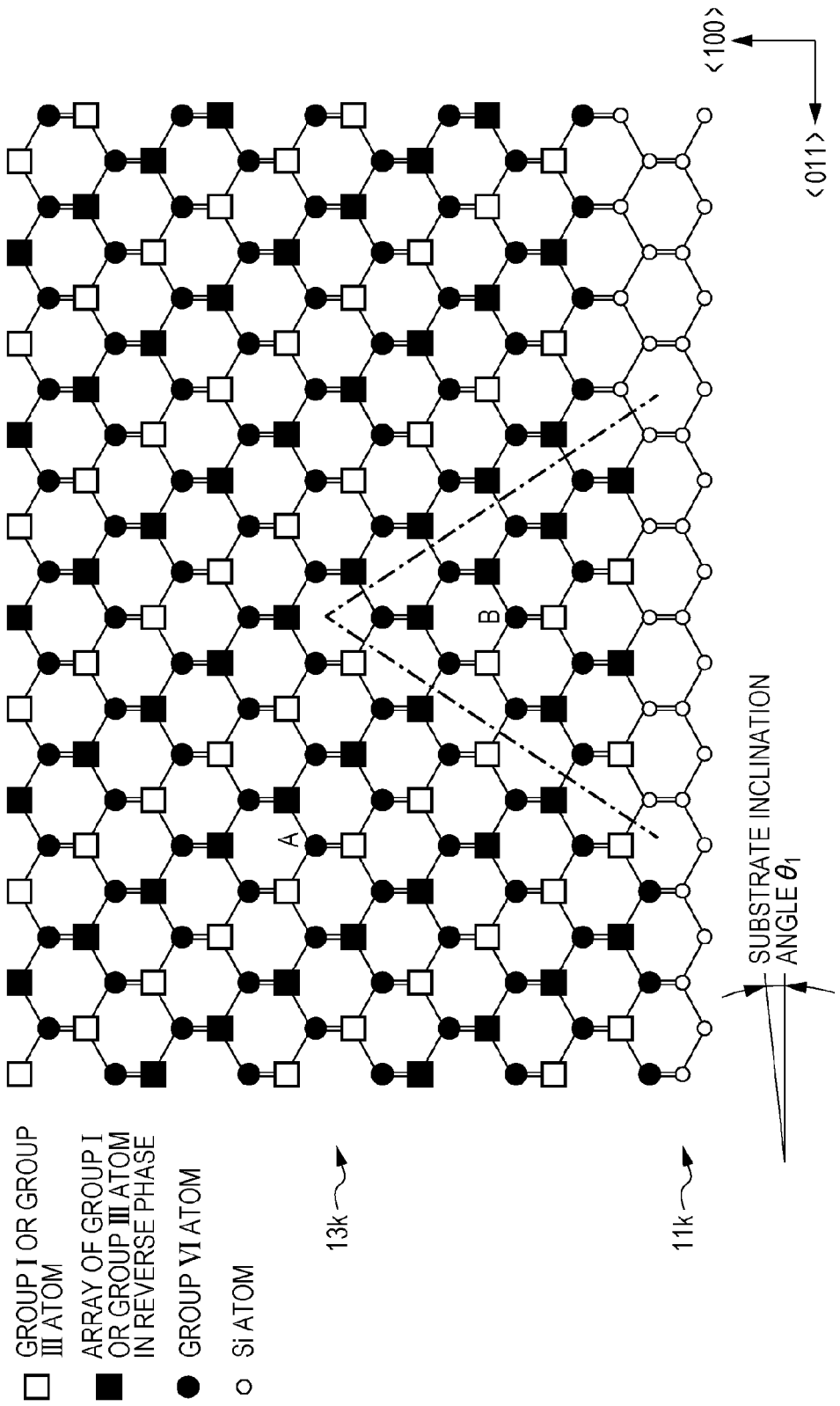
FIG. 49 is a diagram showing an atomic arrangement in the case where a chalcopyrite photoelectric conversion film is disposed on a silicon substrate, which is an off substrate, according to the ninth embodiment of the present invention.

FIG. 47, FIG. 48, and FIG. 49 are diagrams showing an atomic arrangement in the case where a chalcopyrite photoelectric conversion film 13$k$ is disposed on a silicon substrate 11$k$, which is an off substrate, according to a ninth embodiment of the present invention. Each of FIG. 47, FIG. 48, and FIG. 49 shows a cross section, where a crystal is viewed in the <0-11> direction.

In FIG. 47, FIG. 48, and FIG. 49, for example, a group I atom is a copper (Cu) atom, a group III atom is a gallium (Ga) atom or an indium (In) atom, and a group VI atom is a sulfur (S) atom, selenium (Se) atom, or the like. In FIG. 47, FIG. 48, and FIG. 49, a "group I or group III atom array" indicated by a white square mark refers to that group I and group III atoms are aligned alternately in the direction perpendicular to the drawing. In FIG. 49, an "array of group I or group III atom in reverse phase" indicated by a black square mark refers to that group I and group III atoms are arranged in a manner reverse to the "group I or group III atom array". Specifically, as shown in FIG. 5, the group I atom (for example, Cu) and the group III atom (for example, In) are aligned alternately with the group VI atom therebetween in the <0-11> direction, whereas this positional relationship is reversed.

Among these drawings, FIG. 47 shows the case where on a silicon substrate 11$k$, growth is started from the group VI atom. FIG. 48 shows the case where growth is started from the group I or group III atom. FIG. 47 and FIG. 48 show the case where an antiphase domain between a cation (positive ionic atom) of the group I or group III and an anion (negative ionic atom) of the group VI disappears. On the other hand, FIG. 49 shows the case where an antiphase domain between the group I atom and the group III atom disappears.

As shown in FIG. 47, FIG. 48, and FIG. 49, in the present embodiment, for example, an off substrate having a principal surface inclined at a predetermined inclination angle (off angle) $\theta_1$ in the <011> direction from the (100) plane is used as the silicon substrate 11$k$. That is, an off substrate which is off in the <011> direction from a {100} substrate is used as the silicon substrate 11$k$. For example, an off substrate with an inclination angle (off angle) $\theta_1$ of about 6° is used.

Cations (positive ionic atoms) of the group I or group III and anions (negative ionic atoms) of the group VI are regularly arranged on the silicon substrate 11$k$, which is an off substrate, so that the chalcopyrite photoelectric conversion film 13$k$ is formed.

In this case, cations and anions may grow in reverse phase locally, so that an antiphase domain, such as a region B (region partitioned by alternate long and short dashed lines), may occur.

However, as shown in FIG. 47, FIG. 48, and FIG. 49, crystal growth is effected on the principal surface of the off substrate and, therefore, the region B, in which the antiphase domain occurred, is closed taking a triangular shape.

Figure 50:
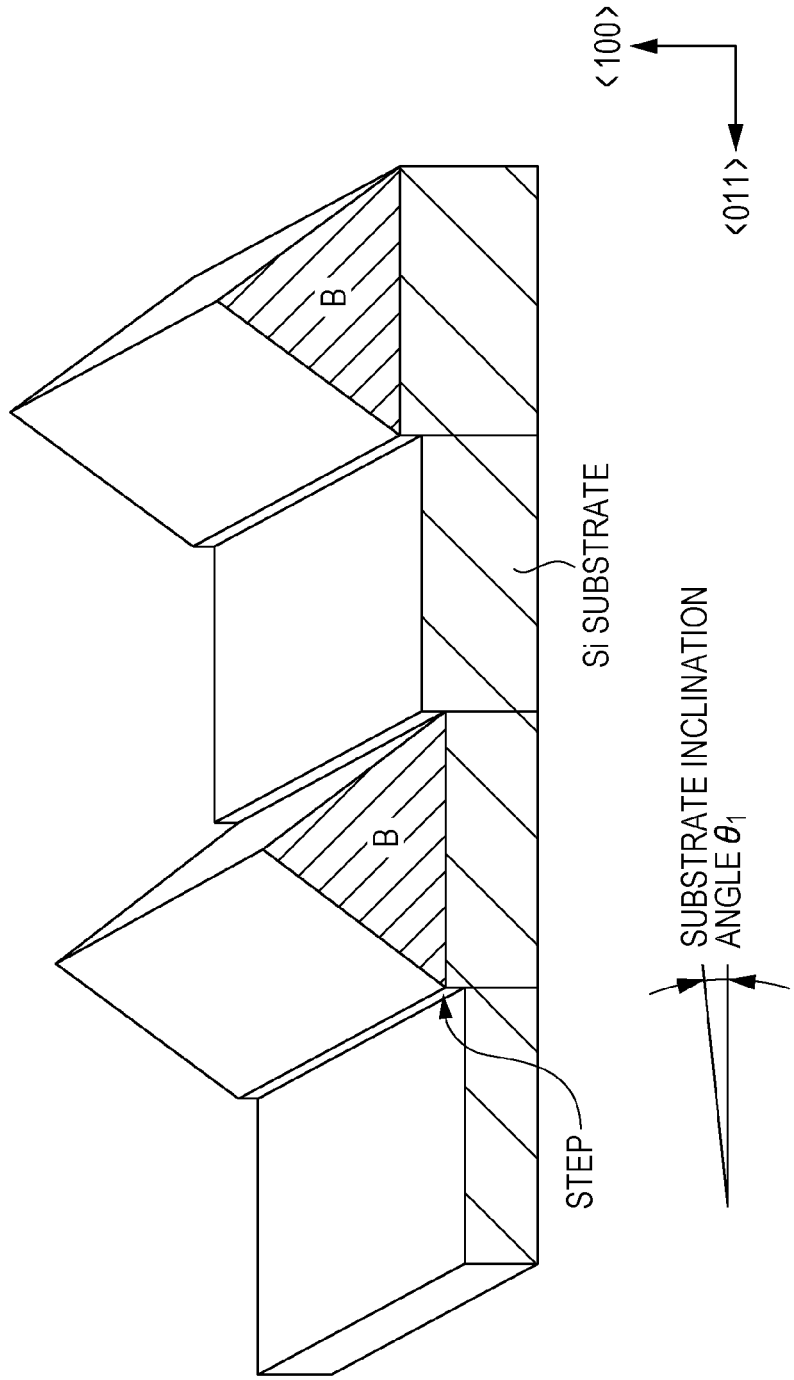
FIG. 50 is a magnified perspective view showing a region in which an antiphase domain occurred in the case where a chalcopyrite photoelectric conversion film is disposed on a silicon substrate according to the ninth embodiment of the present invention.

FIG. 50 is a magnified perspective view showing a region B in which an antiphase domain occurred in the case where the chalcopyrite photoelectric conversion film 13$k$ is disposed on the silicon substrate 11$k$ according to the ninth embodiment of the present invention.

As shown in FIG. 50, in the region B, the antiphase domain having a triangular cross-section is formed in such a way as to extend continuously in the depth direction (<0-11>direction). That is, the antiphase domain is formed in such a way as to take on a shape of a triangular column fallen on its side.

Then, as shown in FIG. 47, FIG. 48, and FIG. 49, epitaxial growth proceeds in such a way that only a region A, in which no antiphase domain occurs, is present above the region B.

Consequently, in the present embodiment, an occurrence of an antiphase domain can be suppressed.

In FIG. 47, FIG. 48, and FIG. 49, the case where the inclination angle $\theta_1$ is about 6° is shown, although not limited to this. If there is any inclination, an operation effect due to the above-described closure into a triangular shape occurs. As the inclination angle $\theta_1$ increases, the region B becomes small, and it is favorable that the inclination angle $\theta_1$ is 2° or more. Consequently, in FIG. 47 and FIG. 48, the size of the region B becomes about three times and, therefore, a sufficient effect is obtained.

For example, in FIG. 47 and FIG. 48, the height of the triangle of the region B is about 5 nm. In the present, the thickness necessary for the photoelectric conversion film is about 120 nm or more on the basis of the absorption coefficient of about $10^5$ cm$^{-1}$ (at this time, 700 or more of light is absorbed). In the case where the inclination angle $\theta_1$ is 2°, the height of the triangle of this region B results in about 15 nm. In this case, at least 100 nm of region including no defect of antiphase domain is present from the surface. Therefore, an effect of reducing a dark current is exerted sufficiently.

Furthermore, the upper limit value is an angle to which a stepwise substrate structure can be maintained. Specifically, the upper limit of $\theta_1$ is 90°.

(B) Overview

As described above, in the present embodiment, chalcopyrite photoelectric conversion film 13k is formed by epitaxially growing the above-described compound semiconductor on the silicon substrate 11k, which is an off substrate, in contrast to the other embodiments. Consequently, an occurrence of an antiphase domain can be suppressed, as described above.

(C) Modified Example

In the above description, the case where the off substrate having a principal surface which is off in the <011> direction from the (100) plane at a predetermined inclination angle (off angle) $\theta_1$ is used as the silicon substrate 11k is shown, although not limited to this.

Figure 51:
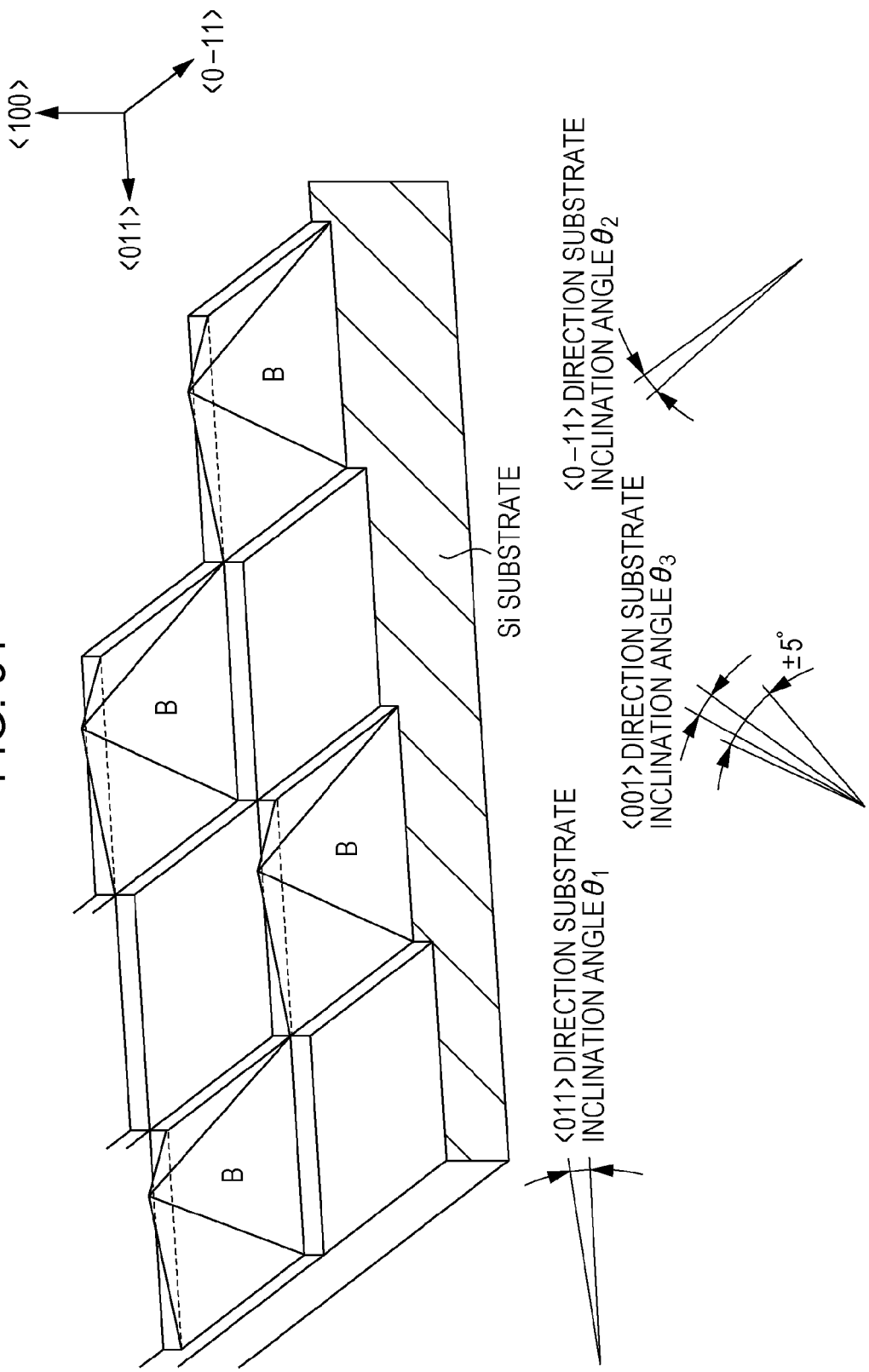
FIG. 51 is a perspective view showing a region in which an antiphase domain occurred in the case where a chalcopyrite photoelectric conversion film is disposed on a silicon substrate according to a modified example of the ninth embodiment of the present invention.

FIG. 51 is a perspective view showing a region B in which an antiphase domain occurred in the case where the chalcopyrite photoelectric conversion film 13k is disposed on the silicon substrate 11k according to a modified example of the ninth embodiment of the present invention.

As shown in FIG. 51, it is favorable to use an off substrate which is inclined in the <011> direction at a predetermined inclination angle (off angle) $\theta_1$ and, in addition, which is inclined in the <0-11> direction at a predetermined inclination angle (off angle) $\theta_2$. That is, it is favorable that an off substrate, which is further off in the <0-11> direction from the {100} substrate, is used as the silicon substrate 11k.

In this case, as shown in FIG. 51, the volume of antiphase domain of the region B can be reduced.

Specifically, as shown in FIG. 51, in the case where inclination occurs in two directions of the <011> direction and the <0-11> direction, the functions of closing into a triangular shape occur from the two directions perpendicular to each other at the same time. Consequently, the shape of the region B becomes a four-sided pyramid, so that the volume decreases.

At this time, in the case where the two inclination angles $\theta_1$ and $\theta_2$ are 2° or more and are the same angle, the azimuth is synthesized so as to be inclined in the <001> direction, and the resulting inclination angle $\theta_3$ becomes 3° or more. Consequently, the case of inclination in two directions, as described above, is most favorable because the volume of the antiphase domain in the region B becomes one-third of the volume in the case of an inclination in only one direction.

However, it is not necessary that the inclination is in the <001> direction accurately. In consideration of the production of an inclined Si substrate and variations in inclination direction, it is favorable that the (100) face is inclined in the <011>±5° direction in such a way that the off angle becomes 3° or more.

That is, it is favorable that an off substrate, which is off in the <001>±5° direction at an off angle of 3° or more from the {100} substrate, is used as the silicon substrate.

Besides the case where the inclination angles $\theta_1$ and $\theta_2$ are the same, the same operation effect as that described above can also be exerted in the case where the two inclination angles $\theta_1$ and $\theta_2$ are different. In the case where the inclination angles $\theta_1$ and $\theta_2$ are different, the principal surface of the off substrate is inclined in the <0((1-k)/2) 1> direction which is specified on the basis of the ratio k of the inclination angle $\theta_2$ in the <0-11> direction to the inclination angle $\theta_1$ in the <011> direction (refer to the following formula). Consequently, it is favorable that this inclination angles are 2° or more, as in the above description.

$$k=\text{Tan}(\theta_2)/\text{Tan}(\theta_1)$$

10. Others

Execution of the present invention is not limited to the above-described embodiments, but various modified examples can be adopted.

In the above-described embodiment, the case where the present invention is applied to the camera is explained, although not limited to this. The present invention may be applied to other electronic apparatuses, e.g., scanners and copiers, provided with solid-state imaging devices.

In the above-described embodiments, the case where the solid-state imaging device is the CMOS image sensor is explained, although not limited to this. If necessary, the present invention may be applied to CCD image sensors besides the CMOS image sensors.

In the above-described embodiments, the case where one reading circuit is disposed on a photoelectric conversion portion basis is explained, although not limited to this. For example, the present invention may be applied to the case where one reading circuit is disposed with respect to a plurality of photoelectric conversion portions.

In the above-described embodiments, the case where the second conduction type (for example, n-type) impurity region is formed in the first conduction type (for example, p-type) silicon substrate is shown as an example (refer to FIG. 3 and the like), although not limited to this. A first conduction type (for example, p-type) well may be formed in a second conduction type (for example, n-type) silicon substrate, and a second conduction type (for example, n-type) impurity region 12 may be formed in the resulting well.

In addition, the above-described embodiments may be combined appropriately.

In the above-described embodiments, the solid-state imaging device 1 corresponds to the solid-state imaging devices according to the embodiments of the present invention. In the above-described embodiments, the silicon substrates 11, 11h, and 11k correspond to the silicon substrates according to the embodiments of the present invention. In the above-described embodiments, the chalcopyrite photoelectric conversion films 13, 13d, 13e, 13f, 13g, 13gb, and 13k correspond to the photoelectric conversion films according to the embodiments of the present invention. In the above-described embodiments, the n-layer 13en corresponds to the n-type impurity regions according to the embodiments of the present invention. In the above-described embodiments, the p-layer 13ep corresponds to the p-type impurity regions according to the embodiments of the present invention. In the above-described embodiments, the p+-layer 14p corresponds to the high-concentration impurity diffusion layers according to the embodiments of the present invention. In the above-described embodiments, the first photoelectric conversion films 21R and 21Re correspond to the first photoelectric conversion films according to the embodiments of the present invention. In the above-described embodiments, the second photoelectric conversion films 22G and 22Ge correspond to the second photoelectric conversion films according to the embodiments of the present invention. In the above-described embodiments, the third photoelectric conversion films 23B and 23Be correspond to the third photoelectric conversion films according to the embodiments of the present invention. In the above-described embodiments, the camera 40 corresponds to the electronic apparatuses according to the embodiments of the present invention. In the above-described embodiments, the pixel P corresponds to the pixels according to the embodiments of the present invention. In the above-described embodiments, the pixel region PA corresponds to the pixel regions according to the embodiments of the present invention. In the above-described embodiments, the pixel isolation portions PB, PBc, PBd, PBf, and PBh correspond to the pixel isolation portions according to the embodiments of the present invention.

The present application contains subject matter related to that disclosed in Japanese Priority Patent Application JP 2010-064975 filed in the Japan Patent Office on Mar. 19, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
a plurality of pixels including photoelectric conversion films and that are arranged in an array, and
a plurality of pixel isolation portions interposed between the plurality of pixels,
wherein,
each photoelectric conversion film is a chalcopyrite-structure compound semiconductor composed of a copper-aluminum-gallium-indium-sulfur-selenium based mixed crystal or a copper-aluminum-gallium-indium-zinc-sulfur-selenium based mixed crystal and is disposed on a silicon substrate in such a way as to lattice-match the silicon substrate, and
each pixel isolation portion is formed from a compound semiconductor subjected to doping concentration control or composition control in such a way as to become a potential barrier between the photoelectric conversion films disposed in accordance with the plurality of pixels.

2. The solid-state imaging device according to claim 1, further comprising high-concentration impurity diffusion layers disposed on surfaces of the photoelectric conversion films in the incident side of the incident light.

3. The solid-state imaging device according to claim 2, wherein the high-concentration impurity diffusion layers are disposed in such a way as to be mutually joined between the plurality of pixels.

4. The solid-state imaging device according to claim 1, wherein the silicon substrate is an off substrate.

5. The solid-state imaging device according to claim 4, wherein the silicon substrate is an off substrate which is off in the <011> direction from a {100} substrate.

6. The solid-state imaging device according to claim 5, wherein the silicon substrate is an off substrate which is further off in the <0-11> direction from the {100} substrate.

7. The solid-state imaging device according to claim 6, wherein the silicon substrate is an off substrate which is off in the <0 (1−k)/2 1> direction in such a way that a synthesized inclination angle is 2° or more, where k is specified by the following formula (I) through the use of an inclination angle $\theta_1$ in the <011> direction and an inclination angle $\theta_2$ in the <0-11> direction:

$$k = \operatorname{Tan}(\theta_2)/\operatorname{Tan}(\theta_1) \qquad (1).$$

8. The solid-state imaging device according to claim 4, wherein the silicon substrate is an off substrate which is off in the <011> direction from a {100} substrate in such a way that an inclination angle is 2° or more.

9. The solid-state imaging device according to claim 8, wherein the silicon substrate is an off substrate which is further off in the <0-11> direction from the {100} substrate in such a way that an inclination angle is 2° or more.

10. The solid-state imaging device according to claim 4, wherein the silicon substrate is an off substrate which is off in the [001]±5° direction at an off angle of 3° or more from the {100} substrate.

11. An electronic apparatus comprising:
a plurality of pixels including photoelectric conversion films and that are arranged in an array; and
a plurality of pixel isolation portions interposed between the plurality of pixels,
wherein,
each photoelectric conversion film is a chalcopyrite-structure compound semiconductor composed of a copper-aluminum-gallium-indium-sulfur-selenium based mixed crystal or a copper-aluminum-gallium-indium-zinc-sulfur-selenium based mixed crystal and is disposed on a silicon substrate in such a way as to lattice-match the silicon substrate, and
each pixel isolation portion is formed from a compound semiconductor subjected to doping concentration control or composition control in such a way as to become a potential barrier between the photoelectric conversion films disposed in accordance with the plurality of pixels.

* * * * *